United States Patent
Kudo et al.

(10) Patent No.: US 10,202,041 B2
(45) Date of Patent: *Feb. 12, 2019

(54) BATTERY MONITORING SYSTEM

(71) Applicants: Hitachi, Ltd., Chiyoda-ku, Tokyo (JP); Hitachi Automotive Systems, Ltd., Hitachinaka-shi, Ibaraki (JP)

(72) Inventors: Akihiko Kudo, Hitachinaka (JP); Mutsumi Kikuchi, Mito (JP); Gosuke Shibahara, Vancouver (CA); Akihiko Emori, Hitachi (JP); Yasuo Uemura, Naka (JP); Tatsumi Yamauchi, Hitachiota (JP); Kenji Kubo, Hitachi (JP); Masahito Sonehara, Fuchu (JP); Masahiko Amano, Hitachiota (JP); Yoshinori Aoshima, Hitachinaka (JP)

(73) Assignees: Hitachi, Ltd., Tokyo (JP); Hitachi Automotive Systems, Ltd., Hitachinaka-shi (JP)

( * ) Notice: Subject to any disclaimer, the term of this patent is extended or adjusted under 35 U.S.C. 154(b) by 60 days.

This patent is subject to a terminal disclaimer.

(21) Appl. No.: 15/195,541

(22) Filed: Jun. 28, 2016

(65) Prior Publication Data

US 2016/0303977 A1    Oct. 20, 2016

Related U.S. Application Data

(63) Continuation of application No. 14/178,880, filed on Feb. 12, 2014, now Pat. No. 9,404,975, which is a
(Continued)

(30) Foreign Application Priority Data

Feb. 27, 2009  (JP) ................................. 2009-046082
Mar. 27, 2009  (JP) ................................. 2009-079863
(Continued)

(51) Int. Cl.
    *B60L 3/00*       (2006.01)
    *B60L 7/14*       (2006.01)
    (Continued)

(52) U.S. Cl.
    CPC ........... *B60L 3/0046* (2013.01); *B60L 3/0069* (2013.01); *B60L 3/0084* (2013.01); *B60L 7/14* (2013.01);
    (Continued)

(58) Field of Classification Search
    USPC ........................................................ 324/434
    See application file for complete search history.

(56) References Cited

U.S. PATENT DOCUMENTS 5,541,496 A * 7/1996 Simmonds ............ H02J 7/0091
                                                      320/151
6,189,923 B1  2/2001 Tsubone
(Continued)

FOREIGN PATENT DOCUMENTS

JP    11-227555 A    8/1999
JP    2001-86656 A   3/2001
(Continued)

OTHER PUBLICATIONS

Extended European Search Report issued in counterpart European Application No. 10154837.8 dated May 26, 2017 (7 pages).
(Continued)

*Primary Examiner* — Samuel Berhanu
(74) *Attorney, Agent, or Firm* — Crowell & Moring LLP

(57) ABSTRACT

A battery monitoring system, comprises a battery state detection circuit that detects battery states of a plurality of battery cells that are connected in series, based on respective cell voltages of the plurality of battery cells, and a control circuit that monitors state of a battery cell, based on each cell voltage of the plurality of battery cells. The control circuit
(Continued)

inputs pseudo voltage information to the battery state detection circuit, and thereby diagnoses whether or not the battery state detection circuit is operating normally.

8 Claims, 35 Drawing Sheets

Related U.S. Application Data continuation of application No. 12/712,849, filed on Feb. 25, 2010, now Pat. No. 8,723,527.

(30) Foreign Application Priority Data

Mar. 27, 2009 (JP) ................. 2009-079864
Jul. 31, 2009 (JP) ................. 2009-179741

(51) Int. Cl.
| | | |
|---|---|---|
| B60L 11/18 | (2006.01) | |
| G01R 31/36 | (2006.01) | |
| H02J 7/00 | (2006.01) | |
| G01R 35/00 | (2006.01) | |
| G01R 31/02 | (2006.01) | |

(52) U.S. Cl.
CPC ....... *B60L 11/1803* (2013.01); *B60L 11/1851* (2013.01); *B60L 11/1861* (2013.01); *B60L 11/1866* (2013.01); *G01R 31/3624* (2013.01); *G01R 31/3648* (2013.01); *G01R 31/3658* (2013.01); *H02J 7/0021* (2013.01); *B60L 2240/545* (2013.01); *B60L 2240/547* (2013.01); *B60L 2240/549* (2013.01); *G01R 31/026* (2013.01); *G01R 31/362* (2013.01); *G01R 35/00* (2013.01); *Y02T 10/7005* (2013.01); *Y02T 10/7044* (2013.01); *Y02T 10/7055* (2013.01); *Y02T 10/7061* (2013.01)

(56) References Cited

U.S. PATENT DOCUMENTS

| | | | |
|---|---|---|---|
| 6,268,710 | B1 | 7/2001 | Koga |
| 7,321,219 | B2 | 1/2008 | Meyer et al. |
| 7,511,457 | B2 | 3/2009 | Emori et al. |
| 2001/0048307 | A1 | 12/2001 | Maki et al. |
| 2004/0164744 | A1 | 8/2004 | Koga et al. |
| 2005/0242667 | A1 | 11/2005 | Emori et al. |
| 2006/0012337 | A1 | 1/2006 | Hidaka et al. |
| 2007/0145951 | A1 | 6/2007 | Hidaka et al. |
| 2008/0111556 | A1* | 5/2008 | Yano ................ H02J 7/0029 324/433 |
| 2009/0009178 | A1 | 1/2009 | Okamoto et al. |
| 2009/0128158 | A1* | 5/2009 | Kawai ................ B60L 3/0046 324/433 |
| 2009/0179650 | A1* | 7/2009 | Omagari ............ G01R 31/3624 324/433 |
| 2010/0001737 | A1 | 1/2010 | Kubo et al. |
| 2010/0134068 | A1* | 6/2010 | Lim .................... H02J 7/0016 320/116 |

FOREIGN PATENT DOCUMENTS

| | | |
|---|---|---|
| JP | 2001-289888 A | 10/2001 |
| JP | 2002-199510 A | 7/2002 |
| JP | 2003-84015 A | 3/2003 |
| JP | 2003-248022 A | 9/2003 |
| JP | 2003-304646 A | 10/2003 |
| JP | 2003-346916 A | 12/2003 |
| JP | 2005-318750 A | 11/2005 |
| JP | 2006-29895 A | 2/2006 |
| JP | 2006-156178 A | 6/2006 |
| JP | 2006-234400 A | 9/2006 |
| JP | 2007-285969 A | 11/2007 |
| JP | 2008-64520 A | 3/2008 |
| JP | 4092580 B2 | 3/2008 |
| JP | 2008-92656 A | 4/2008 |
| JP | 2008-118855 A | 5/2008 |
| JP | 2008-141953 A | 6/2008 |
| JP | 2008-141954 A | 6/2008 |
| JP | 2008-295299 A | 12/2008 |
| JP | 2009-27839 A | 2/2009 |
| JP | 2009-27915 A | 2/2009 |
| JP | 2009-27916 A | 2/2009 |
| JP | 2009-89487 A | 4/2009 |
| JP | 2009-89488 A | 4/2009 |
| JP | 2009-183025 A | 8/2009 |

OTHER PUBLICATIONS

U.S. Appl. No. 12/705,305, filed Feb. 12, 2010.
Japanese Office Action dated Oct. 23, 2012 including English-language translation (Thirteen (13) pages).
Japanese Office Action dated Jul. 2, 2013 including English-language translation (Eleven (11) pages).
Japanese Office Action dated Mar. 4, 2014 with English translation (ten (10) pages).
U.S. Appl. No. 12/705,305, filed Feb. 12, 2014.

\* cited by examiner

| MODE | CELL VOLTAGE MEASUREMENT | | | | MUX DIAGNOSIS | | | |
|---|---|---|---|---|---|---|---|---|
| SUBJECT CELL | C1 | C2 | C3 | C4 | C1 | C2 | C3 | C4 |
| Diag | 0 | | | | 1 | | | |
| SW | OFF | | | | ON | | | |
| HVMUX1 | 00 | 01 | 02 | 03 | 00 | 01 | 02 | 03 |
| HVMUX2 | 00 | 01 | 02 | 03 | 00 | 01 | 02 | 03 |
| MUX1 | 0 | | | | 1 | | | |
| MUX2 | 0 | | | | 1 | | | |
| MUX3 | 0 | | | | 1 | | | |
| MUX4 | 0 | | | | 1 | | | |
| MUX5 | 0 | | | | 1 | | | |

FIG.15A

| MODE | CELL VOLTAGE MEASUREMENT | | | | MUX DIAGNOSIS | | | |
|---|---|---|---|---|---|---|---|---|
| SUBJECT CELL | C1 | C2 | C3 | C4 | C1 | C2 | C3 | C4 |
| Diag | 0 | | | | 1 | | | |
| SW | OFF | | | | ON | | | |
| HVMUX1 | 00 | 01 | 02 | 03 | 00 | 01 | 02 | 03 |
| HVMUX2 | 00 | 01 | 02 | 03 | 00 | 01 | 02 | 03 |
| MUX1 | 0 | | | | 1 | – | – | – |
| MUX2 | 0 | | | | 1 | 1 | – | – |
| MUX3 | 0 | | | | – | 1 | 1 | – |
| MUX4 | 0 | | | | – | – | 1 | 1 |
| MUX5 | 0 | | | | – | – | – | 1 |

"–" MEANS "DON'T CARE"

| ADC OUTPUT VOLTAGE | | HVMUX2 | | | |
|---|---|---|---|---|---|
| | | 00 | 01 | 10 | 11 |
| HVMUX1 | 00 | RI | 3RI | 7RI | 15RI |
| | 01 | 0 | 2RI | 6RI | 14RI |
| | 10 | −2RI | 0 | 4RI | 12RI |
| | 11 | −6RI | −4RI | 0 | 8RI |

VALUE OF ORDER IS SUCH THAT THE COMPARATOR
ERROR CAN BE IGNORED

FIG.24

|  | (HVMAX1, HVMUX2, 129A, 129B) | | | |
|---|---|---|---|---|
|  | N1, N1, x, x | N1, N2, ON, x | N1, N3, x, x | N2, N3, x, ON |
| DURING NORMAL CONDITIONS | 0 | VOLTAGE OF ONE CELL (Vc1) | VOLTAGE OF TWO CELLS (Vc1+Vc2) | VOLTAGE OF ONE CELL (Vc2) |
| WHEN LINE L2 IS BROKEN | 0 | 0 | VOLTAGE OF TWO CELLS (Vc1+Vc2) | 0 |
| Vc2=0 | 0 | VOLTAGE OF ONE CELL (Vc1) | VOLTAGE OF ONE CELL (Vc1) | 0 |

BATTERY MONITORING SYSTEM

CROSS-REFERENCE TO RELATED APPLICATION

This application is a continuation of U.S. application Ser. No. 14/178,880, filed Feb. 12, 2014, which is a continuation of U.S. application Ser. No. 12/712,849, filed Feb. 25, 2010, now U.S. Pat. No. 8,723,527, issued May 13, 2014, which claims priority from the following priority applications:

Japanese Patent Application No. 2009-046082 filed Feb. 27, 2009;

Japanese Patent Application No. 2009-079864 filed Mar. 27, 2009;

Japanese Patent Application No. 2009-079863 filed Mar. 27, 2009; and

Japanese Patent Application No. 2009-179741 filed Jul. 31, 2009. The disclosures of each of the above-identified applications are expressly incorporated by reference herein.

BACKGROUND OF THE INVENTION

1. Field of the Invention

The present invention relates to a battery monitoring system, and to a method of diagnosis for a battery monitoring system.

2. Description of Related Art

With a hybrid automobile or an electric automobile or the like, in order to ensure the desired high voltage, a group battery structure is employed that includes a large number of battery cells that serve as secondary batteries, connected in series. With this type of group battery, in order to provide capacity calculation and protection management for each of the battery cells, management of the battery cells is performed using monitor ICs that monitor the states of the battery cells and control ICs that control their charge/discharge states. In particular, since there is a danger of an excessive charge state occurring with a system that employs a lithium ion battery due to the high energy density of such a lithium ion battery, accordingly, as disclosed in Japanese Patent No. 4,092,580, the reliability and the security are enhanced by the voltage of each of the cells being measured by the control ICs and the monitor ICs so that any excessive charge state is detected, and by it being arranged to stop the charge or discharge of the battery if such an excessive charge state is detected by any of the ICs.

The monitor ICs detect the voltages of each of the battery cells individually; for example, if there is some battery cell that is in an excessive charge state, then excessive charge information is transmitted by communication with its corresponding control IC. And, in order to ensure that such excessive charge information will be reliably transmitted to the control ICs, by transmitting test signals from the control ICs, diagnosis is performed for determining whether or not there is any anomaly such as breakage of a communication line or the like.

Furthermore, when detecting the voltages of a battery cell, a predetermined battery cell is selected by a multiplexer, and its voltage is detected by a voltage detection unit. Thus, it is possible to detect the voltages of all of the battery cells by changing over the connections of the multiplexer. In order to acquire the correct cell voltages, it is necessary for a cell voltage measurement circuit including the multiplexer to operate correctly. Due to this, in Japanese Laid-Open Patent Publication 2008-92656, it has been proposed to compare together the sum of all of the individually measured values for the voltages of all of the cells, and the measured value for the total battery voltage as measured by a total voltage measurement circuit, and to decide that there is some fault with the cell voltage measurement circuit including the multiplexer, if there is a significant difference between these two.

However, in the above described excessive charge diagnosis process, it is not possible to proceed as far as diagnosing whether or not the excessive charge detection circuitry internal to the monitor ICs is functioning normally, and this is a deficiency from the point of view of enhancing the reliability. Furthermore, in the case of a system that decides upon whether or not there is a fault with the cell voltage measurement circuit by comparing together the sum of the individual voltages of all of the cells and the total voltage of them all together, if for example an anomalous condition occurs in which the multiplexer selects one cell only, but the states of charge of all of the cells are uniform, then there is almost no difference between the sum of the individual cell voltages and the total voltage, so that there is a fear that an erroneous diagnosis of normal operation will be reached. Moreover, if a sudden voltage fluctuation occurs simultaneously with the measurement of the voltage of one cell that is being selected by the multiplexer, then it may happen that this causes a difference between the sum of all of the individual cell voltages and the voltage of them all together, so that there is a risk of an erroneous decision even though the multiplexer is actually operating correctly. Accordingly, in order reliably to detect excess charging, as described above, it has been necessary to enhance the reliability of the monitor ICs and the control ICs separately.

SUMMARY OF THE INVENTION

An object of the present invention is to provide a battery monitoring system, and a method of diagnosis for it, that can diagnose whether or not the battery state detection circuitry is operating normally, so that the reliability of the battery monitoring system as a whole is enhanced.

In order to achieve the above mentioned object, the present invention, a battery monitoring system, comprises a battery state detection circuit that detects battery states of a plurality of battery cells that are connected in series, based on respective cell voltages of the plurality of battery cells, and a control circuit that monitors state of a battery cell, based on each cell voltage of the plurality of battery cells. And, the control circuit inputs pseudo voltage information to the battery state detection circuit, and thereby diagnoses whether or not the battery state detection circuit is operating normally.

One diagnosis method of the present invention is a diagnosis method for a battery monitoring system that comprises an excessive charge detection circuit that detects excessive charge of a battery cell by comparing each cell voltage of a plurality of battery cells that are connected in series with an excessive charge threshold value, and outputs detection information, wherein a voltage that corresponds to excessive charge is inputted to the excessive charge detection circuit instead of the measured cell voltage, and whether or not the excessive charge detection circuit is operating normally is diagnosed based on presence or absence of an output of the detection information.

Another diagnosis method of the present invention is a diagnosis method for a battery monitoring system that selects one of a plurality of voltages inputted from a plurality of battery cells that are connected in series with a selection circuit, measures this selected voltage with a voltage measurement circuit, and monitors state of the battery cell based on the measured voltage, wherein a plurality of mutually different voltages are generated, a mutually different voltage is selected by the selection circuit instead of a voltage of the battery cell, and state of selection of the selection circuit is diagnosed based on voltage values measured by the voltage measurement circuit.

BRIEF DESCRIPTION OF THE DRAWINGS

FIG. 15A is a figure showing states of multiplexers MUX1 through MUX5 and HVMUX1 and HVMUX2 and so on during cell voltage measurement and during diagnosis, and particularly shows a case in which changeover between the multiplexers HVMUX1 and HVMUX2 is performed by signals STG1 and STG2;

FIG. 15B is a further figure showing states of the multiplexers MUX1 through MUX5 and HVMUX1 and HVMUX2 and so on during cell voltage measurement and during diagnosis, and particularly shows a case in which changeover between the multiplexers HVMUX1 and HVMUX2 is performed by command from a microcomputer 30;

FIG. 17 is a figure showing a relationship between combinations of input terminals of the multiplexers HVMUX1 and HVMUX2, and voltage values that are measured;

FIG. 24 is a figure showing a relationship between selection states of multiplexers HVMUX1 and HVMUX2 and ON/OFF states of balancing switches 129A and 129B, and voltage values that are measured;

DESCRIPTION OF THE PREFERRED EMBODIMENTS

Figure 1:
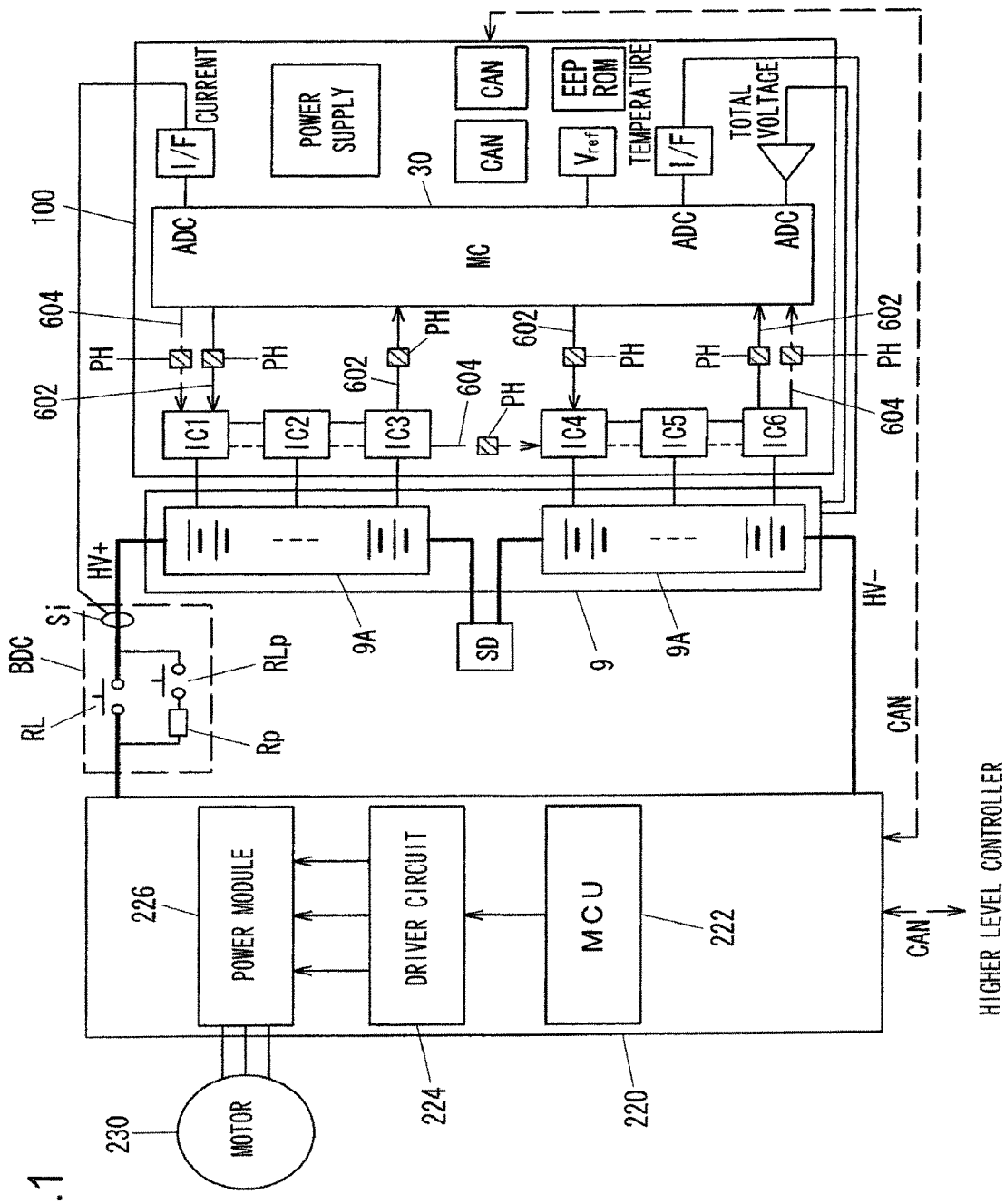
FIG. 1 is a block diagram showing a drive system for a rotating electrical machine of a vehicle.

In the following, embodiments of the present invention will be described with reference to the figures. First, structural elements that are common to all of these embodiments will be explained. FIG. 1 is a block diagram showing a drive system for a rotating electrical machine for a vehicle. This drive system shown in FIG. 1 includes a battery module 9, a battery monitoring system 100 that monitors the battery module 9, an inverter device 220 that converts DC electrical power from the battery module 9 into three phase AC electrical power, and a motor 230 that drives the vehicle. The motor 230 is driven by the three phase AC power from the inverter device 220. The inverter device 220 and the battery monitoring device 100 are linked together by CAN communication, and the inverter device 220 functions as a higher level controller for the battery monitoring device 100. Furthermore, the inverter device 220 operates on the basis of command information from some yet higher level controller, not shown in the figures.

The inverter device 220 includes a power module 226, a MCU (Motor Control Unit) 222, and a driver circuit 224 for driving the power module 226. The power module 226 converts the DC power supplied from the battery module 9 into three phase AC power for driving the motor 230. It should be understood that a smoothing capacitor of high capacity from around 700 μF to around 2000 μF is provided between high voltage lines HV+ and HV− that are connected to the power module 226, although this smoothing capacitor is not shown in the figures. This smoothing capacitor operates to reduce voltage noise to which the integrated circuits included in the battery monitoring system 100 are subjected.

In the operation start state of the inverter device 220, the charge in the smoothing capacitor is approximately zero, and when a relay RL closes a large initial current flows into the smoothing capacitor. And there is a fear that the relay RL will suffer damage due to fusion because of this high current. In order to solve this problem, according to a command from a higher level controller, when starting to drive the motor 230, the MCU 222 changes a pre-charge relay RLP from its opened state to its closed state, thus charging up the smoothing capacitor, and only thereafter changes the relay RL from its opened state to its closed state, thus starting the supply of power from the battery module 9 to the inverter device 220. When charging up the smoothing capacitor, this charging is performed while limiting the maximum current with a resistor RP. By performing this type of operation, not only is it possible to protect the relay circuit, but also it is possible to reduce the maximum current that flows in the battery cells and the inverter device 220 to not more than a predetermined value, so that it is possible to maintain high security.

It should be understood that the inverter device 220 controls the phase of the AC power generated by the power module 226 with respect to the rotor of the motor 230, so that during vehicle braking the motor 230 can be operated as a generator. In other words, regenerative braking control is performed, and power that is generated by the operation of the motor as a generator is supplied on a regenerative basis to the battery module 9, so as to recharge that battery module 9. If the state of charge of the battery module 9 has dropped with respect to a reference state, then the inverter device 220 operates the motor 230 as a generator. The three phase AC power that is generated by the motor 230 is converted into DC power by the power module 226 and is then supplied to the battery module 9. As a result, the battery module 9 is charged up.

On the other hand when, according to a command from the higher level controller, the motor 230 is to be operated for power running, the MCU 222 controls the driver circuit 224 so as to control the switching operation of the power module 226 to generate a rotating magnetic field that leads with respect to the rotation of the rotor of the motor 230. In this case, the DC power from the battery module 9 is supplied to the power module 226. Furthermore, when the battery module 9 is to be charged up by regenerative braking control, the MCU 222 controls the driver circuit 224 so as to control the switching operation of the power module 226 to generate a rotating magnetic field that trails with respect to the rotation of the rotor of the motor 230. In this case, power from the motor 230 is supplied to the power module 226, and DC power from the power module 226 is supplied to the battery module 9. As a result, the motor 230 is operated as a generator.

The power module 226 of the inverter device 220 performs power conversion between DC power and AC power by performing switching operation to go continuous and go discontinuous at high speed. At this time, since high currents are interrupted at high speeds, large voltage fluctuations are generated due to the inductance of the DC circuitry. The high capacity smoothing capacitor described above is provided in order to suppress these voltage fluctuations.

The battery module 9 consists of two battery blocks 9A and 9B that are connected in series. Each of these battery blocks 9A and 9B includes 16 cells that are connected in series. The battery block 9A and the battery block 9B are connected in series via a service disconnector SD for maintenance and inspection in which a switch and a fuse are connected in series. The direct connection of the electric circuit is interrupted by opening this service disconnector, and no current flows, even if hypothetically it is supposed that a connection circuit becomes established between one point somewhere in the battery block 9A or 9B and the vehicle. It is possible to maintain high security with this type of structure. Moreover, even if during inspection an operator should touch both HV+ and HV− at the same time, it is ensured that his body will not be subjected to high voltage, so that safety is assured.

A battery disconnector unit BDU that includes the relay RL, the resistor RP, and the pre-charge relay RLP is provided in the high voltage line HV+, between the battery module 9 and the inverter device 220. The resistor RP and the pre-charge relay RLP are in a series circuit that is connected in parallel with the relay RL.

The battery monitoring system 100 principally performs measurement of the voltage of each cell, measurement of the total voltage, measurement of the current, measurement of the cell temperatures, adjustment of the capacities of the cells, and so on. For this, ICs (integrated circuits) IC1 through IC6 are provided as cell controllers. The 16 battery cells that are provided within each of the battery blocks 9A and 9B are divided into three cell groups, and one of these ICs is provided for each of these six cell groups.

The integrated circuits IC1 through IC6 are provided with a communication circuit 602 and a one-bit communication circuit 604. In the communication circuit 602 for transmitting cell voltage value readings and commands of various types, serial communication with a microcomputer 30 is performed by the daisy chain method via insulating elements (for example, photo-couplers) PH. And the one-bit communication circuit 604 transmits an anomaly signal when excessive charge of some cell has been detected. In the example shown in FIG. 1, the communication circuit 602 is divided into a higher level communication path to the integrated circuits IC1 through IC3 of the battery block 9A, and a lower level communication path to the integrated circuits IC4 through IC6 of the battery block 9B.

Each IC performs anomaly diagnosis, and, if it has itself determined that an anomaly is present, or if it has received an anomaly signal from another one of the ICs at its reception terminal FFI (described hereinafter; refer to FIG. 2), then it transmits an anomaly signal from its transmission terminal FFO (described hereinafter; refer to FIG. 2). On the other hand, if an anomaly signal that it previously was receiving at its reception terminal FFI ceases to be received, or if it has itself determined that an anomaly that it was detecting has ceased, then it stops transmitting this anomaly signal from its transmission terminal FFO. In this embodiment, this anomaly signal is a one-bit signal.

While the microcomputer 30 does not transmit any anomaly signal to the ICs, in order to check that the one-bit communication circuit 604 (that is the transmission path for the anomaly signals) is operating correctly, it can output a test signal, that is a pseudo-anomaly signal, to the one-bit communication circuit 604. Upon reception of this test signal, IC1 outputs an anomaly signal to the communication circuit 604, and this anomaly signal is received by IC2. And the anomaly signal is transmitted from IC2 to IC3, and then to IC4, IC5, and IC6 in order, and finally is returned from IC6 to the microcomputer 30. If the communication circuit 604 is operating normally, then the pseudo-anomaly signal that was transmitted from the microcomputer 30 is returned to the microcomputer 30 via the communication circuit 604. The microcomputer 30 can diagnose the communication circuit 604 by sending a pseudo-anomaly signal in this manner, so that the reliability of the system is enhanced.

A current sensor Si such as a Hall element or the like is installed in the battery disconnector unit BDU, and the output of this current sensor Si is inputted to the microcomputer 30. Signals related to the total voltage of the battery module 9 and to temperature are also inputted to the microcomputer 30, and are each measured by A/D converters that are included in the microcomputer 30. Temperature sensors are provided at a plurality of spots upon the battery blocks 9A and 9B.

Figure 2:
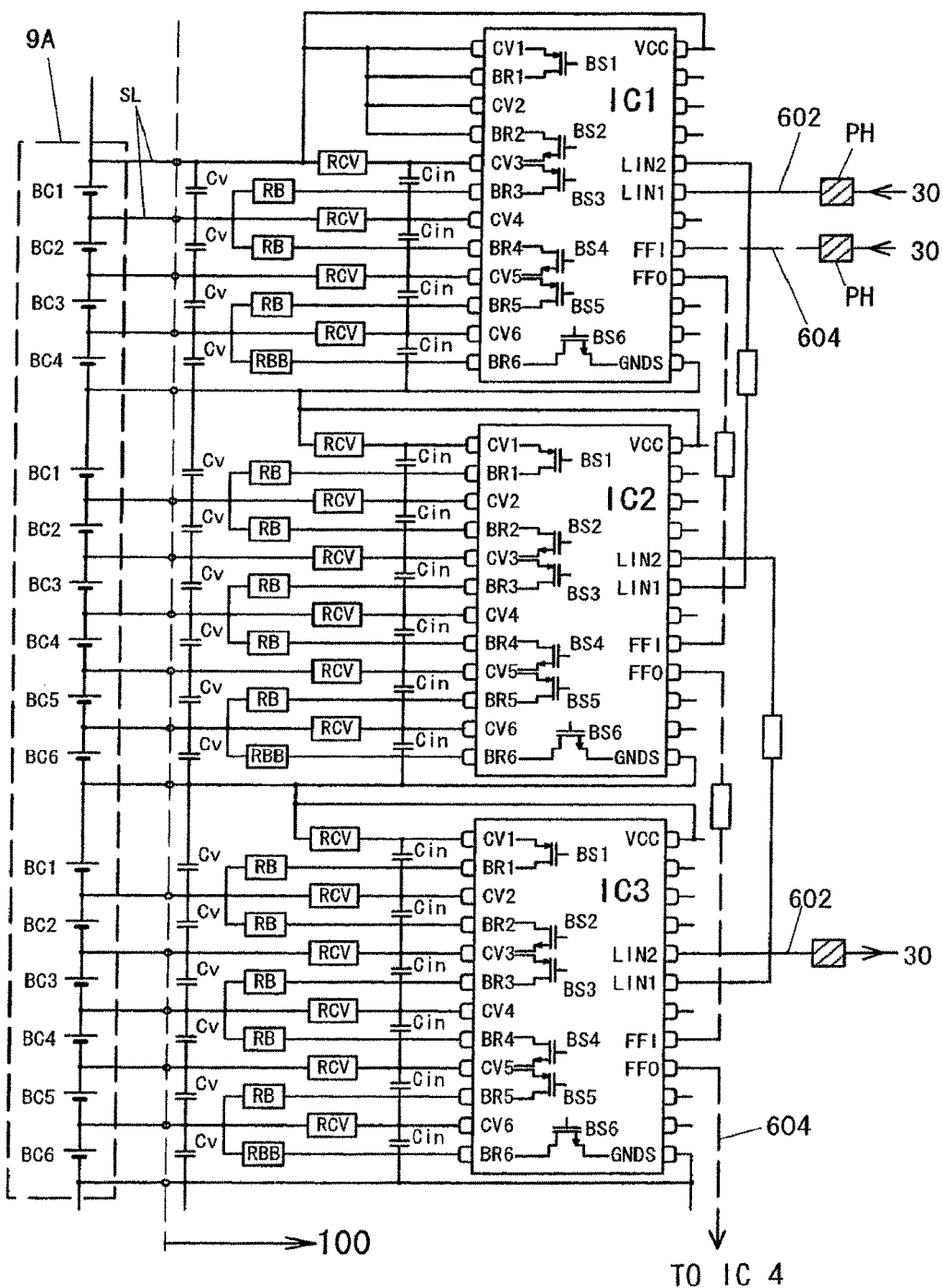
FIG. 2 is a figure showing a portion of FIG. 1 in more detail, including integrated circuits IC1 through IC3 that are related to a battery block 9A.

FIG. 2 is a figure showing a portion of FIG. 1 in more detail, including the integrated circuits IC1 through IC3 that are related to the battery block 9A of FIG. 1. It should be understood that a similar structure is also provided in relation to the battery block 9B, although explanation thereof is omitted. The 16 battery cells that are provided to the battery block 9A are divided into three cell groups that include 4 cells, 6 cells, and 6 cells, and IC1, IC2, and IC3 are provided so as to correspond to these cell groups respectively.

The terminals CV1 through CV6 of IC1 are terminals for measuring the cell voltages of the battery cells; each of the IC can measure the voltages of up to 6 cells. In the cases of IC2 and IC3 that monitor 6 cells each, a resistor RCV is provided to each of the voltage measurement lines of each of the 6 terminals CV1 through CV6 in order to protect the terminals and limit the discharge currents for capacity adjustment. On the other hand, in the cases of IC1 that monitors 4 cells, a resistor RCV is provided to each of the voltage measurement lines of each of the 4 terminals CV3 through CV6 in order to protect those terminals and limit the discharge currents for capacity adjustment. Each of these voltage measurement lines is connected via a sensing line LS to a positive electrode or to a negative electrode of one of the battery cells BC. It should be understood that the GND S terminals of IC2 and IC3 are connected to the negative electrode of the corresponding battery cell BC6. For example, when the cell voltage of the battery cell BC1 is to be measured, the voltage between the terminals CV1 and CV2 is measured. Furthermore, when the cell voltage of the battery cell BC6 is to be measured, the voltage between CV6 and the GND S terminal is measured. In the case of IC1, the cell voltages of its corresponding battery cells BC1 through BC4 are measured using the terminals CV3 through CV6 and the GND S terminal. Capacitors Cv and Cin for noise countermeasures are provided between the voltage measurement lines.

In order to utilize the performance of this battery module 9 to the maximum limit, it is necessary to equalize the cell voltages of the 32 cells. For example if the variation between the cell voltages is large, then during regenerative charging it is necessary to stop the regenerative charging operation at the time point that battery cell whose voltage is the highest reaches its upper limit voltage. In this case, the regenerative charging operation is stopped irrespective of whether or not the cell voltages of the other battery cells have reached their upper limits, and this wastes energy because the brakes then need to be operated. In order to prevent this type of occurrence, under command from the microcomputer 30, each of the ICs performs discharge for adjusting the capacity of its battery cells.

As shown in FIG. 2, to each of IC1 through IC3, balancing switches BS1 through BS6 for adjusting the cell capacities are provided between the terminals CV1 and BR1, BR2 and CV3, CV3 and BR3, BR4 and CV5, CV5 and BR5, and BR6 and GND S. For example, if discharge of the battery cell BC1 of IC1 is to be performed, then the balancing switch BS3 is turned ON. When this is done, a balancing current flows along the path from the positive electrode of the battery cell CV1→the resistor RCV→the terminal CV1→the balancing switch BS3→the terminal BR3→the resistor RB→to the negative electrode of the battery cell CV1. RB or RBB is a resistor for balancing.

The communication circuits 602 and 604 described above are provided between IC1 through IC3. Communication commands from the microcomputer 30 are inputted to the communication circuit 602 via a photo-coupler PH, and are received via the communication circuit 602 at a reception terminal LIN1 of IC1. And data and a command corresponding to this communication command are transmitted from a transmission terminal LIN2 of IC1. The communication command received at the reception terminal LIN1 of IC2 is transmitted from its transmission terminal LIN2. Reception and transmission are performed in order in this manner, and the transmitted signal is transmitted from the transmission terminal LIN2 of IC3 and is received via a photo-coupler PH at a reception terminal of the microcomputer 30. According to the communication commands that they have received, IC1 through IC3 perform transmission of measurement data such as cell voltages and so on to the microcomputer 30, and also perform balancing operation. Furthermore, each of IC1 through IC3 detects cell excessive charge on the basis of the cell voltages that are measured. The results of this detection (anomaly signals) are transmitted to the microcomputer 30 via the communication circuit 604.

Figure 3:
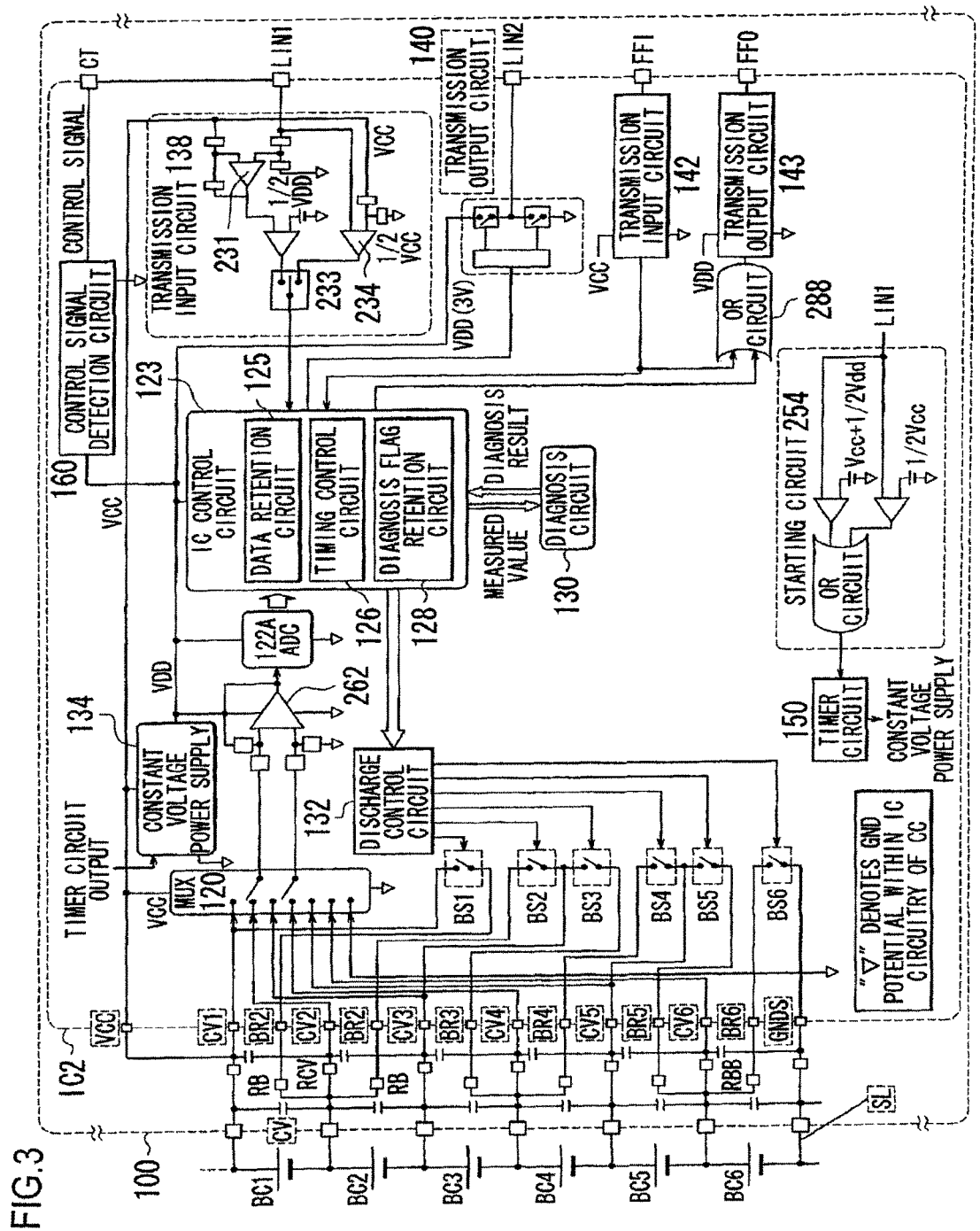
FIG. 3 is a figure schematically showing an internal block of one of the ICs.

FIG. 3 is a figure schematically showing an internal block of one of the ICs, and particularly shows the example of IC2 to which the 6 battery cells BC1 through BC6 are connected. It should be understood that the other ICs also have a similar structure, but the explanation is curtailed. In IC2 there are provided a multiplexer 120 that serves as a battery state detection circuit, an analog to digital converter 122A, an IC control circuit 123, a diagnosis circuit 130, transmission input circuits 138 and 142, transmission output circuits 140 and 143, a starting circuit 254, a timer circuit 150, a control signal detection circuit 160, a differential amplifier 262, and an OR circuit 288.

The terminal voltages of the battery cells BC1 through BC6 are inputted to the multiplexer 120 via the terminals CV1 through CV6 and GND S. The multiplexer 120 selects any of these terminals CV1 through CV6 and GND S, and inputs the voltage between the terminals to the differential amplifier 262. The output of this differential amplifier 262 is converted to a digital value by the analog to digital converter 122A. This voltage between terminals that has been converted to a digital value is sent to the IC control circuit 123, and is retained by an internal data retention circuit 125. The terminal voltages of the battery cells BC1 through BC6 that are inputted to the terminals CV1 through CV6 and GND S are biased with respect to the ground potential of IC2 by potentials based upon the terminal voltages of the battery cells that are connected in series. The influence of the bias potentials described above are eliminated by the above described differential amplifier 262, and analog values based upon the terminal voltages of each of the battery cells BC1 through BC6 are inputted to the analog to digital converter 122A.

Along with having a calculation function, the IC control circuit 123 includes the data retention circuit 125, a timing control circuit 126 that periodically performs voltage measurement and state diagnosis, and a diagnosis flag retention circuit 128 in which a diagnosis flag from the diagnosis circuit 130 is set. This IC control circuit 123 decodes the details of communication commands inputted from the transmission input circuit 138, and performs processing corresponding to these details. Such commands may include, for example, commands that request the measured values of voltages between terminals of battery cells, commands that request discharge operation for adjusting the states of charge of battery cells, commands to start the operation of these ICs ("Wake Up" commands), commands to stop operation ("Sleep" commands), commands that request address setting, and so on.

The diagnosis circuit 130 performs various types of diagnosis on the basis of the measured values from the IC control circuit 123, for example excessive charge diagnosis and excessive discharge diagnosis. And the data retention circuit 125 may, for example, include a register circuit: it stores the voltages of the battery cells BC1 through BC6 that are detected between the respective terminals, in correspondence with these various battery cells BC1 through BC6, and also holds other detected values so that they can be read out to addresses that are determined in advance.

At least two different power supply voltages VCC and VDD are used in the internal circuitry of this IC2. In the example shown in FIG. 3, the voltage VCC is the total voltage of the battery cell group consisting of the battery cells BC1 through BC6 that are connected in series, while the voltage VDD is generated by a constant voltage power supply 134. The multiplexer 120 and the transmission input circuits 138 and 142 for signal transmission operate with the high voltage VCC. Furthermore, the analog to digital converter 122A, the IC control circuit 123, the diagnosis circuit 130, and the transmission output circuits for signal transmission operate with the constant voltage VDD.

The signal received at the reception terminal LIN1 of IC2 is inputted to the transmission input circuit 138, and the signal received at its reception terminal FFI is inputted to the transmission input circuit 142. The transmission input circuit 142 has a similar circuit structure to that of the transmission input circuit 138. The transmission input circuit 138 includes a circuit 231 that receives signals from other neighboring ICs, and a circuit 234 that receives signals from the circuit 231 and the photo-coupler PH.

As shown in FIG. 2, in the case of IC1 that is the IC at the first stage, it is the signal from the photo-coupler PH that is inputted at its reception terminal LIN1, while in the cases of the other ICs IC2 and IC3, it is the signals from the adjacent ICs that are inputted at their reception terminals LIN1. Due to this, which of the circuits 231 and 234 is the one that is used is selected by the changeover unit 233 on the basis of the control signal supplied to the control terminal CT of FIG. 3. This control signal supplied to the control terminal CT is inputted to the control signal detection circuit 160, and the changeover unit 233 performs its changeover operation according to a command from the control signal detection circuit 160.

In other words, when the direction of transmission of the ICs is to the IC at the first stage, in other words when a signal from the higher level controller (i.e. the microcomputer 30) is inputted to the reception terminal LIN1 of that IC, then the changeover unit 233 closes its lower side contact point, so that the output signal of the circuit 234 is outputted from the transmission input circuit 138. On the other hand, when a signal from the adjacent IC is inputted to the reception terminal LIN1 of this IC, then the changeover unit 233 closes its upper side contact point, so that the output signal of the circuit 232 is outputted from the transmission input circuit 138. Since, in the case of IC2 as shown in FIG. 3, the signal from the adjacent IC1 is inputted to the transmission input circuit 138, accordingly the changeover unit 233 closes its upper side contact point. Since the peak value of the output waveform that is outputted from the higher level controller (i.e. the microcomputer 30) and the peak value of the output waveform that is outputted from the transmission terminal LIN2 of the adjacent IC are different, accordingly the threshold values for decision are different. Due to this, the changeover unit 233 of the circuit 138 comes to be changed over on the basis of the control signal at the control terminal TC. It should be understood that the communication circuit 604 also has a similar structure.

The communication command received at the reception terminal LIN1 is inputted to the IC control circuit 123 via the transmission input circuit 142. And the IC control circuit 123 outputs data and a command corresponding to this communication command that has been received to the transmission output circuit 140. This data and command are transmitted from the transmission terminal LIN2 via the transmission output circuit 140. It should be understood that the transmission output circuit 143 has a similar structure to that of the transmission output circuit 140.

The signal received from the terminal FFI is used for transmitting an anomalous condition (i.e. an excessive charge signal). When a signal that indicates an anomaly is received from the terminal FFI, this signal is inputted to the transmission output circuit 143 via the transmission input circuit 142 and the OR circuit 288, and is outputted from the transmission output circuit 143 via the terminal FFO. Furthermore, when an anomaly is detected by the diagnosis circuit 130, without any relationship with the contents received at the terminal FFI, a signal that indicates an anomaly is inputted to the transmission output circuit 143 from the diagnosis flag retention circuit 128 via the OR circuit 288, and is outputted from the transmission output circuit 143 via the terminal FFO.

When a signal that has been transmitted from the adjacent IC or from the photo-coupler PH is received by the starting circuit 254, the timer circuit 150 operates, and the voltage VCC is supplied to the constant voltage power supply 134. Due to this operation, the constant voltage power supply 134 goes into the operational state, and outputs the constant voltage VDD. When this constant voltage VDD from the constant voltage power supply 134 is outputted, the IC2 goes from the sleep state into the aroused operational state.

As previously described, the balancing switches BS1 through BS6 are provided within the IC2 for adjusting the charge amounts of the battery cells BC1 through BC6. In this embodiment, PMOS switches are used for the balancing switches BS1, BS3, and BS5, while NMOS switches are used for the balancing switches BS2, BS4, and BS6.

The opening and closing of these balancing switches BS1 through BS6 is controlled by the discharge control circuit 132. On the basis of a command from the microcomputer 30, a command signal for making continuous the balancing switch that corresponds to a battery cell that should be discharged is sent from the IC control circuit 123 to the discharge control circuit 132. And the IC control circuit 123 receives a command from the microcomputer 30 by communication that specifies a discharge time period corresponding to each of the battery cells BC1 through BC6, and executes the discharge operation described above.

Diagnosis and Measurement: Summary of the Operating Schedule

Figure 4:
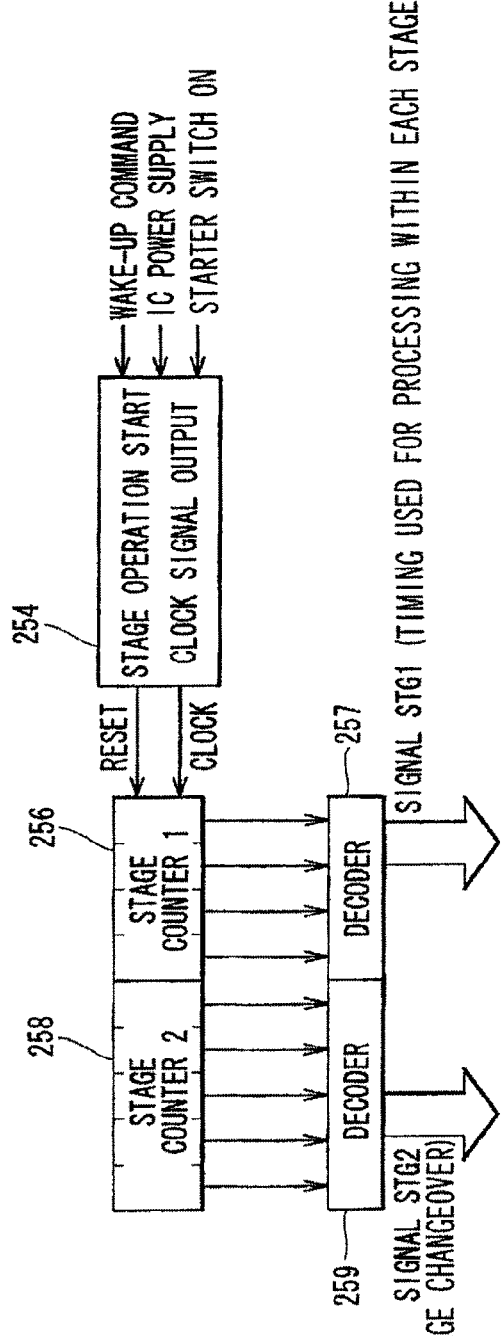
FIG. 4 is a figure for explanation of the timing of a measurement operation.

FIG. 4 is a figure for explanation of the timing of the measurement operation performed by the timing control circuit 126 shown in FIG. 3. Along with the operation of measurement, each of the ICs shown in FIG. 2 is also endowed with a function of performing diagnosis operation, and, while performing measurement repeatedly at a timing as described in FIG. 4, also executes diagnosis synchronized with this measurement. It should be understood that while, in FIG. 2 described above, the cell group for IC1 only includes four battery cells, the circuitry of each of IC1 through IC3 is capable of handling six battery cells. Accordingly, the number of battery cells that can be included in each of the cell groups can be increased up to a maximum of six. Due to this, in FIG. 4 that shows the operational timing, it will be supposed that the number of battery cells included in the cell group is six.

The number of battery cells making up each of the cell groups to which IC1 through IC3 are provided is set individually. By doing this, stage signals are generated corresponding to the number of battery cells of the cell groups that correspond to each of IC1 through IC3. By providing this type of structure, along with it becoming possible to change the number of battery cells making up each of the cell groups, so that the freedom of design is increased, also it becomes possible to perform processing at high speed.

As mentioned above, FIG. 4 is a figure for explanation of the timing of the diagnosis operation and the measurement operation. The timing of the above described measurement operation, and the measurement cycle and the diagnosis operation, are managed by the starting circuit 254 and by a stage counter that consists of a first stage counter 256 and a second stage counter 258. These stage counters 256 and 258 generate control signals (i.e. timing signals) that manage the overall operation of the integrated circuit. While the stage counters 256 and 258 are not actually separate, they will be described as separate here for the convenience of explanation. These stage counters could be conventional counters, or could be shift registers.

When the starting circuit 254 (1) receives at the reception terminal LIN1 a communication command sent from the transmission path that requests "Wake Up", or (2) the power supply voltage of the IC that is supplied reaches a predetermined voltage, or (3) receives a signal that indicates that the starter switch of the vehicle (i.e. its key switch) has been turned ON, then it outputs a reset signal to the first and second stage counters 256 and 258 so as to put both of these stage counters 256 and 258 into its initial state, and then outputs a clock signal of a predetermined frequency. In other words, IC1 executes its measurement and diagnosis operation upon any one of the above conditions (1) through (3). On the other hand, if a communication command has been received from the transmission path that requests "Sleep", or if it has not been possible to receive any such communication command for at least a predetermined time period, then the starting circuit 254 stops the output of the clock at the timing that it returns the stage counters 256 and 258 to their reset states, in other words to their initial states. Since the progression of the stages is stopped by this stopping of the output of the clock, accordingly the execution of the above described measurement operation and diagnosis operation goes into the stopped state.

Upon receipt of the clock signal from the starting circuit 254, the first stage counter 256 outputs a count value that controls the timing of processing during each interval of a stage STG2 (i.e. during each of an interval [RES of STGCal] to an interval [measurement of STGPSBG] that will be described hereinafter). The decoder 257 generates a timing signal STG1 that controls the processing timing within each interval of the stage STG2. And, according to the progression of the count value of the second stage counter 258, the corresponding interval from the left to the right of an operation table 260 is changed over in order. According to the count value of the second stage counter 258, a stage signal STG2 that specifies each interval is outputted from the decoder 259.

The first stage counter 256 is a lower level counter, while the second stage counter 258 is a higher level counter. At the count value "0000" of the second stage counter 258, between "0000" to "1111" of the count value of the first stage counter 256, a signal is outputted from the decoder 259 that indicates the RES interval of the stage STGCal (hereinafter this will be termed the interval [STGCal RES]). And processing of various types performed during this interval [STGCal RES] is executed on the basis of the signal of the decoder 257 that is outputted on the basis of the count values "0000" through "1111" of the first stage counter 256.

It should be understood that although, in FIG. 4, the first stage counter 256 is described in a simplified manner as being a four bit counter, if for example this first stage counter 256 is actually an eight bit counter, then it becomes possible to perform processing of 256 types, if it is supposed that different processing operations are performed for each count. For the case of the second stage counter 258 as well, just as for the first stage counter 256, it is also possible to perform a large number of different processing operations if it is supposed that a large number of counts are possible.

When the count value of the first stage counter 256 reaches "1111", then the interval [STGCal RES] ends, and the count value of the second stage counter 258 becomes "0001" and the interval [measurement of STGCal] starts. And, during the interval [measurement of STGCal] while the count value of the first stage counter 258 is "0001", processing of various types is executed on the basis of a signal that is outputted from the decoder 257 on the basis of the count values "0000" through "1111" of the first stage counter 256. And, when the count value of the first stage counter 256 reaches "1111", then the interval [measurement of STGCal] ends, and the count value of the second stage counter 258 becomes "0010" and the interval [STGCV1 RES] starts. Similarly in this interval [STGCV1 RES], when the count value of the first stage counter 256 reaches "1111", then this interval [STGCV1 RES] ends, and the count value of the second stage counter 258 becomes "0011" and the interval [measurement of STGCV1] starts.

In this manner, it starts from the interval [STGCal RES], the operating interval shifts rightward in order according to the count of the second stage counter 258, and the basic operation ends at the end of the interval [measurement of STGPSBG]. When subsequently the second stage counter 258 counts up, the interval [STGCal RES] restarts.

It should be understood that, since in the example shown in FIG. 2 only four battery cells are connected to IC1, accordingly the stages STGCV5 and STGCV6 in the table 260 are not used, or they are skipped and are not present. Furthermore, if the contents of the second stage counter 258 is forcibly set to some specified count value, then the processing during the interval that corresponds to this count value may be executed.

Diagnosis and Measurement: Diagnosis and Measurement at Each Stage

In the RES interval for each stage, initialization is performed of the analog to digital converter 122A that is used for measurement. In this embodiment, an analog to digital converter 122A of a charge/discharge type in which a capacitor is employed for reducing the influence of noise is used, and discharge of electric charge that was accumulated in the capacitor during the operation that was performed the previous time and so on is implemented in this RES interval.

In the measurement intervals for each stage in the row 260Y2, measurement is executed using the analog to digital converter 122A, and diagnosis of the subject that was measured is performed on the basis of the value that has been measured.

In the stages STGCV1 through STGCV6, the terminal voltages of the battery cells are measured in order in the measurement intervals, and moreover, from the values that are measured, diagnosis is performed as to whether each of the battery cells is in a state of excessive charge or excessive discharge. The diagnoses of excessive charge and excessive discharge are set so as to have a certain security breadth, in order to ensure that the states of excessive charge or excessive discharge do not actually occur. It should be understood that, if as shown in FIG. 2 the number of battery cells connected to the IC is four, then the stages STGCV5 and STGCV6 are skipped. In the measurement interval of the stage STGVDD, the output voltage of the constant voltage power supply 134 shown in FIG. 3 is measured. And, in the measurement interval of the stage STGTEM, the output voltage of the temperature sensor is measured. Finally, in the measurement interval of the stage STGPSBG, the reference voltage is measured.

Figure 5:
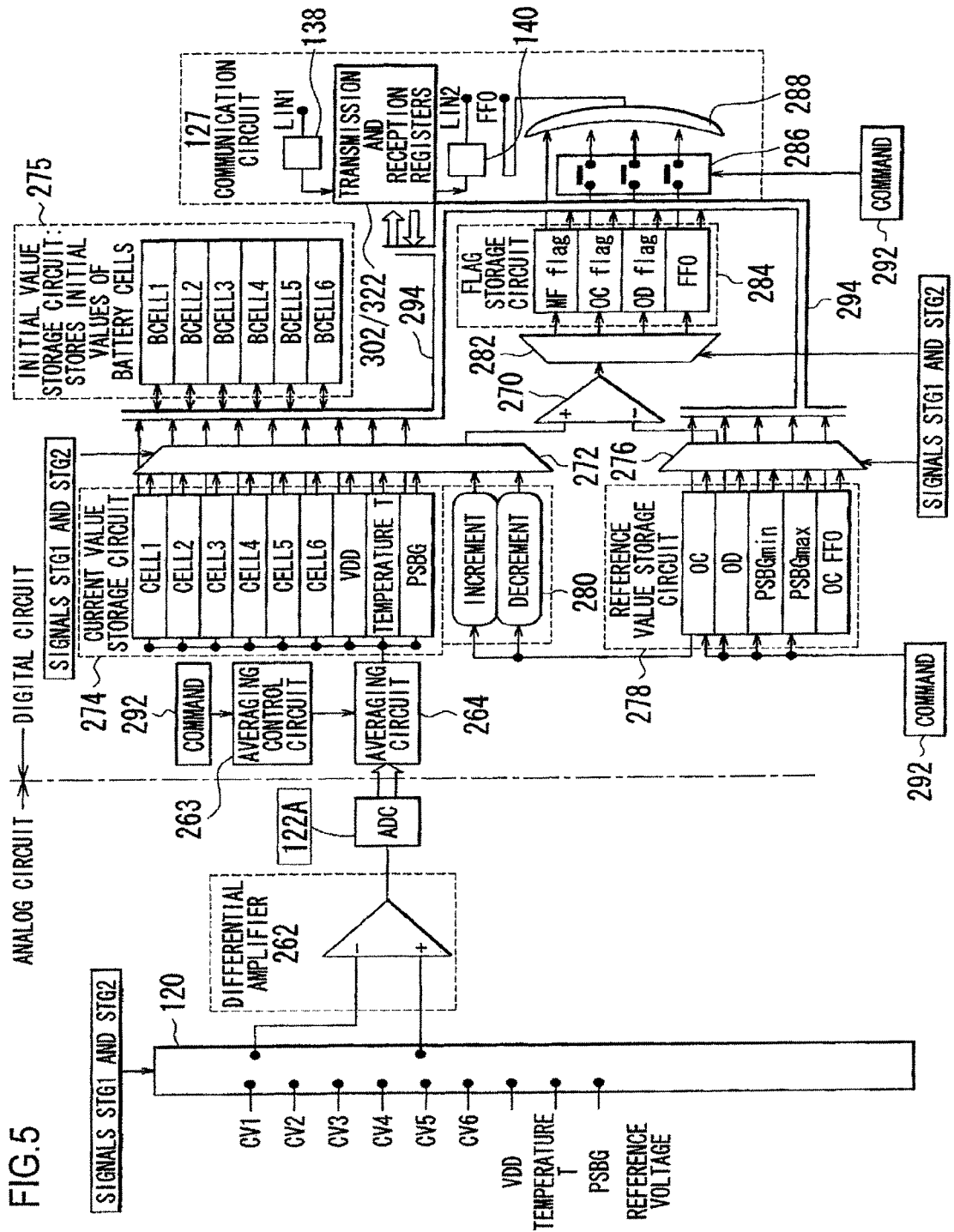
FIG. 5 is a figure showing a digital circuit portion of the internal blocks of the IC shown in FIG. 3.

Diagnosis and Measurement: Measurement of the Terminal Voltages of the Battery Cells The block diagram shown in FIG. 5 shows the details of a digital circuit portion of the internal blocks of the IC shown in FIG. 3. The signals STG1 and STG2 from the decoders 257 and 259 shown in FIG. 4 are inputted to the multiplexer 120, and selection operation is performed by the multiplexer 120 on the basis of these signals. For example, when the voltage of the battery cell BC1 is to be measured, and when the terminal CV1 and the terminal CV2 are selected, then the voltage of the battery cell BC1 is outputted from the multiplexer 120 to the differential amplifier 262. Now, this measurement of the terminal voltage of a battery cell will be explained.

It should be understood that, since the battery cells BC1 through BC4 (or BC1 through BC6) are connected in series, the negative electrode potentials of their terminal voltages are different. Due to this, the differential amplifier 262 is used for aligning them to a reference potential (GND potential in IC1 through IC3). The output of the differential amplifier 262 is converted to a digital value by the analog to digital converter 122A, and is outputted to the averaging circuit 264. The averaging circuit 264 obtains the average value of a predetermined number of measurement results. In the case of the battery cell BC1, this average value is stored in the register CELL1 of the current value storage circuit 274. It should be understood that the current value storage circuit 274, the initial value storage circuit 275, and the reference value storage circuit 278 of FIG. 5 correspond to the data retention circuit 125 of FIG. 3.

The averaging circuit 264 calculates the average value of the number of times of measurement maintained by the averaging control circuit 263, and its output is stored in the current value storage circuit 274 described above. If the averaging control circuit 263 just commands "1", then the output of the analog to digital converter 122A is stored in the register CELL1 of the current value storage circuit 274 just as it is without being averaged. But, if the averaging control circuit 263 commands "4", then the measurement results for the terminal voltage of the battery cell BC1 for four times are averaged together, and the average value thereof is stored in the register CELL1 of the current value storage circuit 274 described above. In this calculation of the average over four times, first it is necessary to perform measurement according to the stages of FIG. 4 four times, but from the fourth time, by using the four newest measured values in the calculation, it becomes possible to perform averaging calculation by the averaging circuit 264 upon each measurement. By providing the averaging circuit 264 that performs averaging a predetermined number of times as described above, it is possible to eliminate the bad influence of noise. The DC power of the battery module 9 shown in FIG. 1 is supplied to an inverter device, and is converted into AC power. The operation by the inverter device when performing this conversion from DC power to AC power to go continuous and discontinuous for current switching is performed at high speed, and, while a high amount of noise is generated at this time, by providing the averaging circuit 264, there is the beneficial effect that it is possible to reduce the negative influence of this type of noise.

The digital value of the terminal voltage of the battery cell BC1 that has been digitally converted is stored in the register CELL1 of the current value storage circuit 274. The above described measurement operation is performed during the measurement interval [measurement of STGCV1] of FIG. 4.

Diagnosis of Excessive Charge

Thereafter, during the interval in the stage STGCV1 shown as measurement, diagnosis operations are performed on the basis of the measured value. As these diagnosis operations, excessive charge diagnosis and excessive discharge diagnosis are performed. Before entering upon these diagnosis operations, reference values for diagnosis are transmitted from the microcomputer 30 to the various integrated circuits, and an excessive charge diagnosis reference OC (i.e. an excessive charge threshold value OC) is registered in the reference value storage circuit 278; and, moreover, an excessive discharge diagnosis reference OD (i.e. an excessive discharge threshold value OD) is also registered in the reference value storage circuit 278

On the basis of the outputs of the first stage counter 256 and the second stage counter 258 shown in FIG. 4, and according to the selection signal created by the decoder 257 and the decoder 259 (the signals STG1 and STG2), the digital multiplexer 272 reads out the terminal voltage of the battery cell BC1 from the register CELL1 of the current value storage circuit 274 and sends it to a digital comparator 270. Furthermore, the digital multiplexer 276 reads out the excessive charge threshold value OC from the reference value storage circuit 278 and sends it to the digital comparator 270. The digital comparator 270 compares together the terminal voltage of the battery cell BC1 from the register CELL1 and the excessive charge threshold value OC, and, if the terminal voltage of the battery cell BC1 is greater than the excessive charge threshold value OC, sets a flag [MFflag] in a flag storage circuit 284 that denotes an anomaly. Furthermore, it also sets a flag [OCflag] that denotes excessive charge. When these flags are set, an anomaly signal (a one-bit signal) is outputted from the terminal FFO of the communication circuit 127, and is sent to the microcomputer 30. Actually control should be performed so that this excessive charge state does not occur, so that this type of situation almost never takes place. However, this diagnosis is executed repeatedly in order to ensure reliability.

The communication circuit 127 is for performing transmission and reception of communication commands, and includes the above described transmission input circuits 138 and 142 and transmission output circuits 140 and 143. It should be understood that the transmission input circuit 142 and the transmission output circuit 143 are not shown in the figure. Furthermore, the details of reception and transmission registers 302 and 332 will be described hereinafter.

Diagnosis of Excessive Discharge

After this excessive charge diagnosis, diagnosis of excessive discharge is also performed during the measurement interval in the stage STGCV1. The digital multiplexer 272 reads out the terminal voltage of the battery cell BC1 from the register CELL1 of the current value storage circuit 274 and sends it to the digital comparator 270. Furthermore, the digital multiplexer 276 reads out the reference decision value OD for excessive discharge from the reference value storage circuit 278 and sends it to the digital comparator 270. The digital comparator 270 compares together the terminal voltage of the battery cell BC1 from the register CELL1 and the decision reference value OD for excessive discharge, and, if the terminal voltage of the battery cell BC1 is lower than the excessive discharge threshold value OD, sets the flag [MFflag] in the flag storage circuit 284 that denotes an anomaly. Furthermore, it also sets a flag [ODflag] that denotes excessive discharge. When these flags are set, an anomaly signal (a one-bit signal) is outputted from the terminal FFO, and is sent to the microcomputer 30. In the same way as in the case of excessive charge, actually control should be performed so that this excessive discharge state does not occur, so that this type of situation of excessive discharge almost never takes place. However, this diagnosis is executed repeatedly in order to ensure reliability.

The function of the selection circuit 286 can be changed by a communication command from the microcomputer 30, and it is possible selectively to change which of the flags are to be included in the flags that are outputted from the terminal FFO. For example, it would be acceptable to consider the condition in which only the flag MFflag is set in the flag storage circuit 284 as being an excessive charge anomaly. In this case, the excessive discharge anomaly diagnosis output of the digital comparator 270 is not set in the register MFflag, but only ODflag is set. It would be possible to arrange to determine whether or not ODflag is outputted from the terminal FFO by a setting condition for the selection circuit 286. In this case it is possible to provide a large number of different types of control, since it is possible to change the setting condition from the microcomputer 30.

The explanation described above is for measurement and diagnosis related to the battery cell BC1 in the stage STGCV1 of FIG. 4. In a similar manner, in the next stage STGCV2, the multiplexer 120 of FIG. 5 selects the terminal voltage of the battery cell BC2, and outputs it to the differential amplifier 262. After the output of the differential amplifier 262 has been converted to a digital value by the analog to digital converter 122A, its average value is calculated by the averaging circuit 264, and is stored in the register CELL2 of the current value storage circuit 274. And the digital comparator 270 compares together the terminal voltage of the battery cell BC2 that has been read out from the register CELL2 by the digital multiplexer 272 and the excessive charge threshold value OC, and then compares together the terminal voltage of the battery cell BC2 and the decision reference value OD for excessive discharge (i.e. the excessive discharge threshold value). Decision as to whether an anomalous condition holds is performed by this comparison with the excessive charge threshold value OC and by this comparison with the excessive discharge threshold value OD, and if an anomalous condition is occurring, then the flag [MFflag] in the flag storage circuit 284 that denotes an anomaly is set, and the flag [OCflag] or the flag [ODflag] that specifies the cause of the anomaly is set.

In a similar manner to the above, measurement of the terminal voltage of the battery cell BC3 and diagnosis of excessive charge or excessive discharge thereof is performed in the stage STGCV3, and then measurement of the terminal voltage of the battery cell BC4 and diagnosis of excessive charge or excessive discharge thereof is performed in the stage STGCV4.

It should be understood that, if the flag MFflag has been set by the diagnosis of any of the items described above, then this flag is outputted from the one-bit output terminal FFO via the OR circuit 288, and is transmitted to the microcomputer 30.

Diagnosis and Measurement: Storage of the Initial Data

With the system shown in FIG. 1, when the vehicle is in the driving stopped state and before the driver starts operation, current supply from the battery module 9 to the inverter device is not performed. Since the state of charge (SOC) of each of the battery cells is obtained accurately when the terminal voltage of each battery cell that is measured in the state in which no charge or discharge current flows to the battery cells is used, accordingly each integrated circuit starts its measurement operation individually on the basis of actuation of the key switch of the vehicle, or of receipt from the microcomputer of a communication command 292 such as "Wake Up" or the like. When the measurement operation and the diagnosis operation for the battery cells explained with reference to FIG. 4 is started by each of the integrated circuits, and measurements for the number of times to be stored by the averaging control circuit 263 have been performed, then the calculation by the averaging circuit 264 to obtain averages of the measured values is performed. The result of this calculation is first stored in the storage circuit 274. Each of the integrated circuits performs its measurement of all of the battery cells of the cell group to which this integrated circuit is related and the calculation of the average values of these measurements independently, and the results of these calculations are stored in the registers CELL1 through CELL6 of the current value storage circuit 274 of each of the integrated circuits.

In order accurately to ascertain the state of charge (SOC) of each of the battery cells, it is desirable to measure the terminal voltage of each of the battery cells in the state in which no charge or discharge current is flowing in that battery cell. By each of the integrated circuits starting the measurement operation individually in the above manner, the terminal voltage of each of the battery cells to which each of the integrated circuits is related is measured before current supply from the battery module 9 to the inverter device, and the results are stored in the registers CELL1 through CELL6 of their current value storage circuits 274. Since the measured values that are stored in the current value storage circuits 274 are thereafter overwritten by new measurement results, before starting the supply of current, the measurement results are copied from the registers CELL1 through CELL6 of the current value storage circuit 274 to registers BCELL1 through BCELL6 of the initial value storage circuit 275, and are thus stored by the initial value storage circuit 275. Since the measured values before starting the supply of current from the battery module 9 to the inverter device are stored in the initial value storage circuit 275 in this manner, accordingly it is possible to defer processing for calculating the state of charge (SOC) and so on, and it is possible preferentially to execute processing for diagnosis whose priority level is high. After the processing whose priority level is high is executed and supply of current from the battery module 9 to the inverter device has been started, the state of charge (SOC) of each of the battery cells is calculated on the basis of the measured values, and it becomes possible to perform control for adjusting the state of charge (SOC) on the basis of accurate state detection. Sometimes the driver of the vehicle wishes to start driving the vehicle as quickly as possible, so that it is desirable for it to be made possible to supply current to the inverter device quickly, as described above.

At the timing in the example shown in FIG. 5 at which, as described above, the measured values are stored in the current value storage circuit 274 before starting the supply of current to the inverter device that constitutes the electrical load, diagnosis by the digital comparator 270 of excessive charge or excessive discharge and diagnosis of leakage current and so on can be implemented. Due to this, it is possible to ascertain the existence of any anomalous condition before the supply of DC power to the inverter device. If an anomalous condition has occurred, this anomaly can be detected by the above diagnosis before supply of current, so that it becomes possible to institute countermeasures such as non-supply of DC power to the inverter device, or the like. Furthermore since, by copying the values that are initially measured before the supply of current and that are stored in the current value storage circuit 274 to the initial value storage circuit 275, it is possible to keep them stored in the dedicated initial value storage circuit 275, accordingly there are the outstandingly advantageous effects of enhancing the security and of ascertaining accurate states of charge (SOC).

Communication Commands

Figure 6:
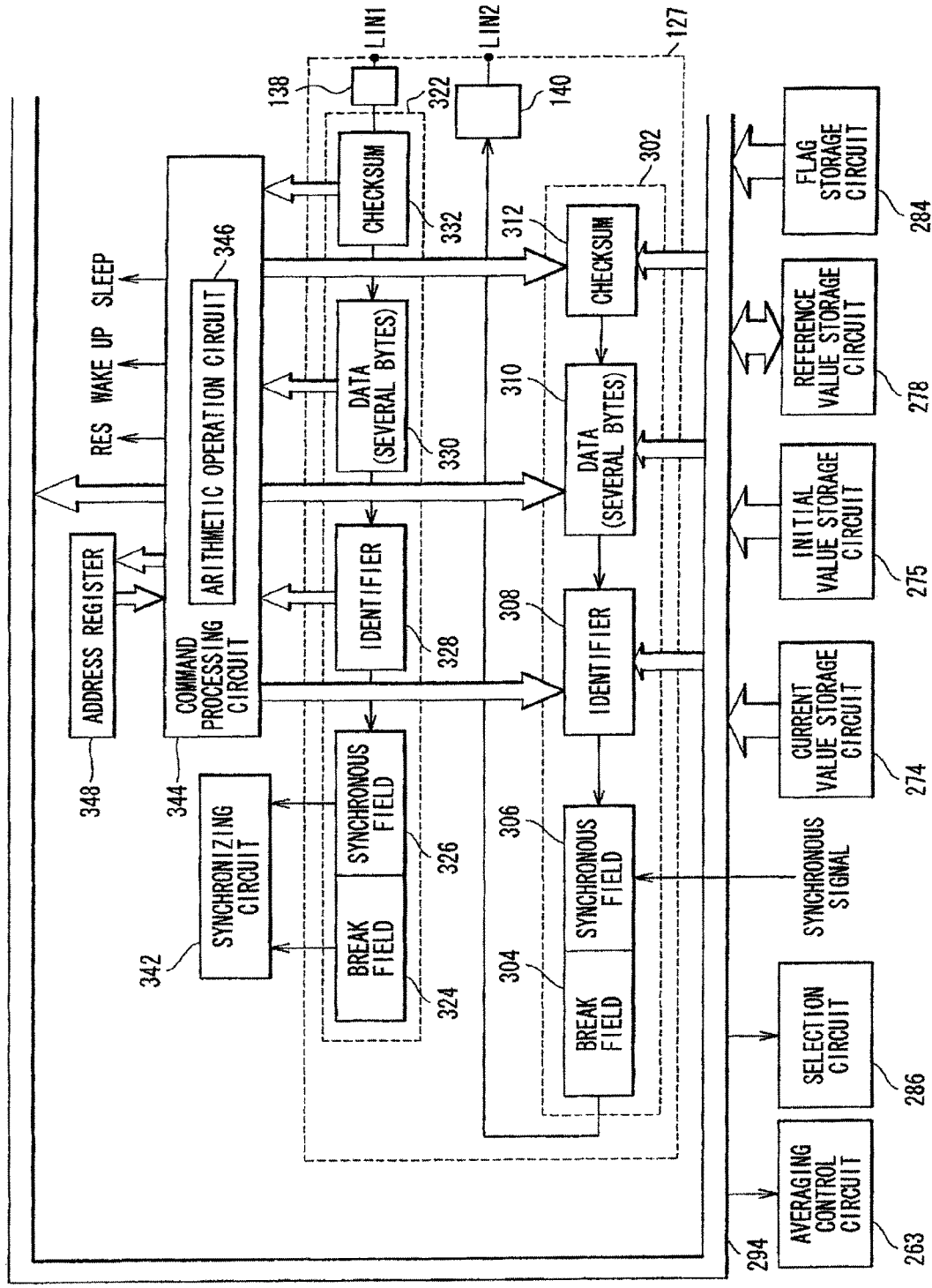
FIG. 6 is a figure showing a communication circuit 127 and explaining its operation.

FIG. 6 is a figure for explanation of the operation in IC1 for the transmission and reception of communication commands. The other integrated circuits IC2 and IC3 also perform similar operations, as described above. A communication command that is sent from the microcomputer 30 to the reception terminal LIN1 of IC1 has 5 portions in all, each of which is a single 8-bit unit, thus having a single basic structure containing 5 bytes. However, in the following explanation, sometimes such a command becomes longer than 5 bytes, and the commands are not to be considered as being limited to 5 bytes. The communication commands are inputted from the reception terminal LIN1 to a reception register 322, and are stored therein. It should be understood that this reception register 322 is a shift register, and the signal that is serially inputted from the reception terminal LIN1 is shifted in order as it is inputted to the reception register 322, so that the header portion of this communication command is stored in a break field portion 324 that is a header portion of the register, while the subsequent portion is stored sequentially.

As described above, the leading 8 bits of the communication command 292 that is stored in the reception register 322 are a break field 324 that consists of a signal indicating that a signal has arrived. The second 8 bits is a synchronous field 326 that consists of a signal that functions to establish synchronization. The third 8 bits is a subject address that specifies which integrated circuit among IC1 through IC4 is to be the subject of the command and where it is, and an identifier 328 that specifies the details of the command. The fourth 8 bits stores data that is required for executing this command as data 330 that specifies the details of the communication (i.e. the control contents). This portion is not limited to being a single byte. The fifth 8 bits is a checksum 332 for checking whether or not an error has occurred during the transmission and reception operation, and, if it has not been possible to perform the transmission accurately due to the presence of noise or the like, then it is possible to detect this fact by using this checksum. In this manner, the communication command from the microcomputer 30 consists of five portions: the break field 324, the synchronous field 326, the identifier 328, the data 330, and the checksum 312.

If each of these consists of a single byte, then the communication command consists of 5 bytes, and this 5 byte structure is the basic structure; but the data 330 is not limited to being a single byte, and, accordingly to requirements, sometimes it may be increased to a greater data length.

The synchronous field 326 is used for establishing synchronization between a transmission clock on the transmitting side and a reception clock on the reception side. The timing at which the pulses of the synchronous field 326 are sent and arrive is detected by a synchronizing circuit 342, and synchronization of this synchronizing circuit 342 is performed by the timing of the pulses of the synchronous field 326. The reception register 322 receives this continuous signal at this matched timing. By doing this, the beneficial effect is obtained that it is possible accurately to select the comparison timing between the signal that is arriving and the threshold value at which the true value of the signal is determined, so that it is possible to reduce errors during the transmission and reception operation.

The communication command 292 is sent from the microcomputer 30 via the communication circuit 602 shown in FIG. 2 to the reception terminal LIN1 of IC1 that is the IC at the first stage, and is then sent from the transmission terminal LIN2 of this IC1 to the reception terminal LIN1 of the next IC2, and moreover is sent from the transmission terminal LIN2 of IC2 to the reception terminal LIN1 of IC3 that is the IC at the last stage, and then is sent from the transmission terminal LIN2 of this IC3 to a reception terminal LIN1 (not shown in the figures) of the microcomputer 30. In this manner, the communication command 292 is transmitted via the communication circuit 602 in which the transmission and reception terminals of the integrated circuits IC1 through IC3 are connected in series in the form of a loop. A similar situation holds in relation to IC4 through IC6 of the battery block 9B.

While the circuitry of IC1 has been explained as being representative of all of the integrated circuits, as described above, the other integrated circuits also have the same structure and operation. The communication command 292 is transmitted to the reception terminal LIN1 of IC1. And the communication command 292 that has been received by each of the integrated circuits is transmitted from its transmission terminal LIN2 to the next integrated circuit. In the operation described above, it is decided by the command processing circuit 344 of FIG. 6 whether or not it is itself the designated subject of a communication command 292 that it has received, and, if this integrated circuit is itself the subject, then it performs processing on the basis of the communication command. The processing described above is performed sequentially on the basis of transmission and reception of communication commands 292 by each of the integrated circuits.

Accordingly, even if a communication command that is stored in the reception register 322 has no relationship with IC1, it is still necessary to perform transmission to the next integrated circuit on the basis of this communication command 292 that has been received. Thus, the command processing circuit 344 inputs the contents of the identifier 328 of a communication command 292 that has been received, and decides whether or not this IC1 is itself the command subject of this communication command 292. And, if IC1 is not itself the command subject of this communication command 292, then it transfers the contents of the identifier 328 and of the data 330 just as it is to the identifier 308 and data 310 portions of the transmission register 302. Moreover, the circuit 344 inputs the checksum 312 for checking upon erroneous transmission and reception operation and completes the signal for transmission in the transmission register 302, and then transmits this signal from the transmission terminal LIN2. In a similar way to the reception register 322, the transmission register 302 is also built as a shift register.

If the subject of the communication command that has been received is itself, then one or more commands are executed on the basis of the communication command 292. This execution will now be explained in the following.

Sometimes it is the case that the subject of the communication command 292 that has been received is related to all of the integrated circuits as a whole, including this IC.

For example, this type of command includes the RES command, the "Wake Up" command, and the "Sleep" command. When a RES command is received, the details of this command are decoded by the command processing circuit 344, and a RES signal is outputted. When this RES signal is generated, all the data stored in each of the current value storage circuit 274, the initial value storage circuit 295, and the flag storage circuit 284 of FIG. 5 is set to "zero" as initial value. While in this case the contents of the reference value storage circuit 278 of FIG. 5 does not become "zero" it would also be acceptable to arrange for it to be set to "zero". If the contents of the reference value storage circuit 278 is changed to "zero", then, since the measurement and diagnosis shown in FIG. 4 are executed individually by each of the integrated circuits after generation of the RES signal, accordingly it becomes necessary to set the values in the reference value storage circuit 278 that will become the reference values for diagnosis rather rapidly. The reference value storage circuit 278 is made as a circuit whose contents are not changed by the RES signal in order to avoid this inconvenience. Since the values in the reference value storage circuit 278 is not attribute data that changes frequently, accordingly it would also be acceptable to utilize the previous values. If there is a requirement for these values to be changed, then they may be changed individually with other communication commands 292. The values stored in the averaging control circuit 263 by the RES signal are a predetermined number of values, for example 16. In other words, if not changed by some communication command 292, a setting is established for the average of 16 measured values to be calculated.

When a "Wake Up" command is outputted from the command processing circuit 344, the starting circuit 254 of FIG. 4 starts its operation, and its operations of measurement and diagnosis are started. Due to this, the power consumed by this integrated circuit itself is increased. On the other hand, when a "Sleep" signal is outputted from the command processing circuit 344, the operation of the starting circuit 254 of FIG. 4 is stopped, and its operations of measurement and diagnosis are stopped. Due to this, the power consumed by this integrated circuit itself is remarkably reduced.

Next, the reading in and changing of data according to a communication command 292 will be explained with reference to FIG. 6. The identifier 328 of the communication command 292 designates the integrated circuit that is to be selected. In the case of a data write command to the address register 348 or to the reference values storage circuit 278, or of a data write command to the averaging control circuit 263 or to the selection circuit 286, the command processing circuit 344 designates the subject for the data 330 to be written into on the basis of the details of the command, and writes the data 330 into this register that is the subject for being written into.

The address register 348 is a register in which the address of this integrated circuit itself is stored, and its own address is determined according to these contents. By setting the contents of this address register 348 to zero upon the RES signal, the address of this integrated circuit itself becomes the address "zero". And, when the contents of this address register 348 is changed by a new command, the address of this integrated circuit itself is changed to these changed contents.

Apart from the stored contents in the address register 348 being changed by the communication command 292, the stored contents in the reference value storage circuit 278, the flag storage circuit 284, the averaging control circuit 263, and the selection circuit 286 described in FIG. 5 may also be changed. If a subject of change related to these is designated, then the contents of the data 330, that is the changed value, is sent to the circuit that is the subject of change via a data bus 294, so that its stored contents are changed. The circuit of FIG. 5 then executes its operation on the basis of these contents that have been changed.

A transmission command for data that is being stored internally to the integrated circuit is included in the communication commands 292. Designation of the data that is to be the subject of transmission is performed by a command with the identifier 328. For example, when an internal register to the current value storage circuit 274 or the reference value storage circuit 278 is designated, then the contents stored in the designated register is stored in the data 310 circuit of the transmission register 302 via the data bus 294, and is transmitted as the requested data contents. In this manner, it becomes possible for the microcomputer 30 shown in FIG. 1 to input, using communication commands 292, the needed values measured by the integrated circuits and the flags that designate their states.

The First Embodiment

As described above, when performing cell voltage measurement, from among the terminals CV1 through CV6 and the GNDS terminal, a pair of terminals that are connected to both of the electrodes of the battery cell that is to be the subject of measurement are selected by the multiplexer 120 shown in FIG. 3. A selection signal for this terminal selection is generated by a digital region within IC2 (the IC control circuit 123 of FIG. 3), and is inputted to the multiplexer 120. However, if a malfunction occurs in the multiplexer 120, then sometimes it may happen that different terminals from those in the command containing the selection signal are selected. In this type of case as well, in the prior art, from the cell voltage transmitted to the side of the microcomputer 30, it was not possible to determine whether or not the cell voltage that was measured had been correctly selected. Accordingly, as explained below, in this first embodiment it is arranged for it to be possible to decide whether or not the selection of terminals by the multiplexer 120 has been correctly performed, on the basis of the cell voltage that has been transmitted to the side of the microcomputer 30.

In the following, this multiplexer connection diagnosis will be explained with reference to FIGS. 7A through 12. As described above, each of the ICs, along with performing voltage measurement and state diagnosis periodically on the basis of commands by the timing control circuit 126 with no relationship with commands from the microcomputer 30 that is the higher level controller, also turns the balancing switches ON on the basis of commands from the microcomputer 30, and thereby performs adjustment of the capacities of the battery cells. However, in the state in which capacity adjustment is being performed by turning one or more of the balancing switches to ON, due to the flow of discharge current, voltage drop takes place in the corresponding resistors RCV that are provided in the voltage measurement lines for the terminals VC1 through VC6, so that the voltages between the terminals VC come to be different from the voltage values of the battery cells. Due to this a balancing switch masking function (hereinafter termed the "mask function") is provided, according to which, even during the balancing operation, the balancing switch that gives influence to the measurement is automatically turned to OFF during intervals for measurement of the cell voltages, since otherwise they would exert an influence upon the measurement of the cell voltages.

Figure 7A:
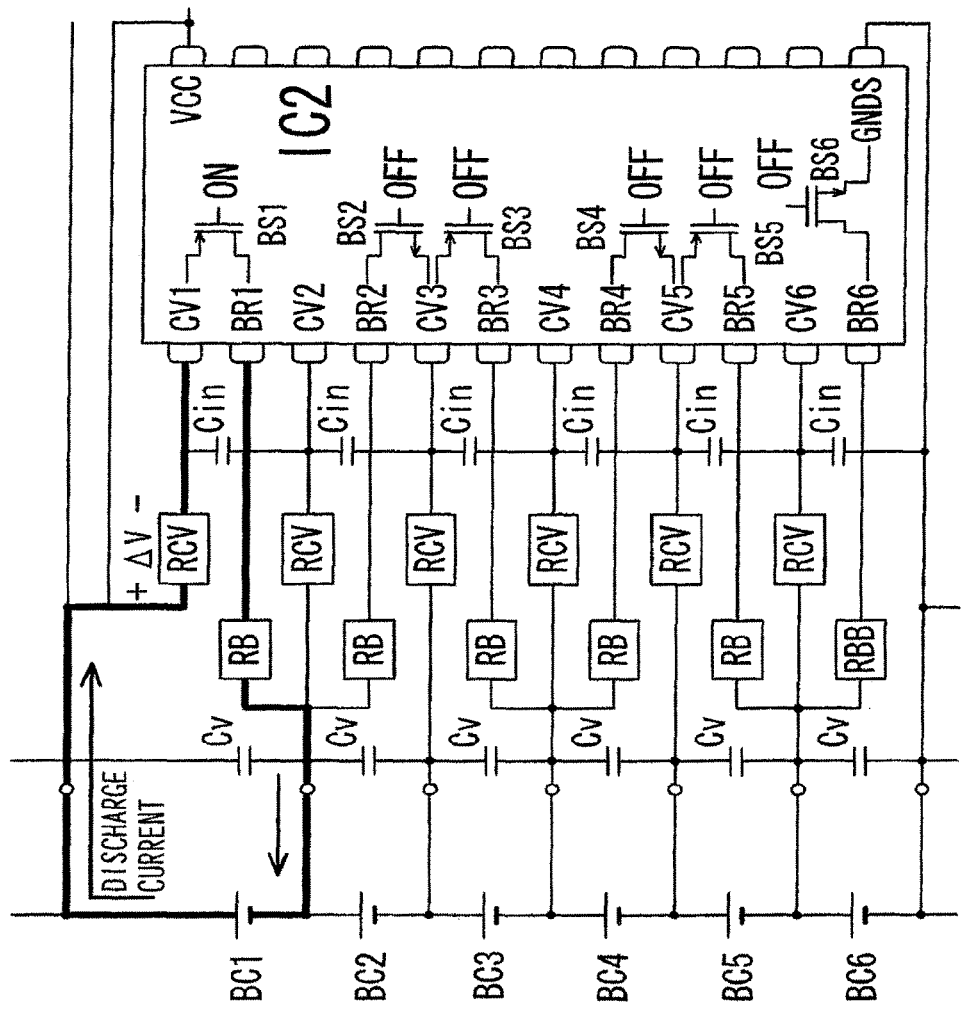
FIG. 7A is a figure for explanation of connection diagnosis related to a battery cell BC1, and shows peripheral circuitry for detection of its cell voltage.
Figure 7B:
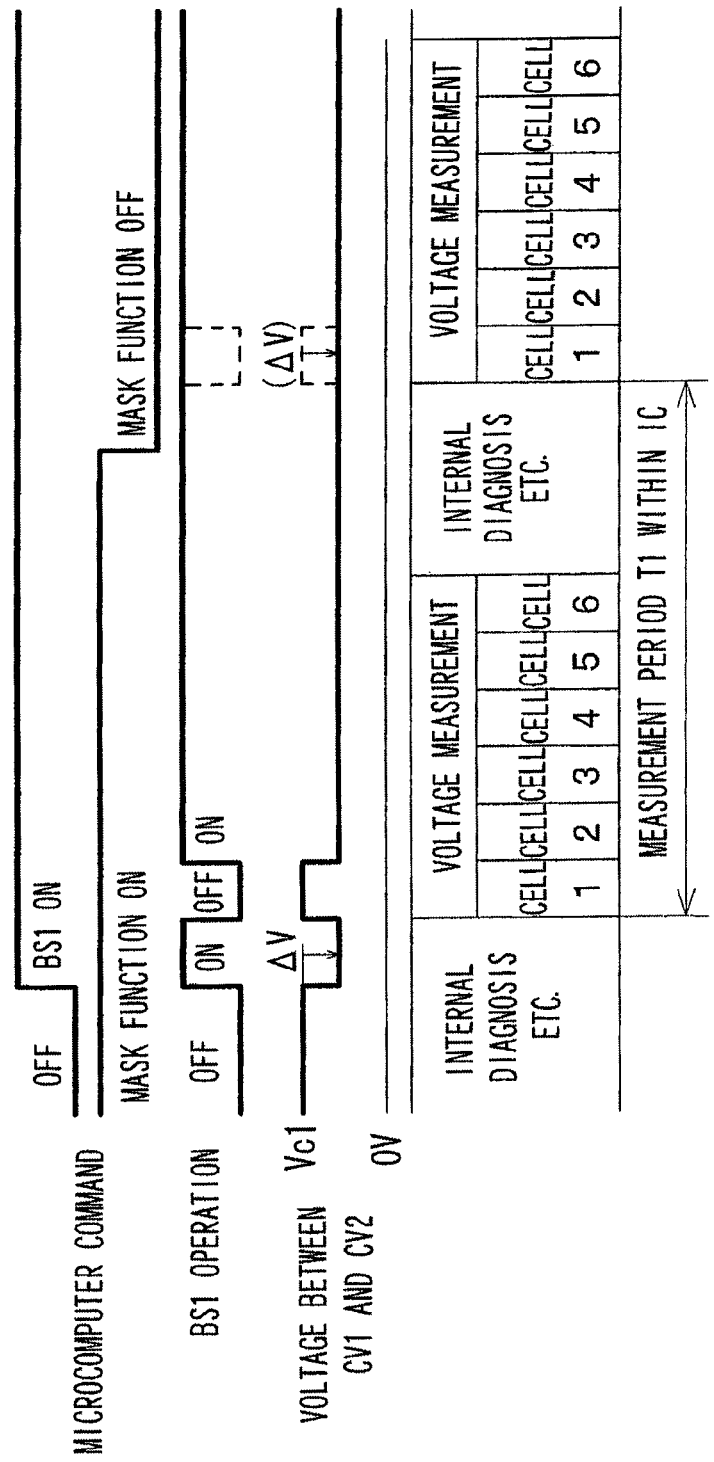
FIG. 7B is a figure for explanation of connection diagnosis related to this battery cell BC1, and shows operations of various types when a mask function is ON and OFF.

Referring to FIGS. 7A and 7B, this mask function will be explained for the example in which adjustment of the battery cell BC1 is performed by IC2. FIG. 7A is a figure showing IC2, the battery cells BC1 through BC6, and peripheral circuitry for detecting the cell voltages. And FIG. 7B is a figure for explanation of the operation of the balancing switch BS1 and the voltage between the terminals CV1 and CV2, when the mask function goes ON and OFF. The left side portion of the timing chart shown in FIG. 7B (i.e. a range that shows the mask function ON) shows the situation when the mask function has been turned ON, and the right side portion of this timing chart (i.e. a range that shows the mask function OFF) shows the situation when the mask function has been turned OFF.

As previously described, without any relationship with commands from the microcomputer 30, IC2 performs measurement of the cell voltages of the battery cells BC1 through BC6 upon a predetermined cycle, and also performs correlated internal diagnosis (for example, excessive charge detection). And, each time the cell voltages are measured, the cell voltages that are being retained in the data retention circuit 125 of FIG. 3 (i.e. the current value storage circuit 274 of FIG. 5) are rewritten. When balancing of the battery cell BC1 is to be performed, a command to turn the balancing switch BS1 is transmitted to IC2 from the microcomputer 30. And, according to this command, IC2 turns the balancing switch BS1 to ON.

When the balancing switch BS1 is turned ON, a discharge current flows from the battery cell BC1 as shown by the arrow sign in FIG. 7A. At this time, since this discharge current flows in the resistor RCV that is provided in the voltage measurement line of the terminal CV1, accordingly the voltage between the terminals CV1 and CV2 is reduced from the cell voltage Vc1 of the battery cell BC1 by just the voltage drop $\Delta V$ in this resistor RCV. However, the voltages between the other terminals (CV2 and CV3, CV3 and CV4, CV4 and CV5, CV5 and CV6, and CV6 and GND S) do not receive any influence from this discharge current, so that they reflect the cell voltages Vc2 through Vc6 of the battery cells BC2 through BC6.

Due to this, in the prior art, during the measurement interval, it has been practiced to provide a function of turning the balancing switch that is experiencing an influence due to this measurement to the OFF state, in other words a mask function. In the case of the example shown in FIG. 7A, it is arranged to turn the balancing switch BS1 to OFF during the voltage measurement interval for the battery cell BC1, as shown in the left half portion of FIG. 7B (that shows the mask function ON state).

Now, when measurement of the voltages of the battery cells BC1 through BC6 is performed with the mask function turned OFF, the voltage between the terminals CV1 and CV2 experiences the influence of the discharge current, as described above, and becomes Vc1–$\Delta V$. In other words, when the mask function is ON, Vc1, Vc2, Vc3, Vc4, Vc5, and Vc6 are measured in order as being the cell voltages of the battery cells BC1 through BC6; while, when as shown in the right side portion of FIG. 7B the mask function is OFF, the voltages between the terminals become: "voltage between CV1 and CV2=Vc1–$\Delta V$", "voltage between CV2 and CV3=Vc2", "voltage between CV3 and CV4=Vc3", "voltage between CV4 and CV5=Vc4", "voltage between CV5 and CV6=Vc5", and "voltage between CV6 and GND S=Vc6". In other words, Vc1–$\Delta V$, Vc2, Vc3, Vc4, Vc5, and Vc6 are measured in order as being the cell voltages of the battery cells BC1 through BC6.

Accordingly, if during measurement of the cell voltage of the battery cell BC1 the multiplexer 120 selects the terminals VC1 and VC2, when the mask function is OFF, a voltage is measured that is just $\Delta V$ lower than when the mask function is ON. Due to this fact, by comparing together the cell voltage when the mask function is ON and the cell voltage when the mask function is OFF, it is possible to diagnose whether or not the terminals VC1 and VC2 have been selected according to command from the multiplexer 120. If the resistance values of the resistors RCV and RB are Rcv and Rb, and the ON resistance of the balancing switch BS1 is Ron, then:

$$\Delta V = Vc1 \cdot Rcv/(Rb+Rcv+Ron)$$

By making a decision by comparing the difference Vc1–(Vc1–$\Delta V$)=$\Delta V$ against an appropriate threshold value, it is possible to diagnose whether or not the battery cell BC1 was correctly selected by the multiplexer 120.

It should be understood that, when BS1 is ON with BS2 through BS6 being OFF, since the voltage between the other terminals does not change when the mask function goes ON and OFF, accordingly it is not possible to perform connection diagnosis of the multiplexer 120 for these other terminals at this time. For example, if the cell voltages of the battery cells BC2 through BC6 are equal, it is not possible to decide which terminals are being selected according to commands from the multiplexer 120.

Figure 8A:
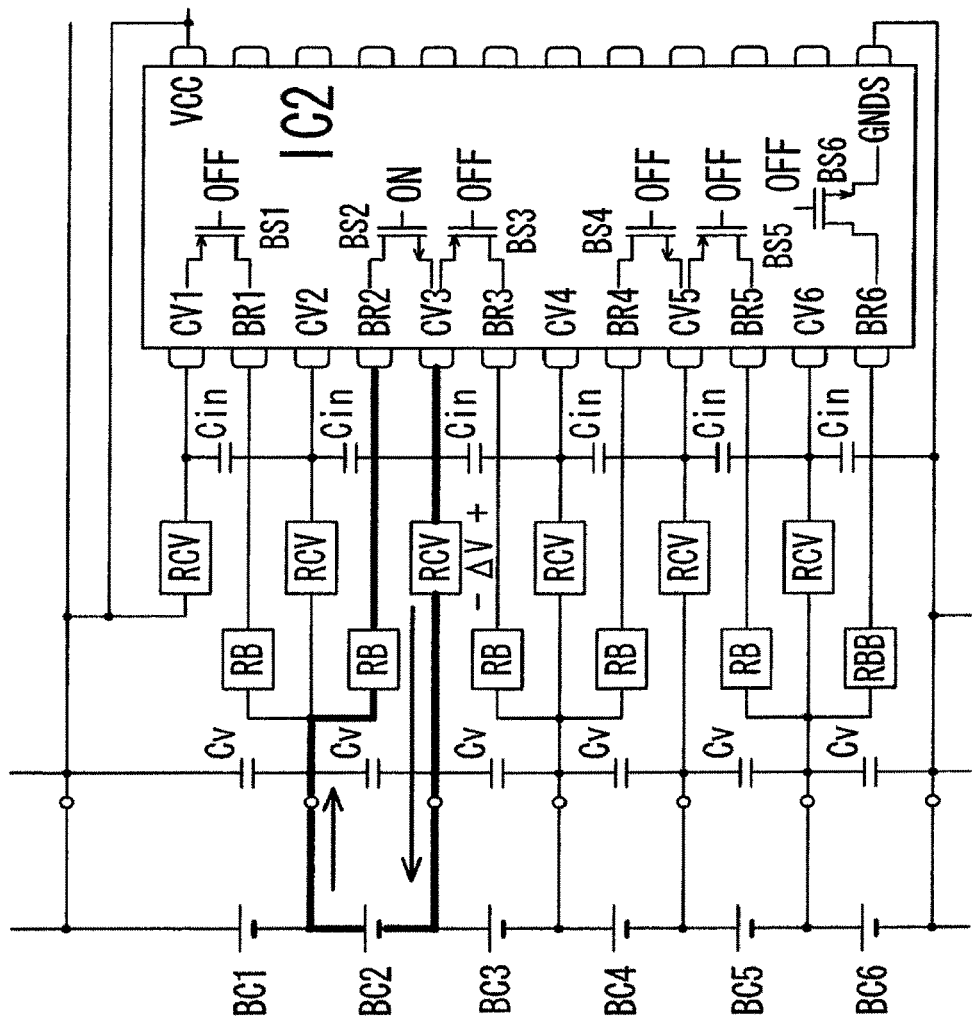
FIG. 8A is a figure for explanation of connection diagnosis related to a battery cell BC2, and shows peripheral circuitry for detection of its cell voltage.
Figure 8B:
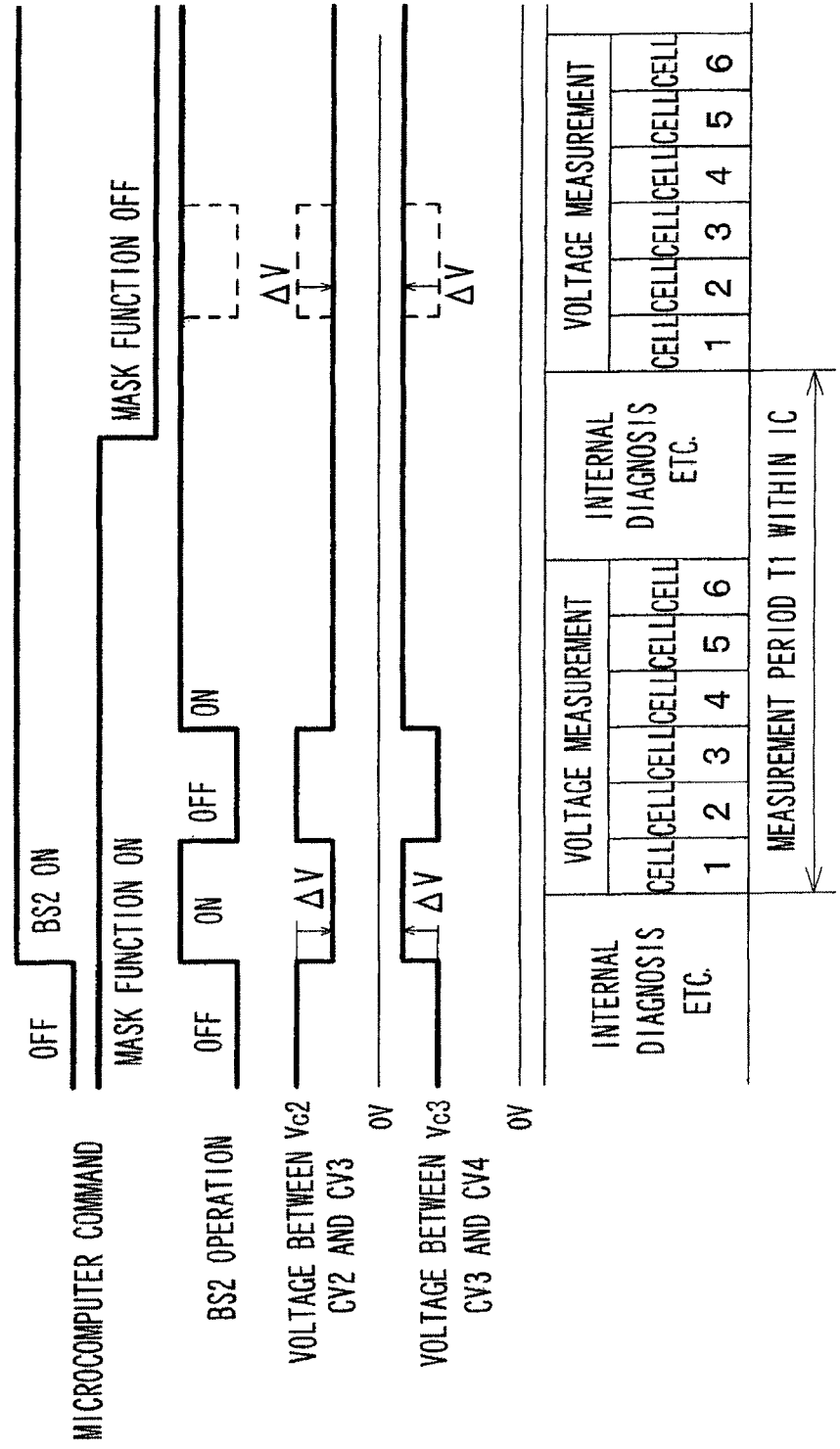
FIG. 8B is a figure for explanation of connection diagnosis related to this battery cell BC2, and shows operations of various types when a mask function is ON and OFF.

FIGS. 8A and 8B are figures for explanation of the diagnosis of terminal selection by the multiplexer 120 during measurement of the cell voltage of the battery cell BC2. First, the balancing switch BS2 is turned ON in the state with the mask function ON, as shown in FIG. 8B, and the cell voltage of each of the battery cells is measured. When the balancing switch BS2 is turned ON, as shown in FIG. 8A, since a discharge current flows in the resistor RCV that is provided in the voltage measurement line of the terminal CV3, the voltage drop in this resistor RCV exerts an influence both upon the measurement of the voltage between the terminals CV2 and CV3, and also upon the measurement of the voltage between the terminals CV3 and CV4. Due to this, in the mask function ON state, the balancing switch BS2 is turned to OFF during the intervals in which the cell voltage of the battery cell BC2 and the cell voltage of the battery cell BC3 are measured. As a result, in order, VC1, Vc2, Vc3, Vc4, Vc5, and Vc6 are measured as the respective cell voltages of the battery cells BC1 through BC6.

Next, when the mask function is turned OFF and the voltages between the various terminals are measured, since as shown in FIG. 8A a voltage drop of $\Delta V$ is present across the resistor RCV, accordingly the results "voltage between CV1 and CV2=Vc1", "voltage between CV2 and CV3=Vc2–$\Delta V$", "voltage between CV3 and CV4=Vc3+$\Delta V$", "voltage between CV4 and CV5=Vc4", "voltage between CV5 and CV6=Vc5", and "voltage between CV6 and GND S=Vc6" are obtained. In other words, since the cell voltages of the battery cells BC2 and BC3 are different when the mask function is ON and when it is OFF, accordingly, by comparing this difference against an appropriate threshold value, it is possible to diagnose whether or not the battery cells BC2 and BC3 were correctly selected according to command by the multiplexer 120. At this time, ΔV is given by ΔV=Vc2·Rcv/(Rb+Rcv+Ron).

Figure 9A:
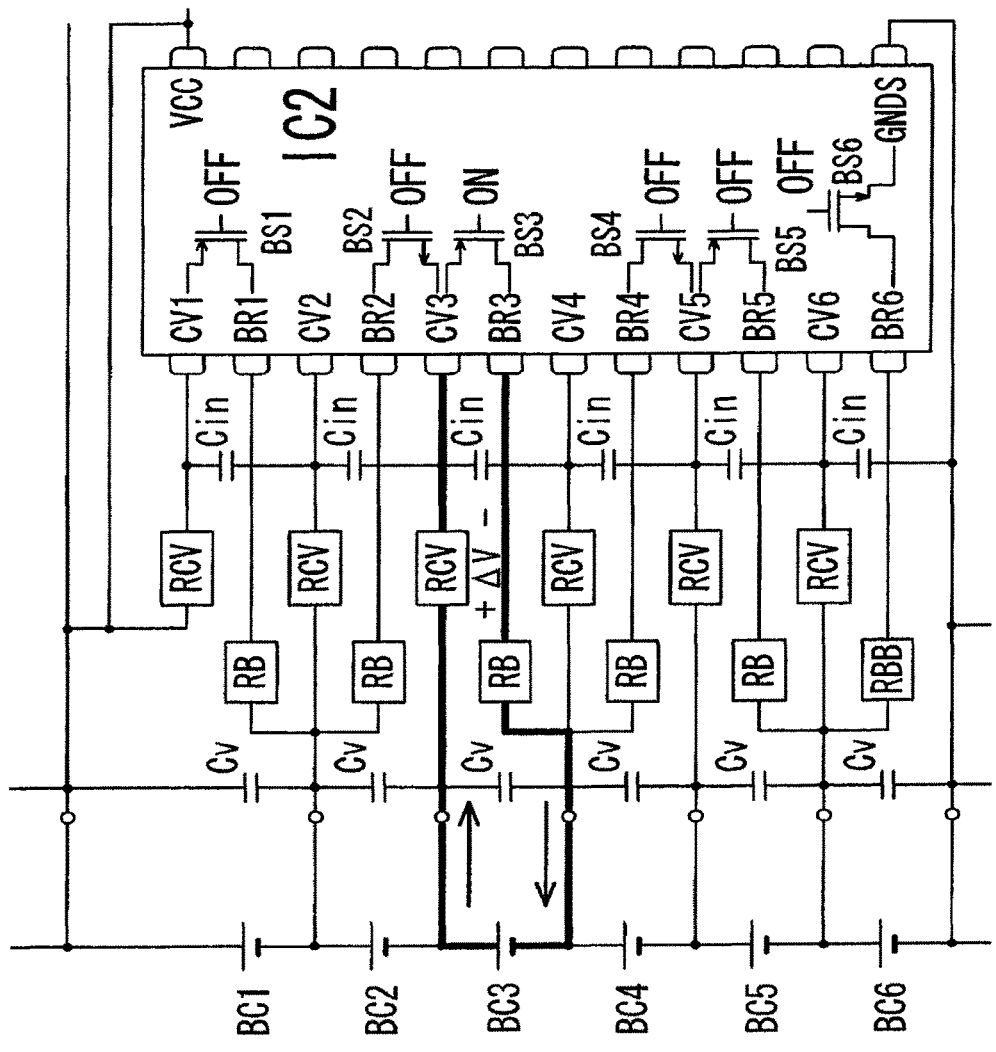
FIG. 9A is a figure for explanation of connection diagnosis, and particularly explains connection diagnosis related to a battery cell BC3.

In a similar manner, when as shown in FIG. 9A the balancing switch BS3 is turned ON with the mask function OFF, the voltages between terminals become "voltage between CV1 and CV2=Vc1", "voltage between CV2 and CV3=Vc2+ΔV", "voltage between CV3 and CV4=Vc3−ΔV", "voltage between CV4 and CV5=Vc4", "voltage between CV5 and CV6=Vc5", and "voltage between CV6 and GND S=Vc6". Accordingly, it is possible to perform multiplexer connection diagnosis in relation to the battery cells BC2 and BC3. At this time, ΔV is given by ΔV=Vc3·Rcv/(Rb+Rcv+Ron).

Figure 9B:
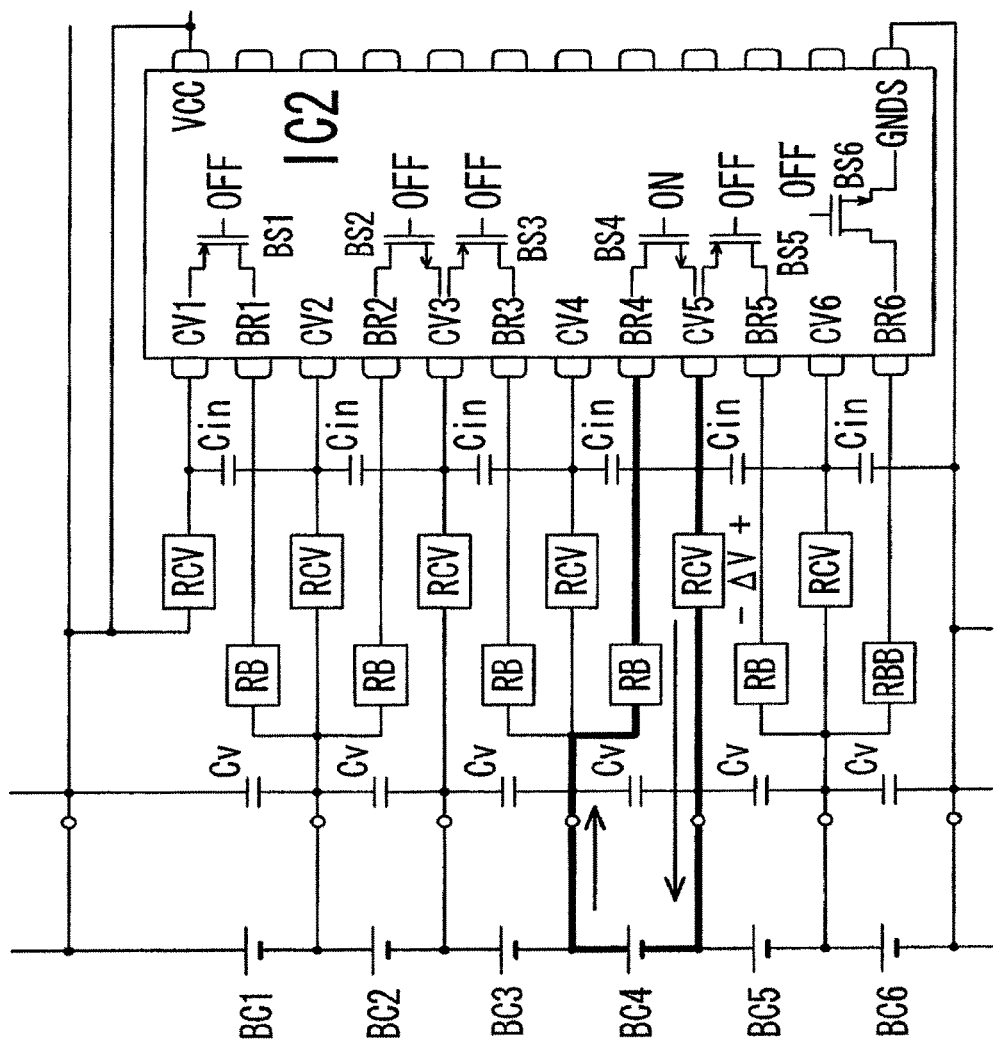
FIG. 9B is a figure for explanation of connection diagnosis, and particularly explains connection diagnosis related to a battery cell BC4.

FIG. 9B shows the case in which the balancing switch BS4 is turned ON with the mask function OFF. In this case, the voltages between terminals become "voltage between CV1 and CV2=Vc1", "voltage between CV2 and CV3=Vc2+ΔV", "voltage between CV3 and CV4=Vc3", "voltage between CV4 and CV5=Vc4−ΔV", "voltage between CV5 and CV6=Vc5+ΔV", and "voltage between CV6 and GND S=Vc6". At this time, ΔV is given by ΔV=Vc4·Rcv/(Rb+Rcv+Ron).

Figure 10A:
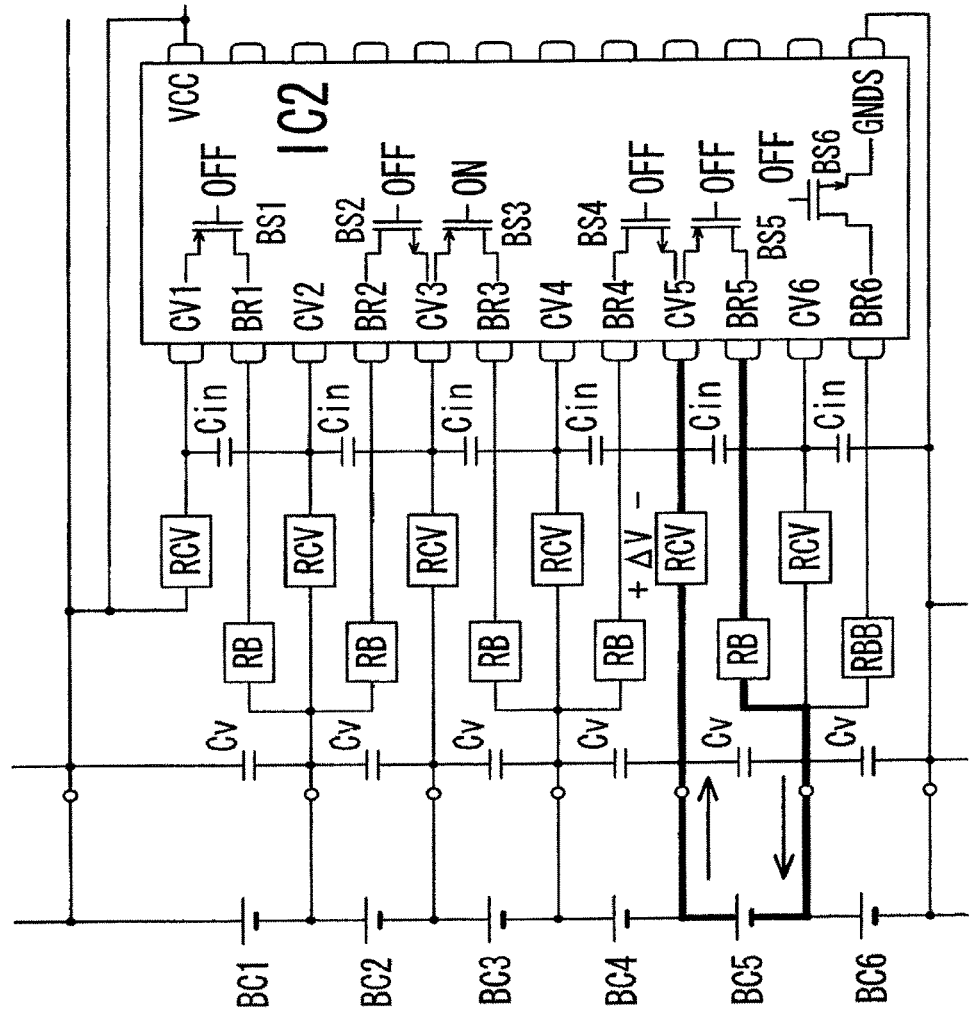
FIG. 10A is a figure for explanation of connection diagnosis, and particularly explains connection diagnosis related to a battery cell BC5.

Moreover, FIG. 10A shows a case in which the balancing switch BS5 is turned ON with the mask function OFF. In this case, the voltages between terminals become "voltage between CV1 and CV2=Vc1", "voltage between CV2 and CV3=Vc2+ΔV", "voltage between CV3 and CV4=Vc3", "voltage between CV4 and CV5=Vc4+ΔV", "voltage between CV5 and CV6=Vc5−ΔV", and "voltage between CV6 and GND S=Vc6". At this time, ΔV is given by ΔV=Vc5·Rcv/(Rb+Rcv+Ron). In either of the cases shown in FIG. 9B and FIG. 10A, it is possible to perform multiplexer connection diagnosis in relation to the battery cells BC4 and BC5.

Now, the cell voltages of the battery cells BC1 through BC6 are not precisely constant, but rather do vary somewhat. Due to this, in order to perform the diagnosis by comparing together the difference and ΔV, it is necessary to set the resistance values of the resistors RCV so that ΔV=Vcj·Rcv/(Rb+Rcv+Ron), for j=1-5, becomes greater than the variations between the cell voltages. Furthermore, in this embodiment, a structure is provided that performs capacity adjustment so that, when the balancing switches BS1 through BS6 are turned ON and OFF, the variations of the cell voltages are kept within a predetermined voltage range. Due to this, the actual variation of voltage becomes less than or equal to a voltage variation threshold value at which capacity adjustment is started. Thus, it would also be acceptable to set the values of the resistances of the resistors RCV so that ΔV becomes greater than the voltage variation threshold value.

Furthermore, if the decision threshold value when performing diagnosis according to the differential as described above is not also made to be greater than the variation of cell voltage, then it is not possible to perform accurate diagnosis.

As described above, the value of ΔV depends upon the cell voltages of the battery cells BC at which balancing is performed. When implementing multiplexer connection diagnosis, it would also be acceptable to calculate ΔV on the basis of the cell voltages that are acquired in a step S11 that will be described hereinafter, and to set the threshold value using this ΔV that has been thus calculated. For example, a value of 80% of the ΔV that has been calculated may be set as the threshold value. Furthermore, it would also be acceptable to calculate ΔV using the average cell voltage, and to set the threshold value using this ΔV. If ΔV is greater than or equal to the threshold value, then it is decided that the selection by the multiplexer 120 has proceeded normally.

Figure 10B:
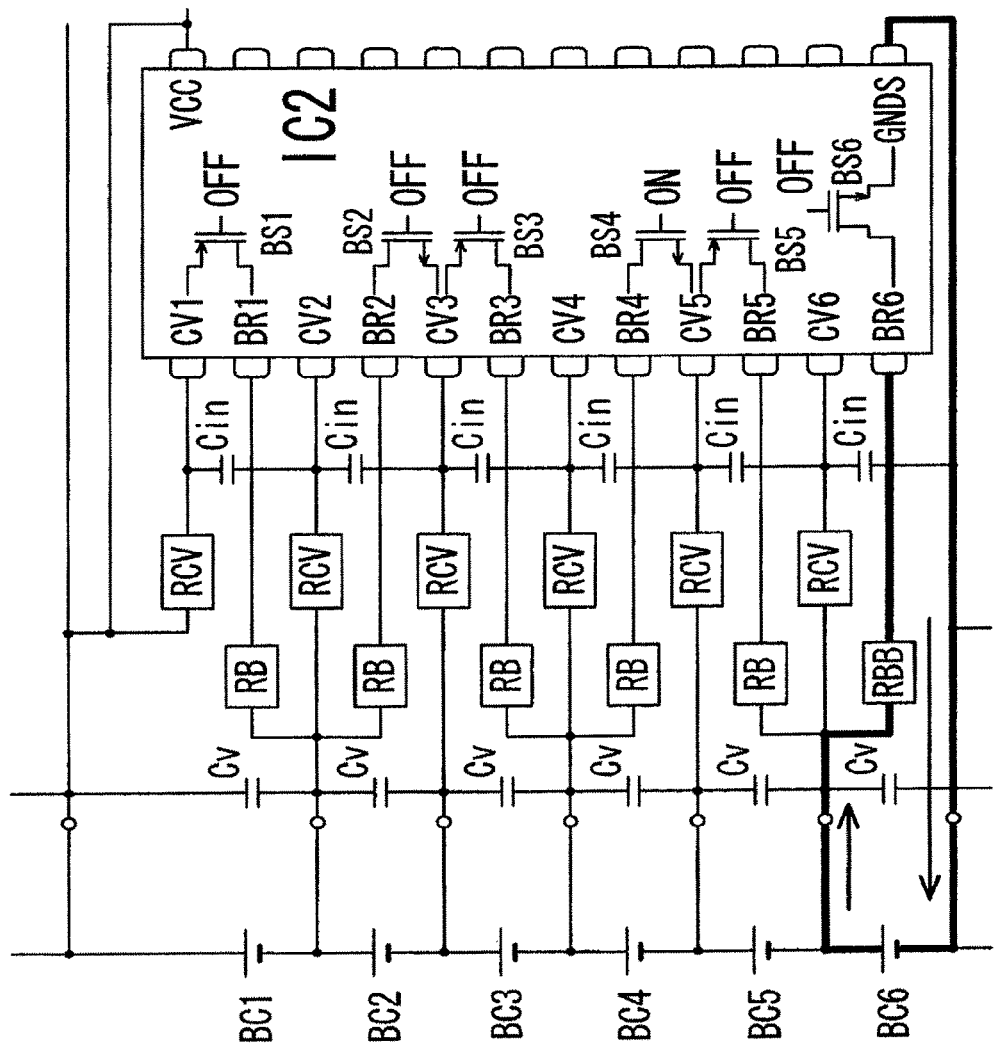
FIG. 10B is a figure for explanation of connection diagnosis, and particularly explains connection diagnosis related to a battery cell BC6.

FIG. 10B shows the case in which the balancing switch BS6 is turned ON with the mask function OFF. In this case, since no resistor RCV is present in the path of the discharge current, accordingly the voltages between the terminals are the same as when the mask function is ON. Due to this, for this diagnosis result only, it is not possible to diagnose whether or not the terminal selection by the multiplexer 210 in relation to the battery cell BC6 is correct; but it becomes possible to perform diagnosis in this case as well by referring to the cell voltage for the battery cell BC6 when the other balancing switches BS1 through BS5 were turned ON, as shown in FIGS. 7A, 8A, 9A, 9B, and 10A.

The reason why is that if, during the cell voltage measurement command for the battery cell BC6, the situation arises that some other terminal or terminals are selected, then it is considered that the same type of mistaken selection would have occurred as well during the diagnoses of FIGS. 7A, 8A, 9A, 9B, and 10A. Due to this, during the diagnosis of one of FIGS. 7A, 8A, 9A, 9B, and 10A, some value other than Vc6 would have been measured as the cell voltage of the battery cell BC6. Accordingly if, in all the diagnoses of FIGS. 7A, 8A, 9A, 9B, and 10A, the measured cell voltage value for the battery cell BC6 was Vc6, then it is possible to diagnose that the multiplexer 120 did indeed select the battery cell BC6 properly, according to the command that it received.

Figure 11:
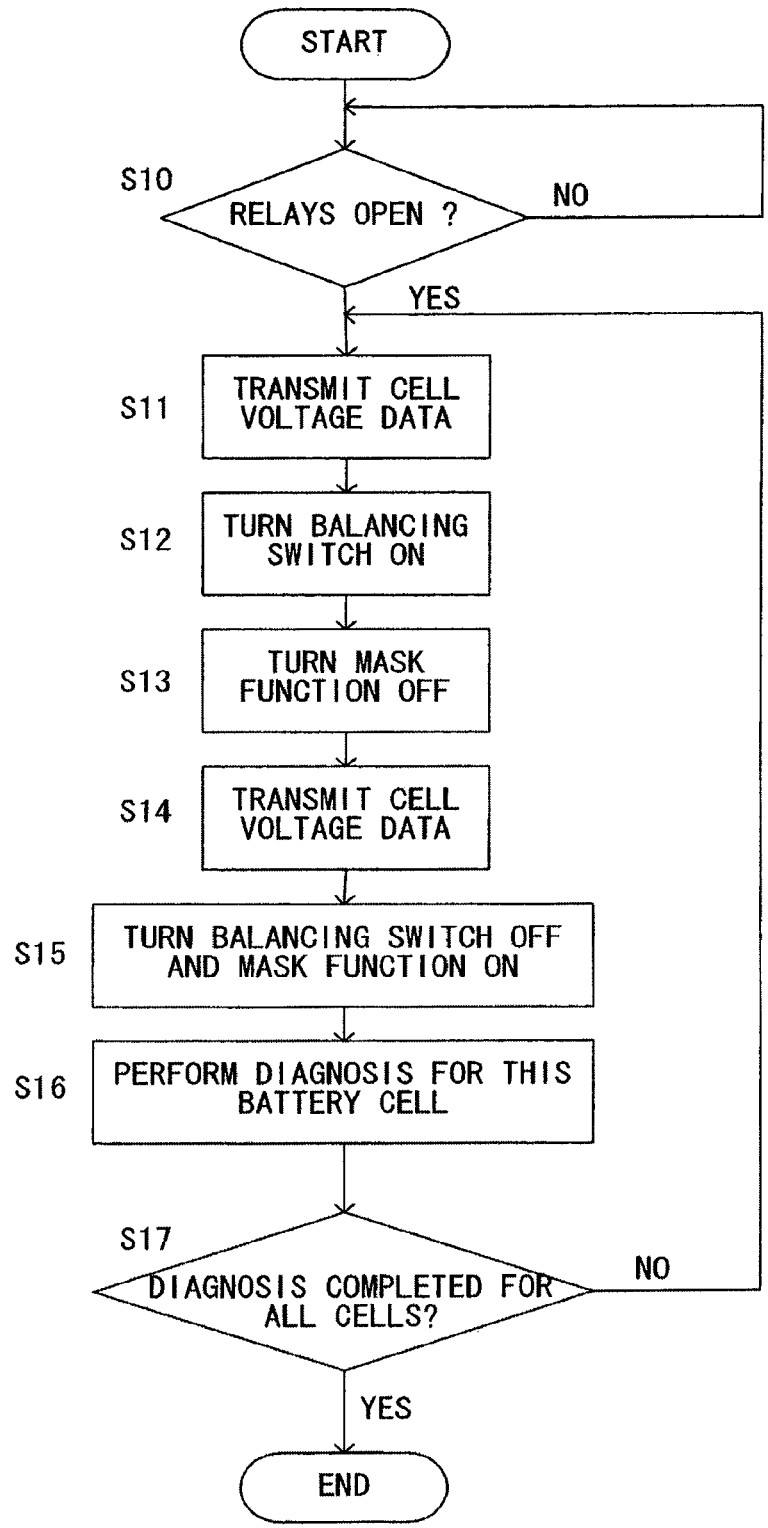
FIG. 11 is a flow chart showing an example of multiplexer connection diagnosis.

FIG. 11 is a flow chart showing an example of the above multiplexer connection diagnosis. The processing for this multiplexer connection diagnosis is performed when the vehicle is stopped, in other words during shutdown processing by the microcomputer 30 when the key switch is turned OFF. In a first step S10, the microcomputer 30 acquires via the CAN information related to the relay state of the battery disconnector unit BDU (refer to FIG. 1), and makes a decision as to whether or not the relays RL and RLp are open. And if it is decided that the relays RL and RLp are in the open state, then the flow of control is transferred to a step S11.

In this step S11, the microcomputer 30 commands IC1 to transmit the cell voltage data of each battery cell. As a result, IC1 transmits the cell voltage of each battery cell that is stored in the data retention circuit 125 (refer to FIG. 3) from its transmission terminal LIN2. It should be understood that, since as shown in FIG. 7B the mask function is ON in the initial state, accordingly here the cell voltages are measured while the mask function is ON, and these voltages are transmitted to the microcomputer 30.

Next the microcomputer 30 transmits to IC1 a command to turn the balancing switch BS1 ON in a step S12, and a command to turn the mask function OFF in a step S13. Upon receipt of these commands, IC1 turns the balancing switch BS1 to ON and then turns the mask function OFF. During this process, IC1 continues to repeat the measurement of cell voltage and internal diagnosis at a predetermined period T1, as shown in FIG. 7B.

And, after having issued the mask function OFF command in the step S13, when a predetermined time period has elapsed, in a step S14 the microcomputer 30 transmits to IC1 a command to transmit the cell voltage data for the battery cells BC1 through BC6. Here, the predetermined time period is set to be greater than or equal to the time from when IC1 turns the mask function to OFF in which at least one measurement cycle for the cell voltages can be completed; for example this period may be set to twice the length of the measurement cycle T1 internal to the IC. Then in a step S15, along with the mask function of IC1 being turned to ON, the balancing switch BS1 is turned to OFF.

Then in a step S16, by comparing the difference between the cell voltage of the battery cell BC1 of IC1 with the mask function ON and the cell voltage of the battery cell BC1 with the mask function OFF against a predetermined threshold value, a diagnosis is made as to whether or not the cell battery BC1 is actually being selected by the multiplexer 120, as commanded. And in the next step S17 a decision is made as to whether or not this multiplexer connection diagnosis has been completed for all of the battery cells. Since, in the example shown in FIG. 1, the communication circuit 602 related to transmission of the cell voltage data and so on are independent for IC1 through IC3 and for IC4 through IC6, it is possible for transmission of cell voltage data to the microcomputer 30 to be performed in parallel. If this type of parallel processing is performed, then, in the step S17, a decision is made as to whether or not diagnosis related to all 16 of the battery cells has been completed.

When multiplexer connection diagnosis related to the terminal selection of CV1 and CV2 of IC1 has been completed as described above, then the flow of control returns to the step S11 and the next balancing switch BS2 is turned ON. And the processing of the steps S11 through S16 is performed with the voltage between the terminals CV2 and CV3 selected, and then again with the voltage between the terminals CV3 and CV4 selected, so that thereby multiplexer connection diagnosis is performed in relation to the selection of the battery cells BC2 and BC3. This type of processing is performed in relation to each of the 16 battery cells connected to IC1 through IC3 in order, and, when the multiplexer connection diagnosis in relation to the battery cell BC6 of IC3 has been completed, a YES decision is reached in the step S17, and then this multiplexer connection diagnosis processing terminates.

As described above, in this embodiment, by measuring the cell voltage in the state with the balancing switch set to ON and with the mask function set to OFF, and by detecting the difference ($\Delta V$) against the cell voltage measured with the mask function ON, it is possible to diagnose whether or not cell selection was actually properly performed by the multiplexer 120 according to the command that it received. And, if $\Delta V$ is greater than or equal to the predetermined threshold value, then it is diagnosed that the selection operation by the multiplexer 120 functioned normally, whereas if $\Delta V$ is less than the predetermined threshold value, then it is diagnosed that an anomaly occurred with the selection operation.

Since the diagnosis for detection of the voltage change ($\Delta V$) of the measured cell voltage that is performed in this manner becomes difficult when noise (such as inverter noise or the like) is superimposed upon the cell voltage, and when the amplitude of this noise is equal to or greater than the anticipated voltage change ($\Delta V$), accordingly this can become a cause of erroneous diagnosis. Due to this, in the embodiment described above, it is arranged to perform the multiplexer connection diagnosis described above during shutdown processing when the key switch of the vehicle has been turned to OFF and the BDU of FIG. 1 has gone to open. Furthermore, it would also be acceptable to arrange for the multiplexer connection diagnosis described above to be performed when the vehicle is being started (i.e. when the key switch has been turned to ON), again with the BDU in the open state.

It should be understood that it would also be acceptable to perform the multiplexer connection diagnosis described above while the vehicle is operating, if it is possible to ensure that the level of noise is sufficiently low, and if it is possible to guarantee that the change of cell voltage due to charge/discharge current is lower than $\Delta V$ by a sufficient level. For example, this diagnosis may be performed while the vehicle is idling (i.e. when the current is zero). Furthermore, by measuring at a speed that is higher than that of the superimposed noise, it is possible to reduce the influence of that noise.

Figure 12:
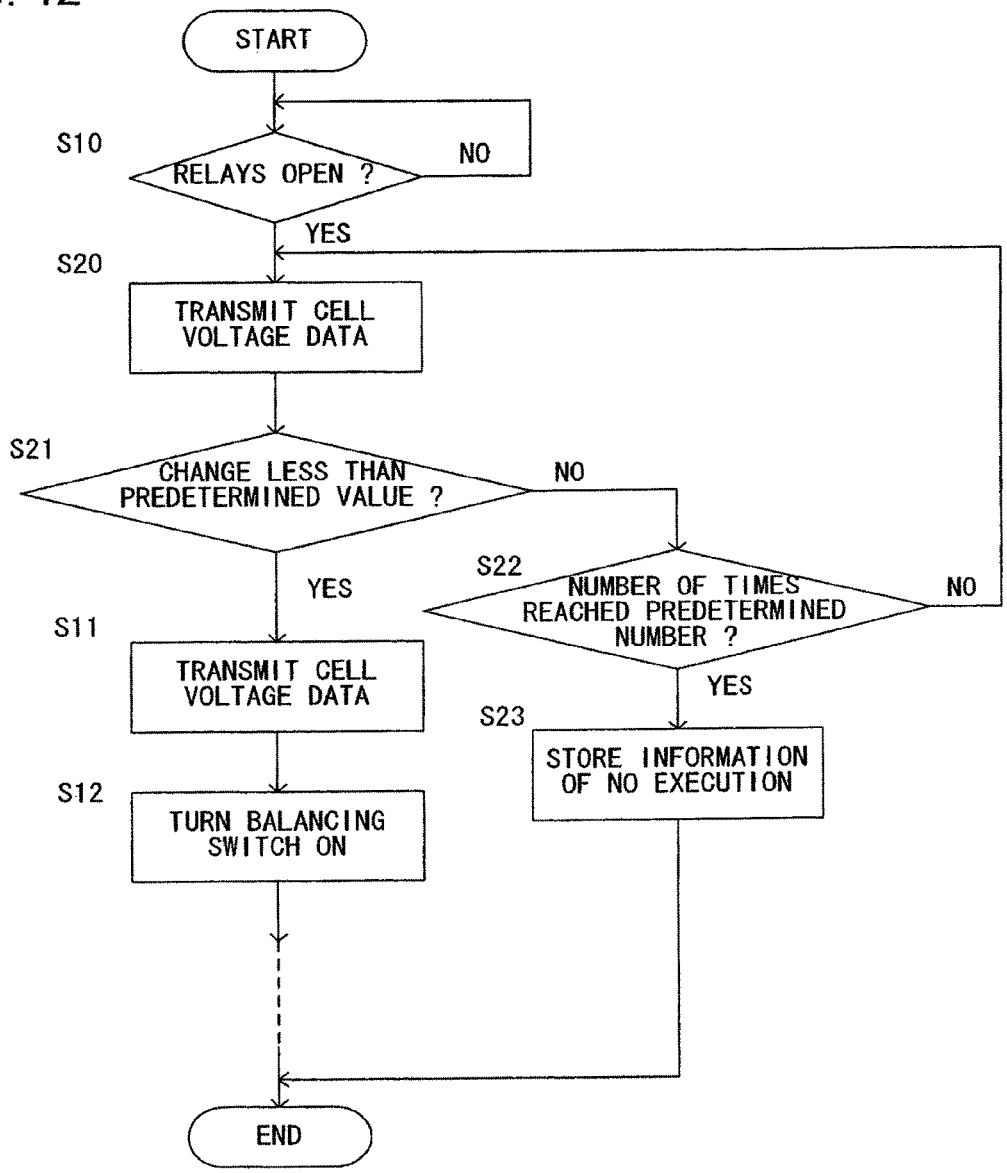
FIG. 12 is a flow chart showing another example of multiplexer connection diagnosis.

Now sometimes it happens that, even in the state during shutdown after the relays have gone to open, polarization of the battery cells due to the influence of the current that was flowing directly before has not disappeared, so that the cell voltage is not stable. In this type of case, it is desirable to delay the start of the diagnosis processing until the cell voltage has become stabilized, and only to start the diagnosis then. An example of this type of processing is shown in FIG. 12. In the flow chart shown in FIG. 12, the flow chart shown in FIG. 11 is supplemented by the addition of the processing of steps S20 through S23.

When in the step S10 it is decided that the relays are open, the flow of control proceeds to a step S20, in which a command that requests the cell voltage of the battery cell BC1 of IC1 is transmitted. Thus the cell voltage Vc1 of the battery cell BC1 is transmitted from IC1 to the microcomputer 30. It should be understood that while, here, it is shown that the cell voltage of the battery cell BC1 of IC1 is requested, it could be the cell voltage of any of the cells. Next in a step S21 the cell voltage acquired in the step S20 and the cell voltage that is stored in the memory of the microcomputer 30 are compared together, and if the difference between them is less than or equal to a predetermined value then the flow of control is transferred to a step S11 and the multiplexer connection diagnosis processing described above is performed.

It should be understood that, since no cell voltage is stored in the memory when the step S21 is first executed (this is the cell voltage that was acquired when step S20 was executed the previous time), accordingly, after having stored the cell voltage acquired in the step S20 in the memory, the flow of control proceeds from the step S21 to a step S22. In this step S22, a decision is made as to whether or not the number of times that the processing of the step S21 has been performed has reached a predetermined number of times. And, if in this step S22 it is decided that the predetermined number of times has not yet been reached, then the flow of control returns to the step S20.

Until the number of times that the processing of the step S21 has been performed reaches the predetermined number of times, a NO decision is reached in the step S22, and the processing of the steps S20→S21→S22→S20 is repeated for a predetermined time period. Due to this, the cell voltage is acquired at predetermined time intervals. The above described predetermined value and predetermined time period are set on the basis of the elapsed time from cell voltage acquisition when the mask function is ON to cell voltage acquisition when the mask function is OFF, and the threshold value when detecting $\Delta V$. For example, if the predetermined time period is equal to the elapsed time, then the predetermined value may be set equal to the threshold value; while, if the predetermined time period is equal to the elapsed time/10, then the predetermined value may also be set to 1/10 of the threshold value.

In other words, if in the step S21 it is determined that the change is less than or equal to the predetermined value, then the cell voltage has become stabilized to a degree at which it is possible to detect ΔV, and accordingly the flow of control proceeds to the step S11 and the multiplexer connection diagnosis processing described above is executed.

On the other hand, if the change of the cell voltage is greater than the predetermined value so that diagnosis cannot be performed, then the flow of control proceeds to the step S22, in which the decision is made as to whether or not the number of times that the processing of the step S21 has been performed has reached the predetermined number of times. And, if it is determined in this step S22 that the number of times has been reached, then the flow of control proceeds to a step S23, in which the fact that the multiplexer connection diagnosis has not been performed is stored as data in the EEPROM, since there is a danger of occurring an erroneous diagnosis.

In this manner, if the number of key cycles, in which it has not been possible to perform diagnosis because the polarization has not disappeared, has continued for a certain number of times in succession determined in advance (for example, three times), then the next time (the fourth time), it is arranged to repeat the processing of "the steps S20→S21→S22→S20" shown in FIG. 12 until the polarization has disappeared, and thus to perform multiplexer connection diagnosis only after it has been confirmed that the voltage change has dropped below the predetermined value. Due to this, it is possible to avoid multiplexer connection diagnosis remaining un-implemented over the long term. Furthermore, if during shutdown processing there is some other processing that can be performed before performing the multiplexer connection diagnosis, then it would also be acceptable to perform this processing first, so as to allow a longer time period for the polarization to disappear. It should be understood that if some other fault such as a fault in the IC itself or a breakage of one of the sending lines SL or the like is detected, then the above multiplexer connection diagnosis may be omitted.

It should be understood that while, in the embodiment described above, it is arranged to transmit cell voltage data to the microcomputer 30 for all of the battery cells connected to the IC that is the subject for diagnosis, it would also be acceptable to transmit only the cell voltage of that cell or cells for which diagnosis is required.

The Second Embodiment

In the second embodiment explained below, it is arranged to provide a function of diagnosing whether or not the battery state detection circuit is operating normally, in other words a function of diagnosing whether or not selection by the multiplexer is being performed normally, and also newly to add a function of diagnosing whether or not an excessive charge detection circuit (an excessive charge detection system) that detects excessive charge is operating normally.

Multiplexer Selection Diagnosis

Figure 13:
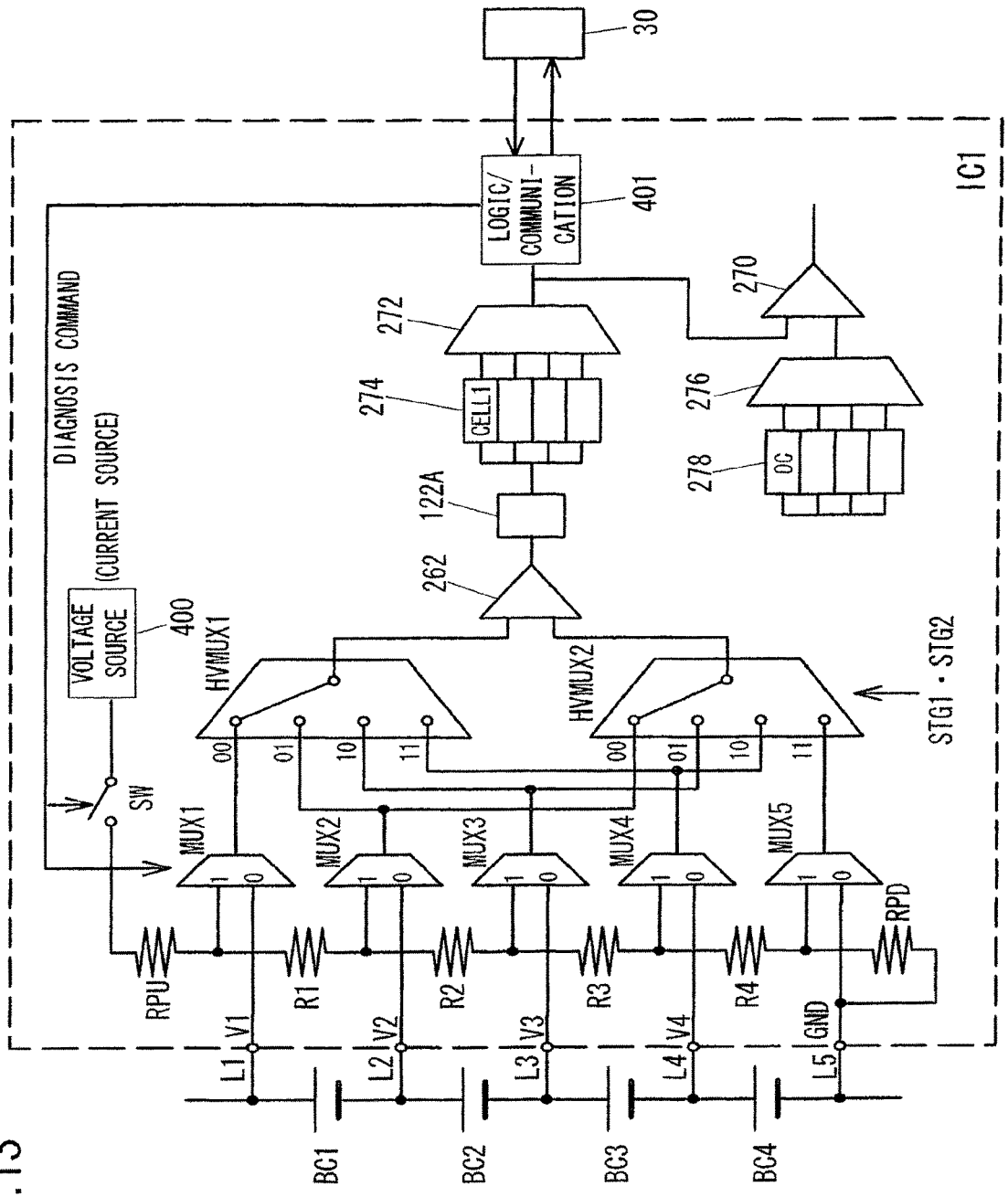
FIG. 13 is a figure for explanation of a second embodiment.

FIG. 13 is a figure for explanation of this second embodiment, and shows blocks internal to the integrated circuits (IC1 through IC6), in a similar way to the case in FIG. 5. To IC1 shown in FIG. 13, in addition to the structure shown in FIG. 5, there are further provided multiplexers MUX1 through MUX5, resistors RPU, R1 through R4, and RPD, and a switch SW. It should be understood that only structures within the structure shown in FIG. 5 that are necessary for explanation of this second embodiment are shown in FIG. 13. Multiplexers HVMUX1 and HVMUX2 are provided to the multiplexer 120, and the outputs of these two multiplexers HVMUX1 and HVMUX2 are inputted to the differential amplifier 262. A voltage source 400 internal to IC1 is one that has been provided in the prior art; for example, a voltage source or the like that supplies the reference voltage of an analog to digital converter 122A may be used. It should be understood that, instead of a voltage source, a current source may be used. Furthermore, in FIG. 13, the communication circuit 127 of FIG. 5 and a logic circuit are combined, and are provided as a logic/communication circuit 401.

The resistors RPU, R1 through R4, and RPD are connected in series, and the free end of the resistor RPD is connected to the terminal GND of IC1, while the free end of the resistor RPU is connected to the switch SW. It should be understood that the terminals V1 through V4 and GND of FIG. 13 correspond to the terminals CV3 through CV6 and GND S of FIG. 2. The resistance values of the resistors R1 through R4 are set so as all to be different from one another; i.e. so that R1≠R2≠R3≠R4. Due to this, when the switch SW is turned to ON, the voltage of the voltage source 400 is divided by the resistors RPU, R1 through R4, and RPD, and the voltages Vr1, Vr2, Vr3, and Vr4 generated by the resistors R1 through R4 are all different from one another. Furthermore, the resistance values of the resistors R1 through R4 are set so that the voltages Vr1, Vr2, Vr3, and Vr4 that are generated become values that are outside the normal range of the cell voltages. In other words, if the normal range of the cell voltages is "VcL≤cell voltage≤VcU", then the resistance values of the resistors R1 through R4 are set so that the voltages Vr1 through Vr4 become either smaller than VcL or larger than VcU.

It should be understood that the resistors RPU and RPD and the multiplexers MUX1 and MUX5 are ones that are provided in order to generate desired voltages, and are not essential to the structure. Whether or not these are provided is determined according to the voltage source (or current source) 400, according to the cell voltages, and according to the input range of the differential amplifier 262.

While here it is supposed that fixed resistors are used as the resistors R1 through R4, it would also be possible, for example, to provide them as variable resistors whose resistance values can be changed from the exterior, so that they have resistance values such that voltages are generated having significant differences from the cell voltages that have been read directly previously. For example, if the normal cell voltage is 3.5 V, then, when the diagnosis mode is started, the resistor R1 may be adjusted so as to yield a cell voltage of 2.5 V, that is outside the normal cell voltage range.

Each of the multiplexers MUX1 through MUX5 has two input terminals designated as 0 and 1, and it is possible to select either one of these input terminals 0 and 1. The input terminal 0 of the multiplexer MUX1 is connected to the positive electrode side of the battery cell BC1 via the input terminal V1 of IC1 and the sensing line L1, while its input terminal 1 is connected between the resistor RPU and the resistor R1. On the other hand, the output side of this multiplexer MUX1 is connected to an input terminal 00 of the multiplexer HVMUX1.

When the multiplexer MUX1 selects its input terminal 0, the potential at the input terminal 00 of the multiplexer HVMUX1 becomes the same potential as that of the positive electrode side of the battery cell BC1; and, conversely, when the multiplexer MUX1 selects its input terminal 1, the potential at the input terminal 00 of the multiplexer HVMUX1 becomes the potential between the resistor RPU and the resistor R1. In other words, by changing over the multiplexer MUX1, it is possible to input an already known voltage that is determined in advance to the input terminal 00 of the multiplexer HVMUX1, instead of the cell voltage.

And the input terminal 0 of the multiplexer MUX2 is connected to the positive electrode side of the battery cell BC2 (i.e. the negative electrode side of the battery cell BC1) via the input terminal V2 of IC1 and the sensing line L2, while its input terminal 1 is connected between the resistor R1 and the resistor R2. On the other hand, the output side of this multiplexer MUX2 is connected to an input terminal 01 of the multiplexer HVMUX1 and also to an input terminal 00 of the multiplexer HVMUX2. In other words, when the multiplexer MUX2 selects its input terminal 0, the potential at the input terminal 01 of the multiplexer HVMUX1 and the potential at the input terminal 00 of the multiplexer HVMUX2 become the same potential as that of the positive electrode side of the battery cell BC2 (i.e. the potential at the negative electrode side of the battery cell BC1); and, conversely, when the multiplexer MUX1 selects its input terminal 1, the potential at the input terminal 00 of the multiplexer HVMUX1 and the potential at the input terminal 00 of the multiplexer HVMUX2 become the potential between the resistor R1 and the resistor R2.

Moreover, the input terminal 0 of the multiplexer MUX3 is connected to the positive electrode side of the battery cell BC3 (and to the negative electrode side of the battery cell BC2) via the input terminal V3 of IC1 and the sensing line L3, while its input terminal 1 is connected between the resistor R2 and the resistor R3. On the other hand, the output side of this multiplexer MUX3 is connected to an input terminal 10 of the multiplexer HVMUX1 and also to an input terminal 01 of the multiplexer HVMUX2. In other words, when the multiplexer MUX3 selects its input terminal 0, the potential at the input terminal 10 of the multiplexer HVMUX1 and the potential at the input terminal 01 of the multiplexer HVMUX2 become the same potential as that of the positive electrode side of the battery cell BC3 (i.e. the potential at the negative electrode side of the battery cell BC2). And, conversely, when the multiplexer MUX3 selects its input terminal 1, the potential at the input terminal 10 of the multiplexer HVMUX1 and the potential at the input terminal 01 of the multiplexer HVMUX2 become the potential between the resistor R2 and the resistor R3.

Furthermore, the input terminal 0 of the multiplexer MUX4 is connected to the positive electrode side of the battery cell BC4 (and to the negative electrode side of the battery cell BC3) via the input terminal V4 of IC1 and the sensing line L4, while its input terminal 1 is connected between the resistor R3 and the resistor R4. On the other hand, the output side of this multiplexer MUX4 is connected to an input terminal 11 of the multiplexer HVMUX1 and also to an input terminal 10 of the multiplexer HVMUX2. In other words, when the multiplexer MUX4 selects its input terminal 0, the potential at the input terminal 10 of the multiplexer HVMUX1 and the potential at the input terminal 01 of the multiplexer HVMUX2 become the same potential as that of the positive electrode side of the battery cell BC4 (i.e. the potential at the negative electrode side of the battery cell BC3). And, conversely, when the multiplexer MUX4 selects its input terminal 1, the potential at the input terminal 11 of the multiplexer HVMUX1 and the potential at the input terminal 10 of the multiplexer HVMUX2 become the potential between the resistor R3 and the resistor R4.

Yet further, the input terminal 0 of the multiplexer MUX5 is connected to the negative electrode side of the battery cell BC4 via the terminal GND of IC1 and the sensing line L4, while its input terminal 1 is connected between the resistor R4 and the resistor RPD. On the other hand, the output side of this multiplexer MUX5 is connected to an input terminal 11 of the multiplexer HVMUX2. In other words, when the multiplexer MUX5 selects its input terminal 0, the potential at the input terminal 10 of the multiplexer HVMUX1 and the potential at the input terminal 01 of the multiplexer HVMUX2 become the same potential as that of the negative electrode side of the battery cell BC4. And, conversely, when the multiplexer MUX5 selects its input terminal 1, the potential at the input terminal 11 of the multiplexer HVMUX2 become the potential between the resistor R4 and the resistor RPD.

With this second embodiment having the structure described above, it is arranged for it to be possible to diagnose whether or not the multiplexers HVMUX1 and HVMUX2 are operating normally by inputting the already known voltages Vr1, Vr2, Vr3, and Vr4 that are generated by the resistors R1 through R4 to the multiplexers HVMUX1 and HVMUX2, instead of the cell voltages.

The Cell Voltage Measurement Mode

Figure 14A:
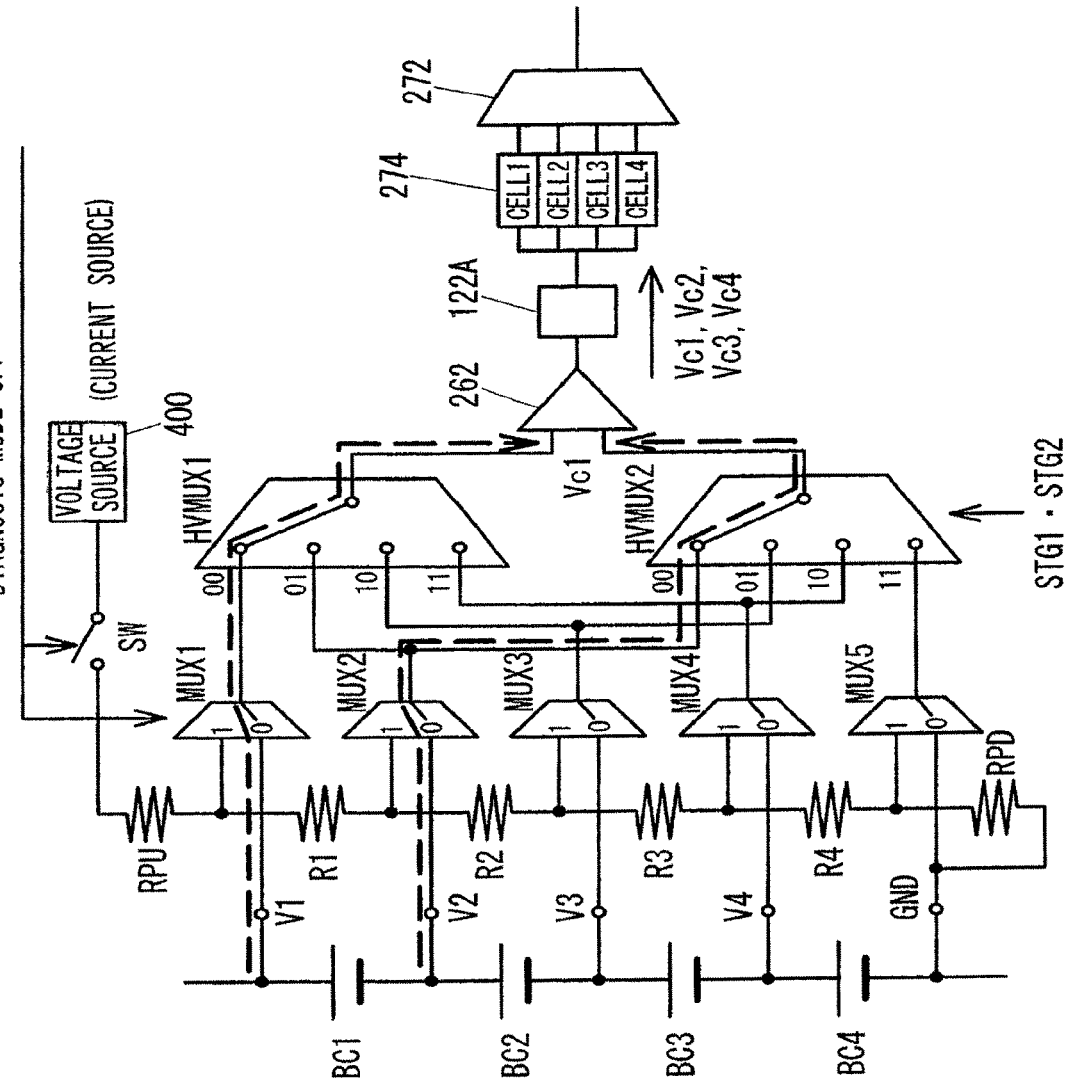
FIG. 14A is a figure for explanation of changeover operation between multiplexers MUX1 and MUX2, and particularly shows a situation of a cell voltage measurement mode.

In the normal mode for cell voltage measurement, the switch SW is in the OFF (opened) state, and each of the multiplexers MUX1 through MUX5 is in its state of selecting its input terminal 0. During the interval in which the cell voltage of the battery cell BC1 is to be measured, the input terminals 00 of the multiplexer HVMUX1 and of the multiplexer HVMUX2 are selected, as shown in FIG. 14A. Due to this, the potential at the positive electrode side of the battery cell BC1 is outputted from the multiplexer HVMUX1, while the potential at the negative electrode side of the battery cell BC1 is outputted from the multiplexer HVMUX2. As a result, the voltage Vc1 of the battery cell BC1 that is the difference between these potentials comes to be inputted to the differential amplifier 262. This cell voltage Vc1 is converted to a digital value by the analog to digital converter 122A, and is stored in the register CELL1 of the current value storage circuit 274.

In a similar manner, during the interval in which the cell voltage of the battery cell BC2 is to be measured, the input terminals 01 of the multiplexer HVMUX1 and of the multiplexer HVMUX2 are selected; during the interval in which the cell voltage of the battery cell BC3 is to be measured, the input terminals 10 of the multiplexer HVMUX1 and of the multiplexer HVMUX2 are selected; and, during the interval in which the cell voltage of the battery cell BC4 is to be measured, the input terminals 11 of the multiplexer HVMUX1 and of the multiplexer HVMUX2 are selected.

FIG. 15A is a figure showing the states of the multiplexers MUX1 through MUX5 and HVMUX1 and HVMUX2 and so on during cell voltage measurement and during diagnosis. During cell voltage measurement, the diagnosis mode is OFF (i.e. diag: 0), and all of the multiplexers MUX1 through MUX5 are selecting their input terminals 0. In this state, the cell voltages Vc2 through Vc4 of the battery cells BC2 through BC4 may be measured in order by changing over the selection state of both of the multiplexers HVMUX1 and HVMUX2 to 00, 01, 10, and 11 respectively. The results of these measurements are stored in the registers CELL1 through CELL4 of the current value storage circuit 274.

This type of cell voltage measurement is repeatedly performed at a predetermined cycle, so that the data in the registers CELL1 through CELL4 is updated at that predetermined cycle. When a cell voltage request command is issued from the microcomputer 30, the newest voltage data stored in the registers CELL1 through CELL4 is outputted via the serial communication circuit 602 at the timing that this command is received.

The Diagnosis Mode

When performing diagnosis of the multiplexers HVMUX1 and HVMUX2, a diagnosis command is transmitted to IC1 from the microcomputer 30 via the serial communication circuit 602. This diagnosis command that has been received by IC1 is transmitted in order to IC2 and IC3, and a similar operation to the operation of IC1 described below is performed by IC2 and IC3. The same holds for IC4 through IC6.

Figure 14B:
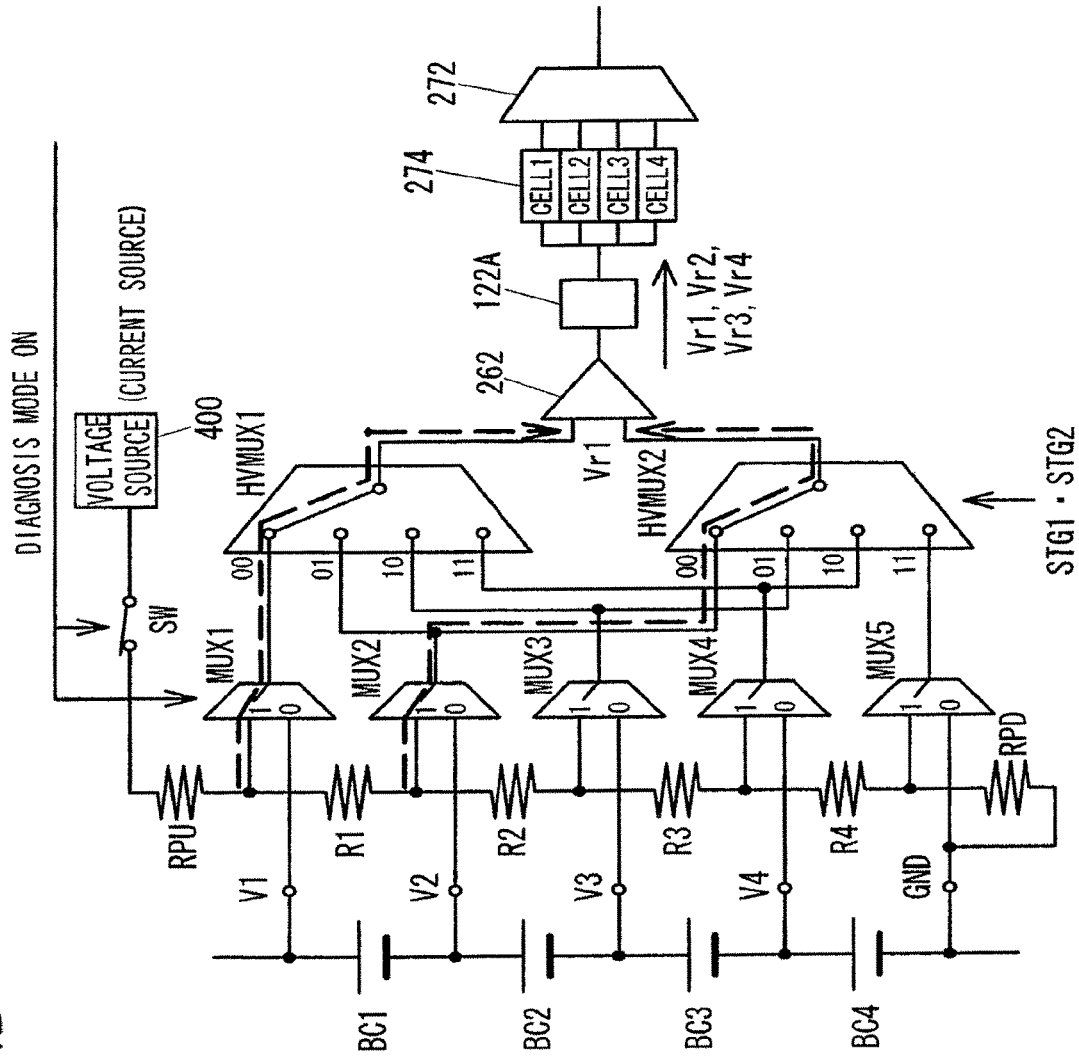
FIG. 14B is a further figure for explanation of changeover operation between the multiplexers MUX1 and MUX2, and particularly shows a situation of a diagnosis mode.

Upon receipt of this diagnosis command, the logic/communication circuit 401 of IC1 outputs a signal to turn the diagnosis mode to ON on the basis of this diagnosis command, in other words a signal to turn the switch SW to ON (closed), and also changeover signals to the multiplexers MUX1 through MUX5 to change over to their terminals 1. As shown in FIG. 14B, the switch SW is turned ON by this changeover signal, and each of the multiplexers MUX1 through MUX5 selects its input terminal 1. On the other hand, in a similar manner to the case of performing normal cell voltage measurement, the multiplexers HVMUX1 and HVMUX2 repeatedly perform changeover operation of their input terminals in order to measure the cell voltages of the battery cells BC1 through BC4 in order, on the basis of signals STG1 and STG2 that are outputted from the decoders 257 and 259, and not in any relationship to the diagnosis command from the microcomputer 30.

As shown in FIG. 15A, during diagnosis, the diagnosis mode is turned ON (diag: 1), and all of the multiplexers MUX1 through MUX5 select their input terminals 1. In this state, the selection states of the two multiplexers HVMUX1 and HVMUX2 change over through 00, 01, 10, and 11 in order. For example, during the interval for measuring the cell voltage of the battery cell BC1, in other words during the interval for measuring the voltage between the input terminals V1 and V2, as shown in FIG. 14B, the multiplexers HVMUX1 and HVMUX2 select their input terminals 00. Due to this, the potential between the resistors RPU and R1 is outputted from the multiplexer HVMUX1, and the potential between the resistors R1 and R2 is outputted from the multiplexer HVMUX2. As a result the difference between these potentials, that is the voltage Vr1, is inputted to the differential amplifier 262. This voltage Vr1 is converted to a digital value by the analog to digital converter 122A, and is stored in the register CELL1 of the current value storage circuit 274, in a similar manner to the case with the cell voltage Vc1.

In a similar manner, during the interval for measuring the cell voltage of the battery cell BC2, the multiplexers HVMUX1 and HVMUX2 select their input terminals 01; during the interval for measuring the cell voltage of the battery cell BC3, the multiplexers HVMUX1 and HVMUX2 select their input terminals 10; and, during the interval for measuring the cell voltage of the battery cell BC4, the multiplexers HVMUX1 and HVMUX2 select their input terminals 11. As a result, the voltages Vr2 through Vr4 that are divided by the resistors R2 through R4 are measured, and are stored in the registers CELL2 through CELL4 of the current value storage circuit 274.

As described above, since the measurement of the voltages Vc1 through Vc4 according to the signals STG1 and STG2 is repeated at a predetermined cycle, accordingly, in the diagnosis mode, the voltages Vr1 through Vr4 come to be measured at that predetermined cycle. After the microcomputer 30 has waited for a time period that is longer than the above described predetermined time period elapsed from the transmission of the diagnosis command by the time period required to store the voltages Vr1 through Vr4 in the registers CELL1 through CELL4, then it transmits to IC1 a command that request return of the diagnosis data stored in these registers CELL1 through CELL4.

On the side of the microcomputer 30, Vr1 through Vr4 are stored in advance as anticipated values for the diagnosis, and, if the measured values of Vr1 through Vr4 that are returned from IC1 agree with these anticipated values, then it is diagnosed that the multiplexer HVMUX1 and the multiplexer HVMUX2 are operating normally. On the other hand, if the measured values that are returned are different from the anticipated values, then it may be diagnosed that there is an anomaly with at least one of the multiplexer HVMUX1 and the multiplexer HVMUX2.

It should be understood that while, in the example described above, as shown in FIG. 15A, all of the input terminals 1 of the multiplexers MUX1 through MUX5 were changed over during the diagnosis, it is not necessary to adopt this method. For example it would also be acceptable, in order to diagnose whether or not during measurement of the cell voltage Vc1 the multiplexers HVMUX1 and HVMUX2 were correctly selecting their input terminals 00, to arrange for a command to be transmitted from the microcomputer 30 for only the multiplexers MUX1 and MUX2 to change over to their input terminals 1. In a similar manner, when diagnosing the selection state of the input terminals 01, a command may be transmitted for only the multiplexers MUX2 and MUX3 to change over to their input terminals 1; when diagnosing the selection state of the input terminals 10, a command may be transmitted for only the multiplexers MUX3 and MUX4 to change over to their input terminals 1; and, when diagnosing the selection state of the input terminals 11, a command may be transmitted for only the multiplexers MUX4 and MUX5 to change over to their input terminals 1. In this case, a command that requests return of the voltage data also comes to be transmitted each time.

Furthermore, instead of performing changing over of the multiplexers HVMUX1 and HVMUX2 with the signals STG1 and STG2, it would also be acceptable to change them over by a command from the microcomputer 30. FIG. 15B is a figure showing, in this type of case, the state of the multiplexers MUX1 through MUX5 and HVMUX1 and HVMUX2 and so on during cell voltage measurement and during diagnosis. In this case, since the selection states of the multiplexers HVMUX1 and HVMUX2 are set according to commands from the microcomputer 30, accordingly when, for example, diagnosing the selection state of the input terminals 00, provided that the selection states of the multiplexers MUX1 and MUX2 is 1, the selection states of the other multiplexers MUX3 through MUX5 may be either 1 or 0.

Now, since the voltages Vr1 through Vr4 that have been voltage divided by the resistors R1 through R4 are set so as to have values outside the normal range of the cell voltages, accordingly it is also possible to decide from the voltage values that are returned whether or not the multiplexers MUX1 through MUX5 are operating normally. For example, if in FIG. 14B the multiplexers MUX1 and MUX2 do not change over, then not the voltage Vr1 but rather the cell voltage Vc1 comes to be returned, and accordingly it is possible to diagnose from this voltage value that the selection state of the multiplexer MUX1 or the selection state of the multiplexer MUX2 is not correct.

Diagnosis of the Excessive Charge Detection Circuit

Furthermore, if at least one of the voltages Vr1 through Vr4 is set to a voltage value that is larger than the normal range of cell voltage, and that moreover corresponds to excessive charge, then it also becomes possible to diagnose whether or not the excessive charge detection circuit is operating normally. For example, the resistor R1 may be set so that the voltage Vr1 becomes a value that is a little larger than the above described excessive charge threshold value OC. The voltage Vr1 that has been A/D converted is stored in the register CELL1 of the current value storage circuit 274. This stored voltage Vr1 is read out by the digital multiplexer 272 and is sent to the digital comparator 270, that compares it with the excessive charge threshold value OC that has been read out from the reference value storage circuit 278. And, since the voltage Vr1 is set to a value that is larger than the excessive charge threshold value OC, accordingly, as explained with reference to FIG. 5, the flag [MFflag] that denotes an anomaly and the flag [OCflag] that denotes excessive charge are set in the flag storage circuit 284, and an anomaly signal is transmitted via the one-bit communication circuit 604.

Now a case will be considered in which the registered value of the excessive charge threshold value OC in the reference value storage circuit 278 has changed undesirably due to an abnormality in the IC; for example, suppose that the proper excessive charge threshold value OC is 4 V, and that this has undesirably changed to 5 V. If the excessive charge threshold value OC is at its proper value of 4 V, then the measured voltage Vr1 is detected as excessive charge, and, along with the above described flags being set, an anomaly signal is transmitted. However, if the excessive charge threshold value OC has undesirably changed to 5 V, then, even if a voltage Vr1 that is slightly larger than 4 V is measured as the cell voltage, it will be decided that this Vr1 is less than 5 V, and excessive charge will not be detected and the flags described above will not be set. In other words, no anomaly signal will be transmitted.

However, since the microcomputer 30 sends to the multiplexer HVMUX1 a command for input of the voltage Vr1 instead of the cell voltage Vc1, accordingly, along with the voltage Vr1 being returned as the cell voltage of the battery cell BC1 of IC1 via the communication circuit 602, also it may be anticipated that an anomaly signal will be returned via the one-bit communication circuit 604. Accordingly, if the microcomputer 30 receives both the voltage Vr1 and also an anomaly signal, then it may be diagnosed that the excessive charge detection circuit of IC1 is operating normally. On the other hand if, as described above, due to an abnormality of the excessive charge threshold value OC register, an anomaly signal is not received although the voltage Vr1 is received, then it may be diagnosed that an anomaly has occurred in the excessive charge detection circuit, since the values anticipated by the microcomputer do not agree. Here, normal operation of the excessive charge detection circuit means that, with the excessive charge threshold value OC being normal, and moreover with the digital comparator 270 making its decision correctly, the one-bit register in which the flag [OCflag] is set has also not failed.

A Variant Embodiment

In the second embodiment described above, it was supposed that the multiplexer HVMUX1 and the multiplexer HVMUX2 always changed over in a synchronized manner, and that their selection states were changed over so as always to be the same. However, in a variant embodiment, it is arranged to be able to perform diagnosis as to whether or not the selections are carried out correctly, even though the multiplexer HVMUX1 and the multiplexer HVMUX2 are used in such a manner that the different input terminals are selected in these multiplexers.

Figure 16:
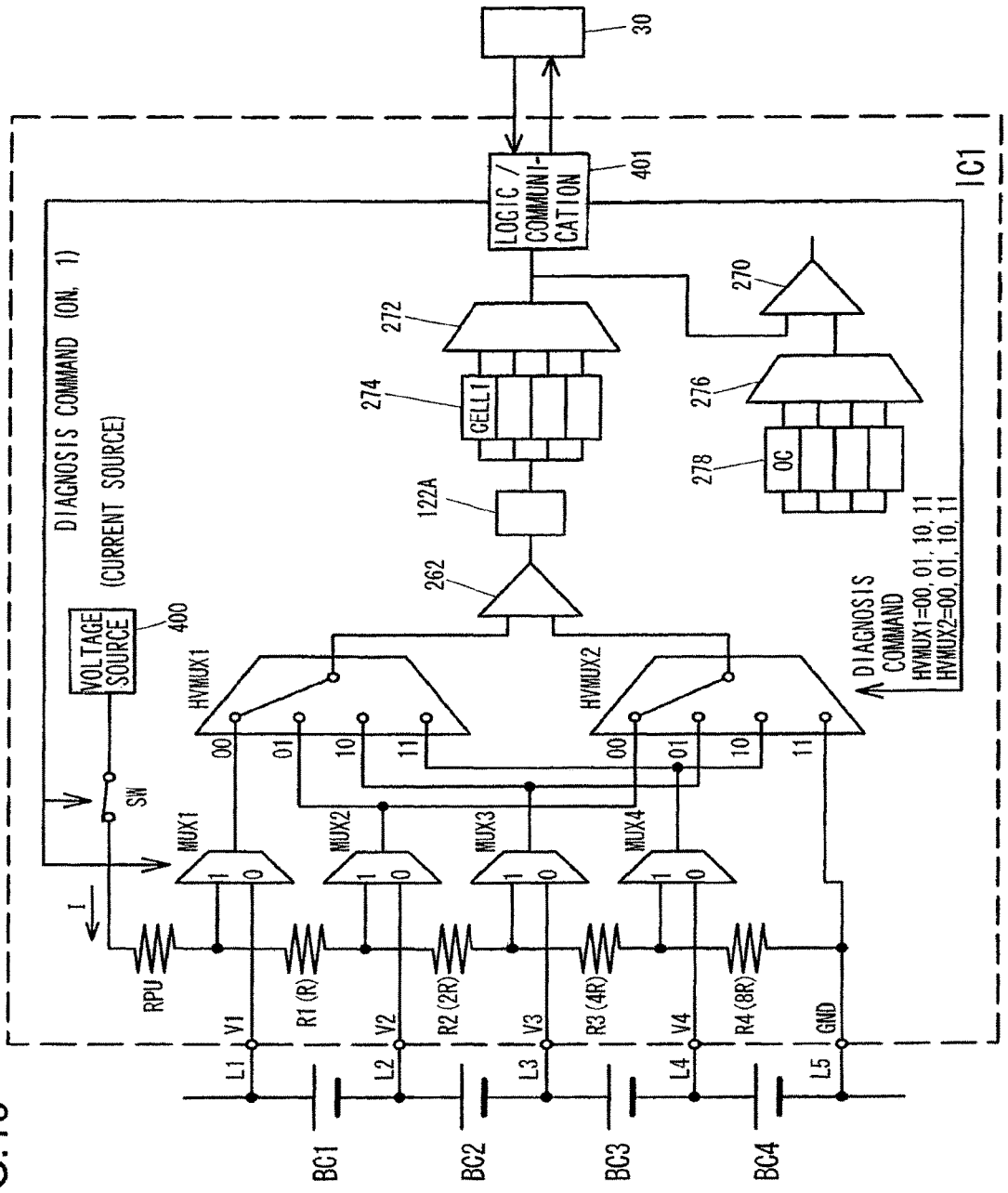
FIG. 16 is a figure for explanation of a variant of the second embodiment, and shows internal blocks of an integrated circuit IC1.

FIG. 16 is a figure for explanation of this variant embodiment, and is a figure showing blocks internal to IC1, in a similar manner to FIG. 13. In the second embodiment described above, if it is supposed that the multiplexer HVMUX1 selects its input terminal 00 while the multiplexer HVMUX2 selects its input terminal 01, then the voltage that is measured is the voltage divided by the resistors R1+R2. However, if the resistance value setting has been performed so that R1+R2=R3, then, if the multiplexer HVMUX1 selects its input terminal 01 while the multiplexer HVMUX2 selects its input terminal 10, the voltage that is measured becomes the same, so that it is not possible to distinguish these selection states.

Thus in this variant embodiment, by setting the resistance values of the resistors R1 through R4 so that R1=R, R2=2 R, R3=4 R, and R4=8 R, it is arranged that, even if the selection states by the multiplexer HVMUX1 and the multiplexer HVMUX2 of their input terminals are different, still it is possible to perform diagnosis of the selection states. This combination of resistance values is only one example; any combination of resistance values will be acceptable, provided that the measured voltage is different for each combination of input terminals. The changing over of the multiplexers HVMUX1 and HVMUX2 is not performed according to the signals STG1 and STG2 of the decoders 257 and 259, but rather by diagnosis commands on the basis of a command from the microcomputer 30. It should be understood that, in the example shown in FIG. 16, the resistor RPD and the multiplexer MUX5 of FIG. 13 are omitted.

FIG. 17 is a figure showing a relationship between the combinations of input terminals of the multiplexers HVMUX1 and HVMUX2 that are selected, and the voltage values that are measured at that time. From FIG. 17, it will be understood that, except for combinations in which the voltage value=0, whichever combination is selected, the voltage values are all different from one another. In other words, when the microcomputer 30 selects two of the input terminals of the multiplexers HVMUX1 and HVMUX2 by transmitting, as a diagnosis command related to selection by the multiplexers HVMUX1 and HVMUX2, a selection command for a combination for which the voltage value is not equal to 0, then it is possible to diagnose from the voltage value that is measured whether or not that combination has been correctly selected, for any combination that may have been selected.

Diagnosis of the Excessive Charge Detection Circuit

If this type of diagnosis is possible, then, in addition to diagnosing from the measurements of cell voltage whether or not the multiplexers HVMUX1 and HVMUX2 are operating normally, it is also possible to diagnose whether or not the excessive charge detection circuit is operating normally. For example if, while the field (00,11) of FIG. 17 is 15 RI, the resistance value R is set so that a voltage value of 15 RI corresponds to excessive charge, then it is possible to diagnose whether or not the excessive charge detection circuit is operating normally by transmitting from the microcomputer 30 commands for the multiplexer HVMUX1 to select its input terminal 00 and for the multiplexer HVMUX2 to select its input terminal 11

If the excessive charge detection circuit is operating normally, then the flags [MFflag] and [OCflag] are set in the flag storage circuit 284, and an anomaly signal is transmitted to the microcomputer 30 via the one-bit communication circuit 604. If the microcomputer 30 has received an anomaly signal while the voltage value returned from IC1 is 15 RI, in other words if it agrees with the anticipated value, then it is possible to diagnose that the excessive charge detection circuit is operating normally. On the other hand, if no anomaly signal has been received even though a voltage value of 15 RI has been received, then it is possible to diagnose that the excessive charge detection function is not operating normally.

The Third Embodiment

Figure 18:
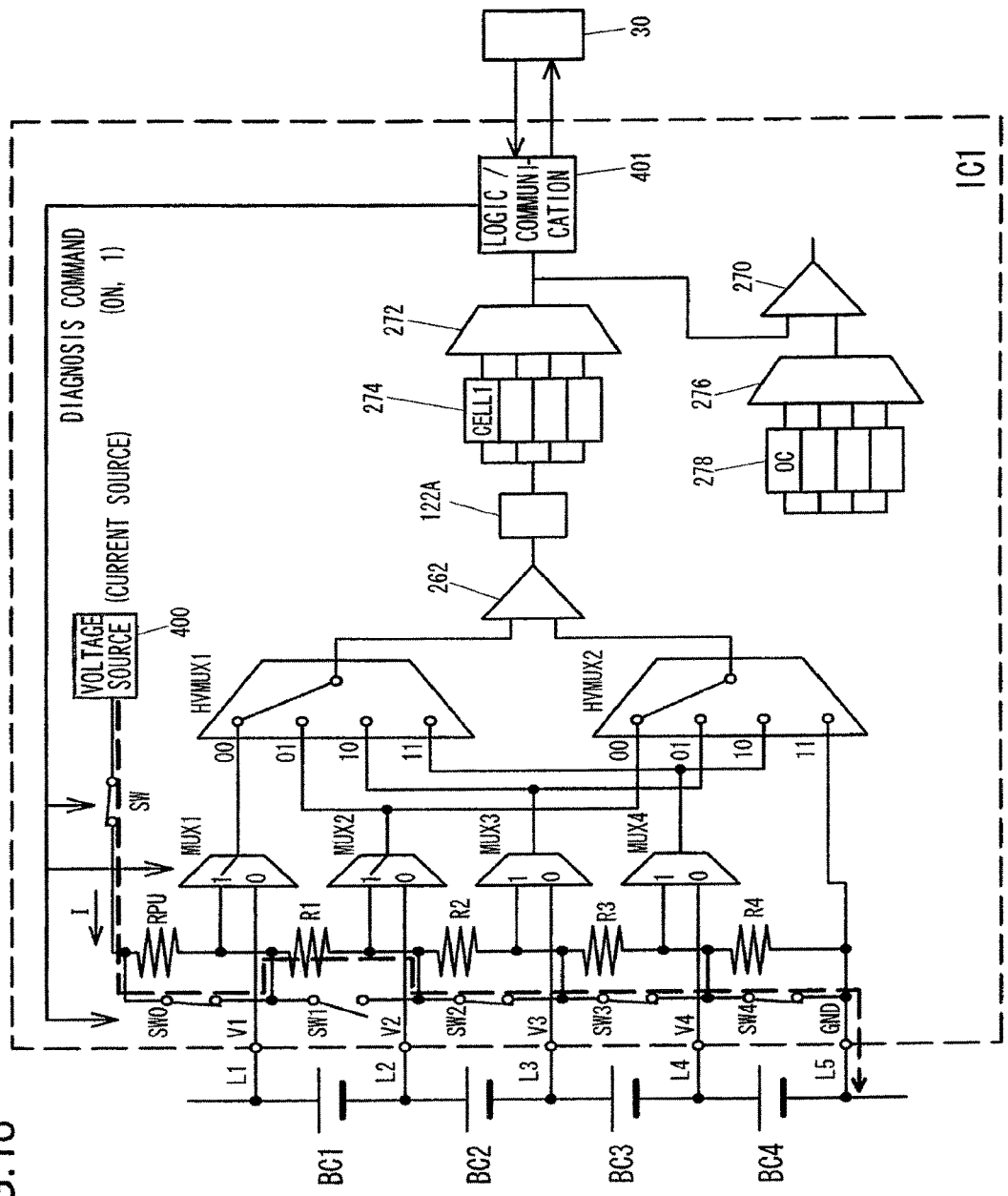
FIG. 18 is a figure for explanation of a third embodiment.

FIG. 18 is a figure for explanation of a third embodiment, and is a block diagram similar to FIG. 13. In the structure shown in FIG. 18, bypass switches SW0 through SW4 are added to the structure of the second embodiment shown in FIG. 13. By doing this, along with performing diagnosis of the multiplexers HVMUX1 and HVMUX2 in a similar manner to the second embodiment, it is also possible to perform separate diagnosis of the excessive charge detection circuit. Moreover, in this embodiment, it is possible for the multiplexers HVMUX1 and HVMUX2 to be changed over so as to select the same input terminals. In this case, they could be changed over with the signals STG1 and STG2, or it would also be acceptable for them to be changed over by command from the microcomputer 30. In the example shown in FIG. 18, the resistor RPD and the multiplexer MUX5 of FIG. 13 are omitted.

When performing diagnosis of the multiplexers HVMUX1 and HVMUX2, all of the bypass switches SW0 through SW4 are turned to OFF (open). Since when this is done the structure is similar to that of the second embodiment, accordingly it is possible to perform diagnosis of the multiplexers HVMUX1 and HVMUX2 by executing similar diagnosis operation to that explained above.

On the other hand, it is possible to generate voltages of various types by controlling the bypass switches SW0 through SW4 to ON and OFF. For example when, as shown in FIG. 18, the bypass switch SW1 is turned OFF while the other bypass switches SW0 and SW2 through SW4 are turned ON, then the voltage due to the resistor R1 becomes greater, and it is possible to generate an excessive voltage that corresponds to excessive charge. And, when the input terminals of the multiplexers MUX1 and MUX2 are set to 1, and the multiplexers HVMUX1 and HVMUX2 are set to their states for performing measurement of the cell voltage of the battery cell BC1, then it is possible to perform diagnosis of the excessive charge detection circuit.

Figure 26:
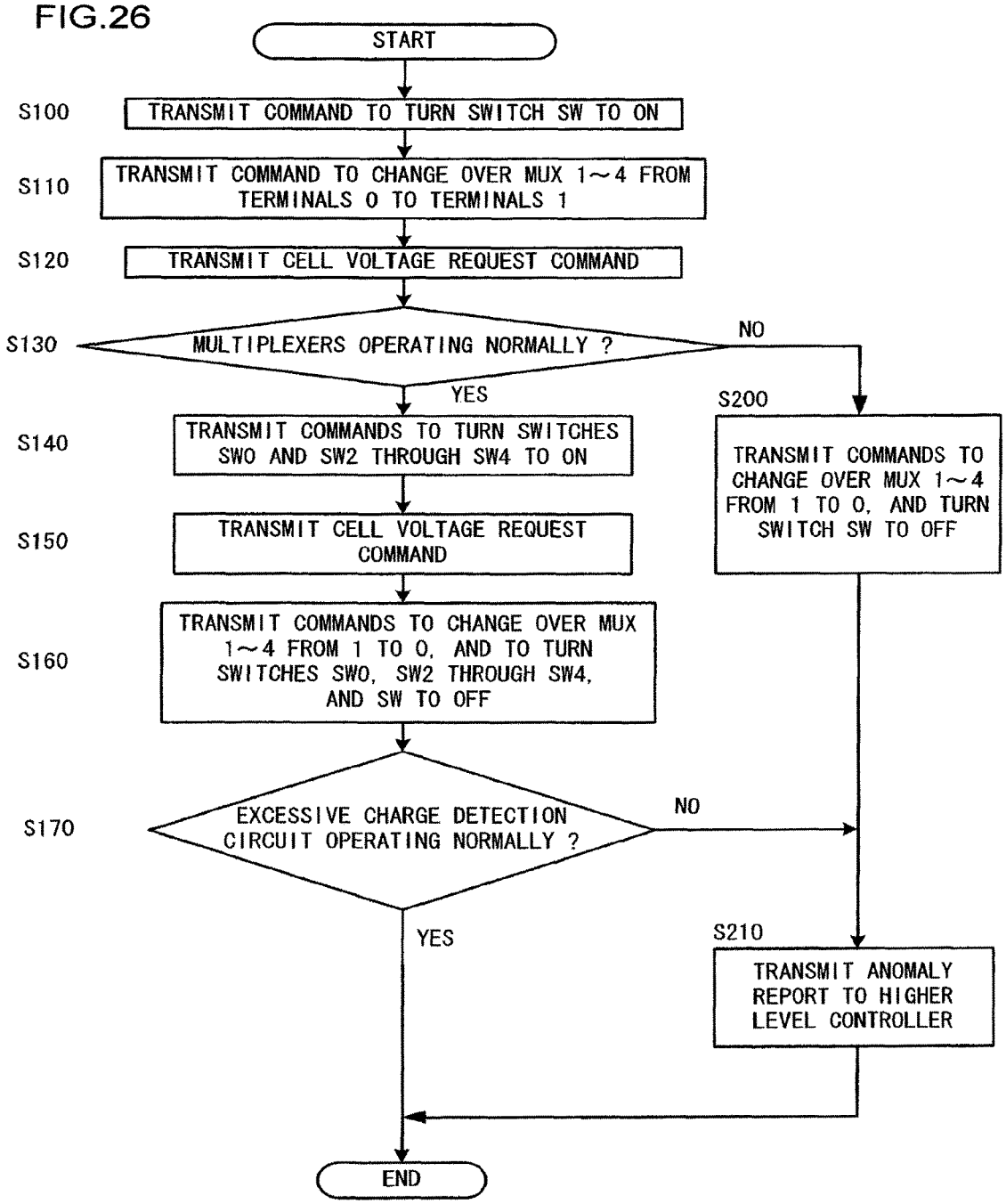
FIG. 26 is a flow chart showing steps of diagnosis.

FIG. 26 is a flow chart showing diagnosis processing steps that are executed by the microcomputer 30. This diagnosis processing is executed at the timing that the vehicle key switch is turned ON or OFF. When this processing starts upon the vehicle key switch being turned ON or OFF, in a first step S100 a command is transmitted to the IC to turn the switch SW to ON (closed). With regard to the switches SW0 through SW4, they are all left at OFF, in a similar manner to the case in the cell voltage measurement mode. And in a step S110 the microcomputer 30 transmits a command to the IC to change over the selection states of the multiplexers MUX1 through MUX4 from their input terminals 0 to their input terminals 1.

The operation of measuring the cell voltages of the battery cells BC1 through BC4 is performed repeatedly by the IC at a predetermined cycle by changing over the input terminals of the multiplexers HVMUX1 and HVMUX2 in order from 00. When, due to this, a longer time period than the predetermined cycle period has elapsed from changing over of the multiplexers MUX1 through MUX4 to their input terminals 1, then the voltage values Vr1 through Vr4 that have been acquired by the cell voltage measurement operation are stored in the registers CELL1 through CELL4 as cell voltage data.

In the next step S120, the microcomputer 30 transmits to the IC a command that requests transmission of the cell voltage data stored in the registers CELL1 through CELL4. Upon receipt of this command, the IC returns the cell voltage data stored in the registers CELL1 through CELL4 at the time point of reception to the microcomputer 30 via the serial communication circuit 602.

And, in the next step S130, the microcomputer 30 makes a decision as to whether or not the multiplexers HVMUX1 and HVMUX2 are operating normally. In other words, it makes a decision as to whether or not the cell voltage data that has been received and the values that are anticipated on the side of the microcomputer 30 agree with one another. In the microcomputer 30, the voltage values Vr1, Vr2, Vr3, and Vr4 that are divided voltages on the resistors R1 through R4 respectively are stored as anticipated values, and these anticipated values Vr1, Vr2, Vr3, and Vr4 and the cell voltage data in the registers CELL1 through CELL4 that were received are compared together, and, if they all agree with one another, then it is diagnosed that the multiplexers HVMUX1 and HVMUX2 are operating normally. But if there is even one pair of cell voltage data that do not agree with one another, then an anomaly is diagnosed.

If in the step S130 normal operation has been diagnosed, then the flow of control proceeds to a step S140, while if an anomaly has been diagnosed then the flow of control is transferred to a step S200. If the flow of control has reached the step S200, then, along with turning the switch SW to OFF, a command is transmitted to the IC to change over the multiplexers MUX1 through MUX4 to their input terminals 0. According to this command, the IC performs the operation of turning the switch SW to OFF and the operation of changing over the multiplexers, and thereby returns the IC to the cell voltage measurement state. Then in a step S210 the microcomputer 30 transmits an anomaly report to a higher level controller that notifies it of the fact that an anomaly has occurred in the IC, and then this series of diagnosis processing steps terminates. It should be understood that, even if an anomaly with the multiplexer diagnosis has been diagnosed, the diagnosis processing does not terminate there; rather, next, it may be arranged to perform the diagnosis of the excessive charge detection circuit.

On the other hand, if the flow of control has proceeded from the step S130 to the step S140, next, in order to perform diagnosis of the excessive charge detection circuit, only the switch SW1 is left in the OFF state, but the other switches SW0 and SW2 through SW4 are changed over to their ON states. It should be understood that the states of the switch SW and of the multiplexers MUX1 through MUX4 are kept just as they were for the state of multiplexer diagnosis. In other words, the switch SW is kept at ON, and the selection states of the multiplexers MUX1 through MUX4 are kept at their input terminals 1.

Since the ICs perform the cell voltage measurement operation periodically as described above, accordingly when, after having executed the processing of the step S140, as shown in FIG. 18 the multiplexers HVMUX1 and HVMUX2 perform voltage measurement of the battery cell BC1 at their input terminals 00, the voltage of the resistor R1 (an excessive voltage that corresponds to excessive charge) comes to be inputted to the multiplexers HVMUX1 and HVMUX2. This voltage is converted to a digital value by the analog to digital converter 122A, and is stored in the register CELL1. And, when it is compared with the excessive charge threshold value OC by the digital comparator 270, the fact that excessive charge has been detected is set in the flag [OCflag] in the flag storage circuit 284. As a result, an anomaly signal is sent from the IC to the one-bit communication circuit 604, and this anomaly signal is received by the microcomputer 30.

And in a step S150 the microcomputer 30 transmits a command to the IC that requests the transmission of the cell voltage data stored in the registers CELL1 through CELL4. Upon receipt of this command, the IC returns the cell voltage data stored in the registers CELL1 through CELL4 at the time point of receipt to the microcomputer 30 via the serial communication circuit 602. It should be understood that it would also be acceptable, in the step S150, for only the cell voltage data of the register CELL1 to be requested.

Then in a step S160, along with turning the switches SW, SW0, and SW2 through SW4 to OFF, a command for changeover of the multiplexers MUX1 through MUX4 from their input terminals 1 to their input terminals 0 is transmitted to the IC. And the IC returns to the cell voltage measurement state by performing the operation of turning off the switches and the changeover operation of the multiplexers according to this command.

In the next step S170, the microcomputer 30 diagnoses whether or not the excessive charge detection circuit is operating normally. In other words, normal operation or an anomaly of the excessive charge detection circuit is determined on the basis of whether or not the received cell voltage data and an anomaly signal have been received. Although it has already been diagnosed in the step S130 that the multiplexers HVMUX1 and HVMUX2 are operating normally, the fact that excessive voltage is, as expected, being inputted is confirmed from the cell voltage data. And whether or not excessive charge detection is being performed as expected due to the input of this excessive voltage is diagnosed according as to whether or not an anomaly signal is received.

If an anomaly signal has been received, it is diagnosed that the excessive charge detection circuit is operating normally. The flow of control is transferred from this step S170 to the step S210. In this step S210, an anomaly report to the effect that an anomaly has occurred in the functioning of the IC is transmitted from the microcomputer 30 to the higher level controller, and then this series of diagnostic processing steps terminates.

The Fourth Embodiment

Figure 19:
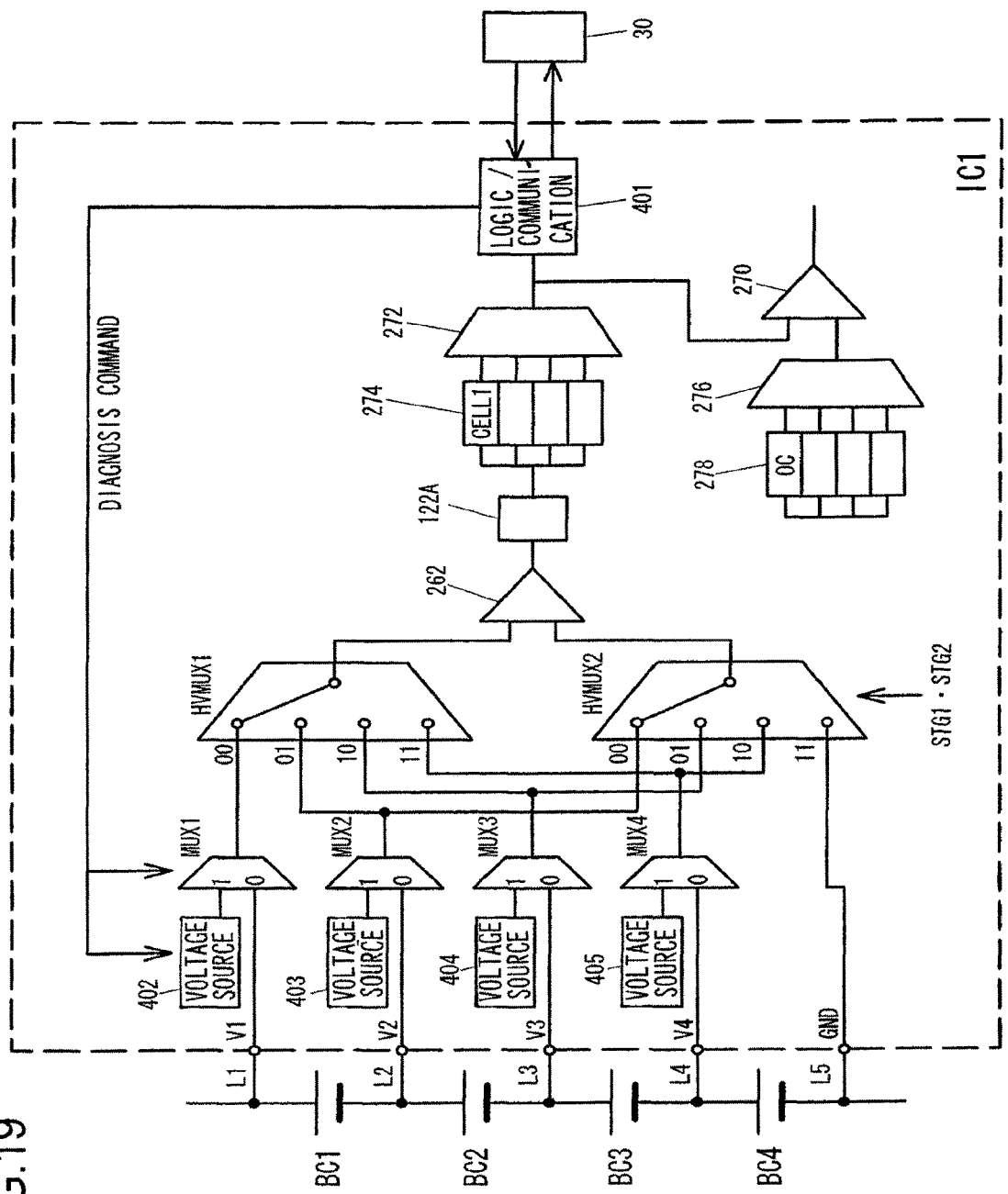
FIG. 19 is a figure for explanation of a fourth embodiment.

FIG. 19 is a figure for explanation of a fourth embodiment. In the second embodiment, the resistors R1 through R4 were connected in series to the voltage source 400 that was provided to the IC, the already known voltages that were voltage divided by these resistors R1 through R4 were inputted instead of the cell voltages, and thereby diagnosis of the multiplexers HVMUX1 and HVMUX2 was performed. However, in this fourth embodiment, it is arranged to perform diagnosis of the multiplexers HVMUX1 and HVMUX2 by providing voltage sources 402 through 405 instead of the resistors R1 through R4, and by inputting the already known voltages from these voltage sources 402 through 405.

The magnitudes of the values of the voltages outputted by the voltage sources 402 through 405 when performing diagnosis of the multiplexers HVMUX1 and HVMUX2 are set in a similar manner to the case of setting the voltage values generated by the resistors R1 through R4. It is also similarly possible to diagnose whether or not the multiplexers MUX1 and MUX2 are operating correctly. Since the operation of the multiplexers MUX1, MUX2, HVMUX1, and HVMUX2 during diagnosis is the same as that in the second embodiment, it will herein be omitted. The voltage sources 402 through 405 are turned ON when the diagnosis mode is ON, and are turned OFF when the diagnosis mode is OFF. For these voltage sources 402 through 405, there may be used voltage dividers that divide by a variable resistance value, DACs, charge pumps, DC-DC converters, or elements that can generate voltage such as band gap references or the like.

Furthermore, it is also possible to use the voltage sources 402 through 405 as variable voltage sources, and to perform diagnosis of the excessive charge detection circuit by changing the output voltage of one of them to a voltage value that corresponds to excessive charge. It should be understood that while, in FIG. 19, the voltage sources 402 through 405 are provided internally to IC1, it would also be acceptable to provide them externally to IC1, and to build the structure so that they input already known voltage values to the terminals V1 through V4.

Figure 27:
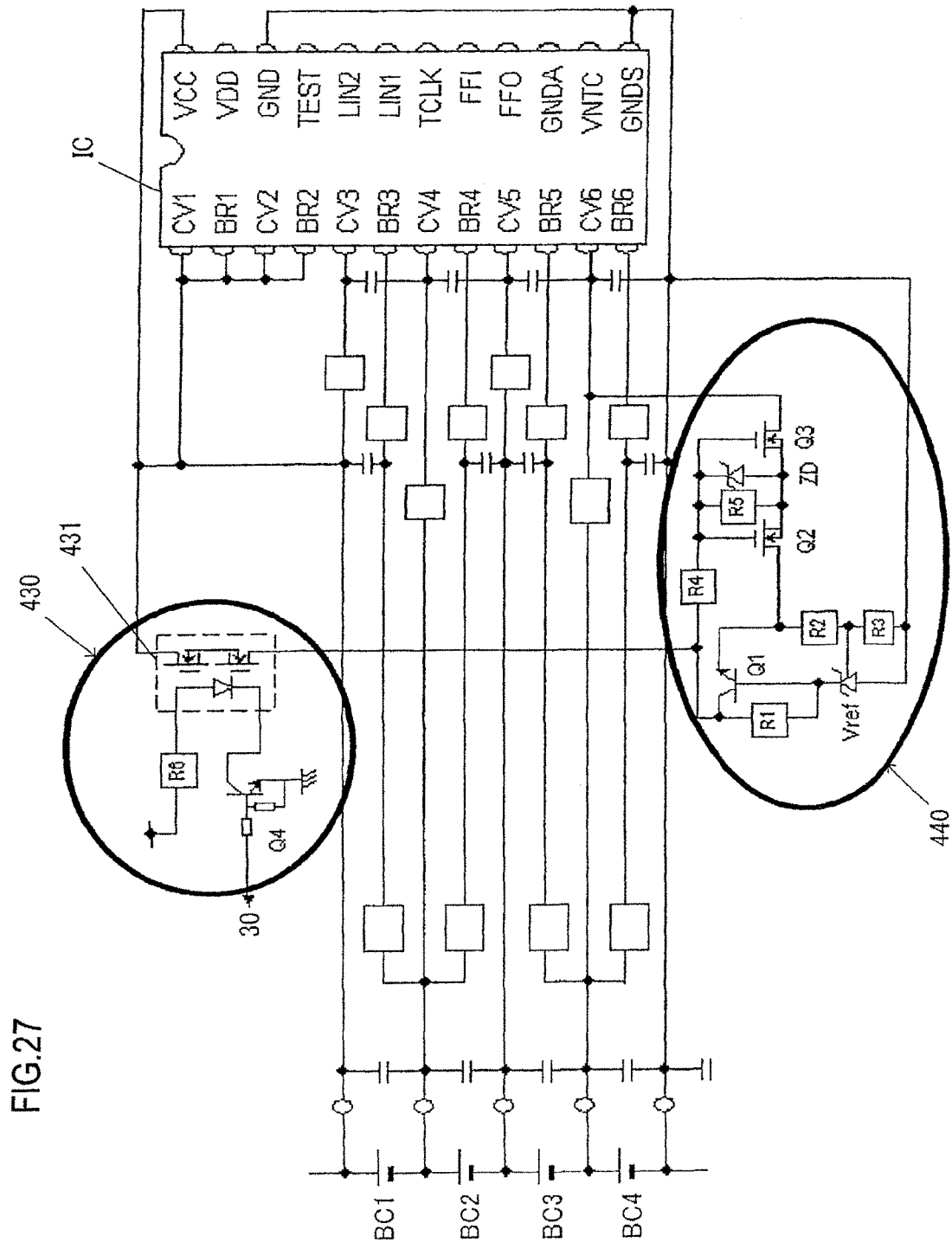
FIG. 27 is a figure showing an example of a case in which a voltage supply is provided externally to the IC.

FIG. 27 is a figure showing an example when the voltage sources are provided externally to the IC. In the case of the IC shown in FIG. 27, a structure is provided in which it is possible to connect six battery cells to the terminals VCC, CV1 through CV6, and GND S; and, in the example shown in FIG. 27, four battery cells are connected to the terminals CV3 through CV6 and GND S. Here, the external voltage source 440 is provided to the terminal CV6 for diagnosis of the excessive charge detection circuit, and corresponds to the voltage source 405 of FIG. 19. And also, when performing multiplexer diagnosis, it is provided to each of the terminals CV3, CV4, CV5, and CV6 that correspond to the respective battery cells. An insulation switch 430 is actuated by a signal from the microcomputer 30, so that a photocoupler 431 is turned ON. As a result, a voltage that is generated from the voltage Vref of the external voltage source 440 is applied to the terminal V6 of the IC.

The Fifth Embodiment

Figure 20:
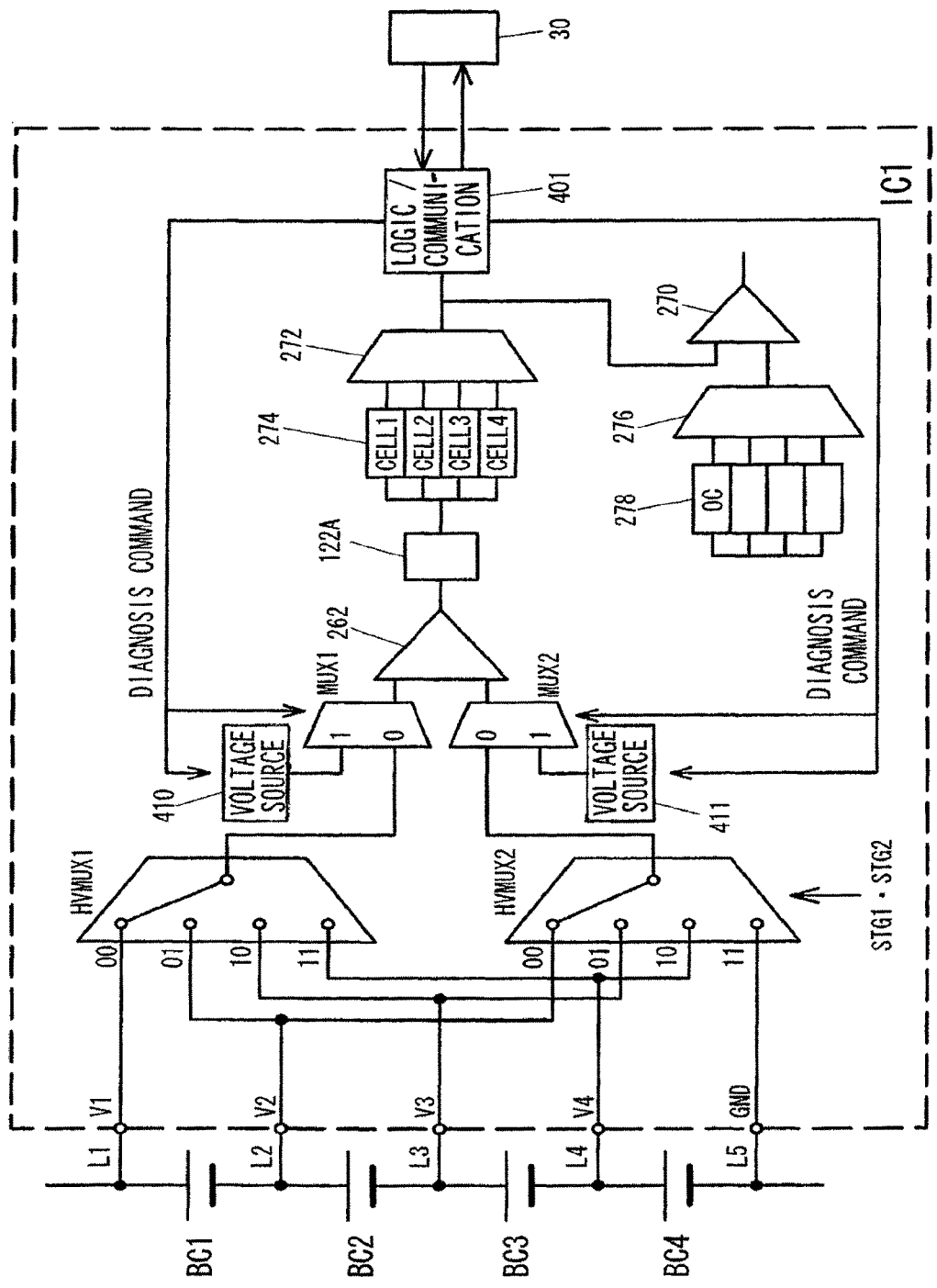
FIG. 20 is a figure for explanation of a fifth embodiment.

FIG. 20 is a figure for explanation of a fifth embodiment. While, in the fourth embodiment described above, the voltage sources 402 through 405 were provided at a stage before the multiplexers HVMUX1 and HVMUX2, in this fifth embodiment voltage sources 410 and 411 are provided at a stage after the multiplexers HVMUX1 and HVMUX2. The multiplexers MUX1 and MUX2 are provided upon the lines between the multiplexers HVMUX1 and HVMUX2 and the differential amplifier 262. The output of the multiplexer HVMUX1 is inputted to the input terminal 0 of the multiplexer MUX1, and an already known voltage from the voltage source 410 is inputted to its other input terminal 1. Similarly, the output of the multiplexer HVMUX2 is inputted to the input terminal 0 of the multiplexer MUX2, and an already known voltage from the voltage source 412 is inputted to its other input terminal 1.

In this embodiment, by providing a structure like that shown in FIG. 20, it becomes possible to perform diagnosis separately and individually as to whether or not any malfunction has occurred with the multiplexers HVMUX1 and HVMUX2. During normal measurement of cell voltages, the multiplexers MUX1 and MUX2 are put into their states in which their input terminals 0 are selected, and the voltage sources 410 and 411 are in their OFF states. On the other hand, in the diagnosis mode, the selection states of the multiplexers MUX1 and MUX2 and the ON/OFF states of the voltage sources 410 and 411 are controlled according to commands from the microcomputer 30.

First, when performing diagnosis of the multiplexer HVMUX1, the multiplexer MUX1 is set to its input terminal 0 and the multiplexer MUX2 is set to its input terminal 1, and the voltage value of the voltage source 411 is set to the ground level of IC1. The voltage source 410 is set to its OFF state. When in this state the input terminals of the multiplexers HVMUX1 and HVMUX2 are changed over to 00, 01, 10, and 11 according to the cell voltage measurement operation of the IC, the voltage of four cells, the voltage of three cells, the voltage of two cells, and the voltage of one cell come to be input in order into the differential amplifier 262. It should be understood that it would also be acceptable to arrange for the selection state of the multiplexer HVMUX1 to be changed over in order according to commands from the microcomputer 30.

Since the voltage that is measured is different by one cell or more in this manner when the input terminal of the multiplexer HVMUX1 that is selected is different, accordingly the microcomputer 30 is able to diagnose, from these voltage values that are measured, whether or not the multiplexer HVMUX1 is correctly selecting its input terminal as commanded.

On the other hand, when performing diagnosis of the multiplexer HVMUX2, the multiplexer MUX1 is set to its input terminal 1 and the multiplexer MUX2 is set to its input terminal 0, and the voltage value of the voltage source 410 is set to the ground level of IC1. The voltage source 411 is set to its OFF state. When in this state the input terminals of the multiplexers HVMUX1 and HVMUX2 are changed over to 00, 01, 10, and 11 according to the cell voltage measurement operation of the IC in a similar manner to the case of measurement of the cell voltages, the minus voltage of four cells, the minus voltage of three cells, the minus voltage of two cells, and the minus voltage of one cell come to be input in order into the differential amplifier 262. Due to this it is possible to diagnose the selection state of the multiplexer HVMUX2, in a similar manner to the case with the multiplexer HVMUX1.

While in the example described above the voltage value of the voltage source was set to ground level, this is not to be considered as being limitative. For example if, when performing diagnosis of the multiplexer HVMUX1, the voltage value of the voltage source 411 is set to the voltage level of two cells, then, when the input terminals of the multiplexers HVMUX1 and HVMUX2 are changed over to 00, 01, 10, and 11, then the voltage of two cells, the voltage of one cell, the voltage of no cells, and the minus voltage of one cell are inputted in order to the differential amplifier 262. Since, with this type of setting as well, the voltages that are measured are different by one cell or more when the input terminals that are selected are different, accordingly it is possible to perform diagnosis of the selection state of the multiplexer HVMUX1 from these voltage values.

It should be understood that, since sometimes the input voltage range of the differential amplifier 262 comes to be exceeded when the voltage of four cells is inputted, accordingly it is desirable to arrange to provide an attenuator at a stage before the differential amplifier 262 that is provided in circumstances of this type. While, in the example described above, the changing over of the multiplexers HVMUX1 and HVMUX2 was performed according to the signals STG1 and STG2 from the decoders 257 and 259, it would also be acceptable to perform this changing over according to commands from the microcomputer 30.

Diagnosis of the Excessive Charge Detection Function

Furthermore it is also possible to perform diagnosis of the excessive charge detection circuit, since the voltages of two to four cells are inputted corresponding to excessive charge. Even further, it would also be acceptable to arrange to perform diagnosis of the excessive charge detection circuit by changing over both of the multiplexers MUX1 and MUX2 to their input terminals 1, and by inputting to the differential amplifier 262 excessive voltages that correspond to excessive charge by using the voltage sources 410 and 411. For example, the voltage source 411 may be set to ground potential, while the voltage source 410 is set to a value that corresponds to excessive charge. By inputting an excessive voltage to the differential amplifier 262 in this manner, it is possible to diagnose that the differential amplifier 262, the analog to digital converter 122A, and the digital comparator 270 are operating normally, and it is also possible to diagnose that the registers in which the excessive charge threshold value flag OC and the flag [OCflag] are set are operating normally. It is also possible to decide whether or not the voltage source 410 has correctly inputted an excessive voltage, from the voltage data of the registers CELL that is returned by serial communication.

Figure 28:
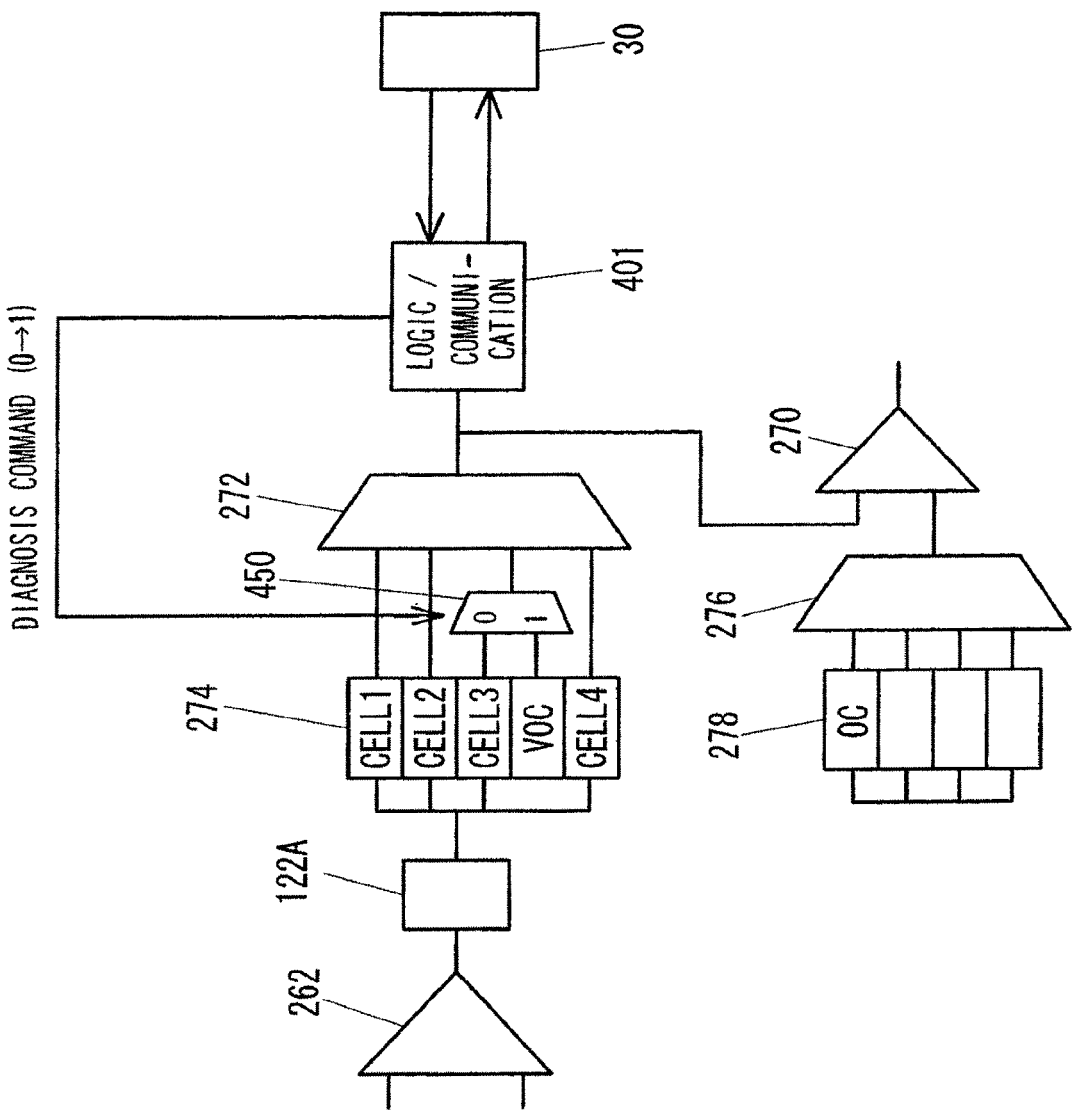
FIG. 28 is a figure showing a structure for performing excessive charge detection.

As the structure for performing diagnosis of the excessive charge detection circuit, instead of inputting an excessive voltage by using the voltage sources 410 and 411 such as shown in FIG. 20, it would also be acceptable to employ a structure like that shown in FIG. 28. FIG. 28 is a figure showing the analog to digital converter 122A and blocks subsequent to it. A register is provided to the current value storage circuit 274 in which a value VOC that corresponds to excessive charge is stored. This value VOC that corresponds to excessive charge is set so as to be slightly larger than the excessive charge threshold value OC that is kept in the reference value storage circuit 278. One or the other of this value VOC that corresponds to excessive charge and the voltage value data stored in the register CELL3 is selected by a multiplexer 450 and is inputted to a digital multiplexer 272. The changing over of the input terminals 0 and 1 of the multiplexer 450 is performed according to diagnosis commands on the basis of commands from the microcomputer 30.

In the normal cell voltage measurement mode, the selection state of the multiplexer 450 is set to its input terminal 0. Due to this, the data in the register CELL3 that is the cell voltage of the battery cell BC3 comes to be read out by the digital multiplexer 272. On the other hand, when performing diagnosis of the excessive charge detection circuit, the selection state of the multiplexer 450 is changed over to its input terminal 1. As a result, instead of the voltage data of the register CELL3, the value VOC that corresponds to excessive charge is read out, and the excessive charge threshold value OC in the reference value storage circuit 278 and this value VOC that corresponds to excessive charge are compared together by the digital comparator 270. Since the value VOC that corresponds to excessive charge is set to be greater than the excessive charge threshold value OC, accordingly the result of this comparison is that the flag [OCflag] that denotes excessive charge is set in the flag storage circuit 284. When this flag [OCflag] is set, an anomaly signal is sent to the one-bit transmission circuit 604, and is received by the microcomputer 30. Moreover, the value VOC that corresponds to excessive charge is returned to the microcomputer 30 as the cell voltage of the battery cell BC3.

Figure 29:
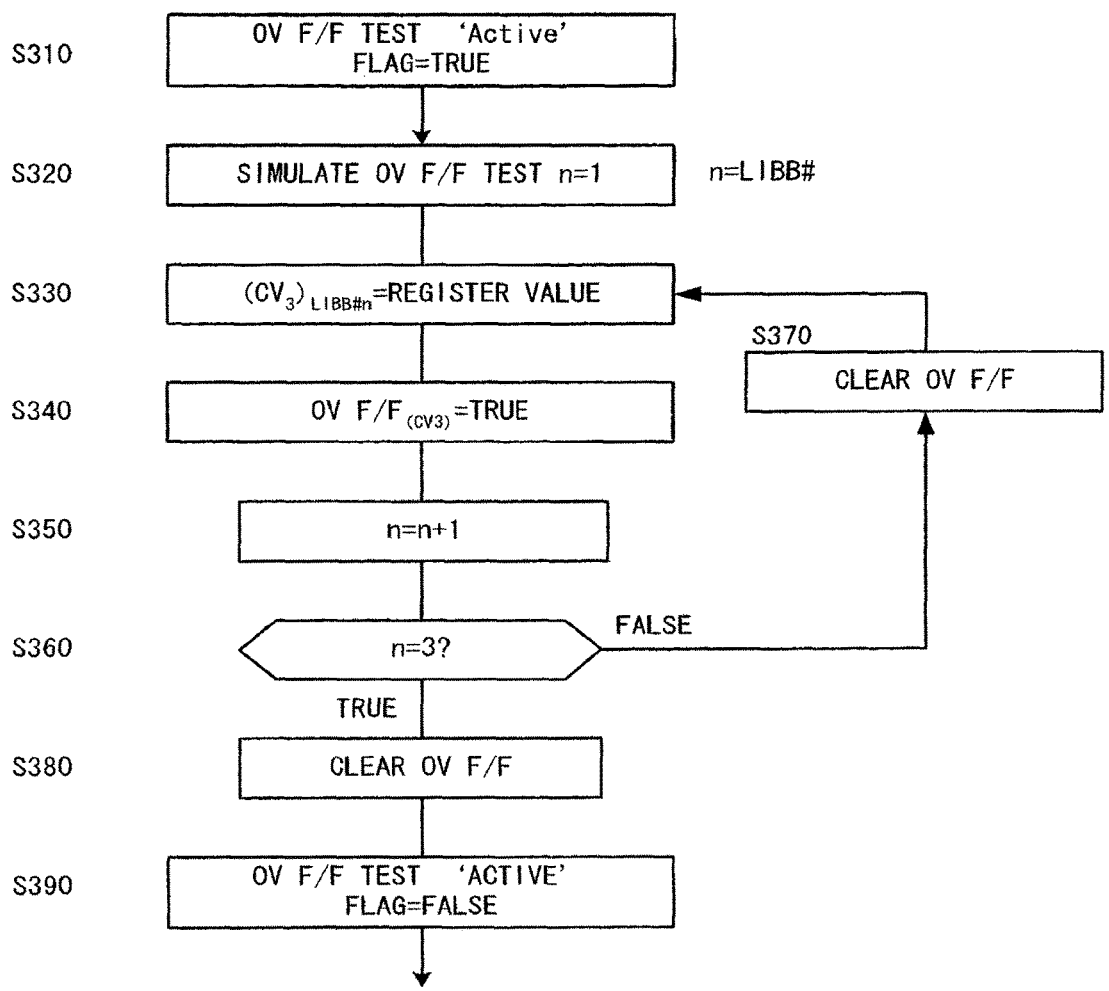
FIG. 29 is a flow chart showing steps of excessive charge detection function diagnosis.

FIG. 29 is a flow chart showing the steps of excessive charge detection function diagnosis. In a step S310, a flag for excessive charge detection function diagnosis is set to "true" and diagnosis is started. Then in a step S320 a variable n is set to 1. Here, n is the number of the IC for which diagnosis is to be performed; n is set to 1 when performing diagnosis of IC1, n is set to 2 when performing diagnosis of IC2, and n is set to 3 when performing diagnosis of IC3. Then in a step S330 the value VOC that corresponds to excessive charge is set, instead of the cell voltage Vc3 that has been measured (CV3 in FIG. 29). Next in a step S340 a check is made that the excessive charge signal has been received. In the next step S350, the value of n is increased to n+1 in order to perform diagnosis of the next IC, i.e. of IC2 (in this case N is increased by 1 to 2). Then in a step S360 a decision is made as to whether or not the value of n is 3, in other words as to whether or not the diagnosis of IC3 has been completed. If a negative decision is reached in this step S360, then, after having cleared the excessive charge flag and sent a signal in a step S370, the flow of control returns to the step S330. On the other hand, if an affirmative decision is reached in the step S360, in other words if the diagnosis has been completed up to and including IC3, then the flow of control proceeds to a step S380, in which the excessive charge flag is cleared and a signal is sent. Finally in a step S390 the flag for excessive charge detection function diagnosis is set to "false", and this diagnosis terminates.

When the cell voltage of the battery cell BC3 that is returned agrees with the anticipated value VOC that corresponds to excessive charge, then the microcomputer 30 is able to recognize that the multiplexer 450 is operating correctly according to the commands that it receives. Furthermore, when an anomaly signal has been received, it may be diagnosed that the excessive charge detection circuit is operating normally. On the other hand, if an anomaly signal is not received even though the value VOC that corresponds to excessive charge is being returned, then it is possible to diagnose an anomaly in the excessive charge detection circuit. It should be understood that, if the value VOC that corresponds to excessive charge is not returned, then it is possible to determine that the multiplexer 450 is not operating normally.

In this manner, by providing a structure by which the value VOC that corresponds to excessive charge is inputted to the digital multiplexer 272 instead of the voltage data of CELL3, and by which this value is compared by the digital comparator 270 to the excessive charge threshold value OC, it is possible, upon receipt of an anomaly signal, to confirm that the excessive charge threshold value OC is correctly stored in the reference value storage circuit 278, that the digital comparator 270 is operating correctly, and that the flag [OCflag] is being correctly set. Conversely, if an anomaly signal is not received, then it is possible to diagnose that an anomaly is occurring with at least one of these functions.

The Sixth Embodiment

In the second through the fifth embodiments described above, it was arranged for the difference between the outputs of the multiplexers HVMUX1 and HVMUX2 to be obtained by the differential amplifier 262, for this difference to be converted into a digital value by the analog to digital converter 122A, and for diagnosis of the multiplexers to be performed on the basis of this data. However, in a sixth embodiment shown in FIG. 21, it is arranged to perform diagnosis of the multiplexers HVMUX1 and HVMUX2 on the basis of the differences between the inputs and the outputs of the multiplexers HVMUX1 and HVMUX2.

Figure 21:
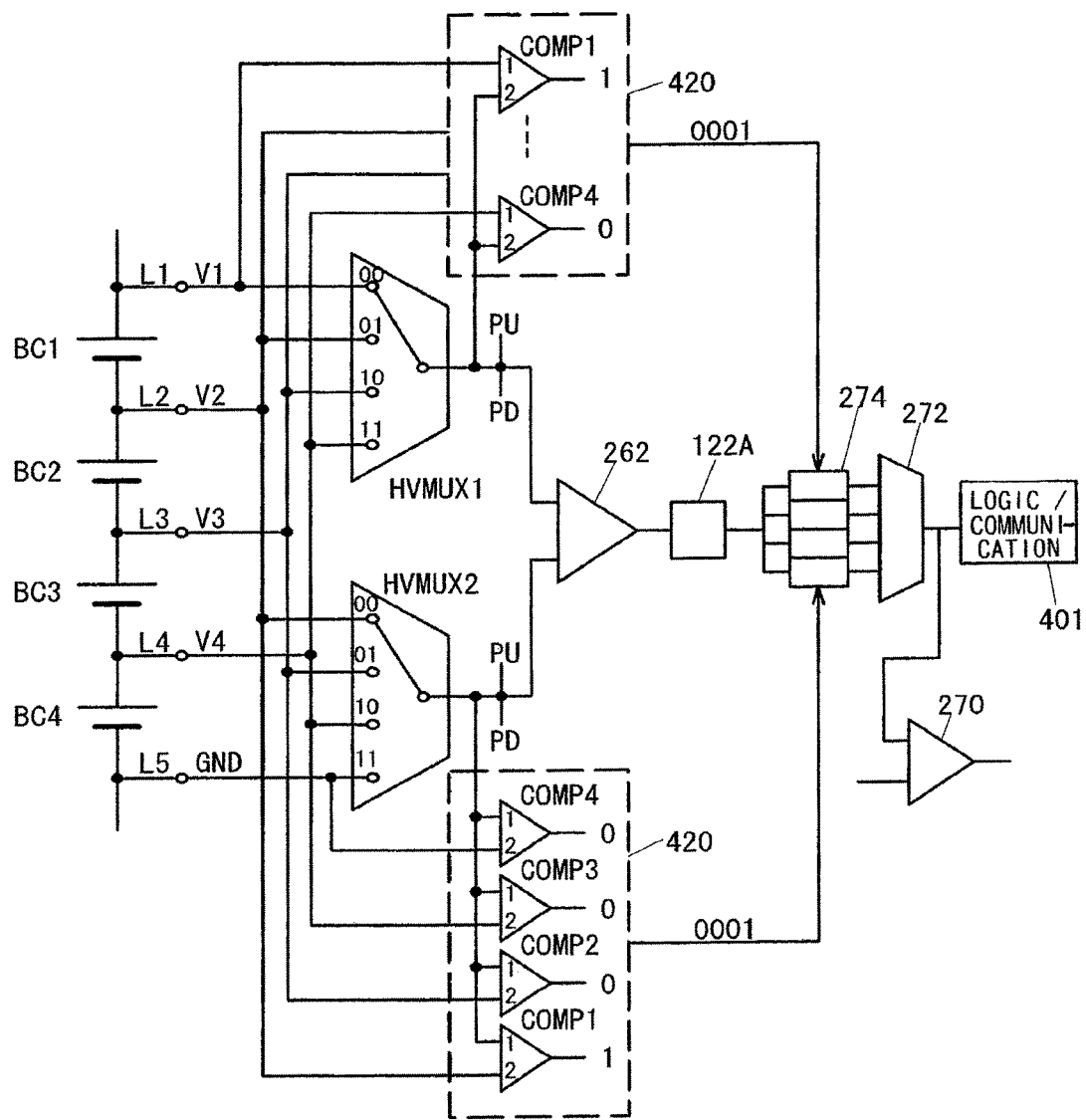
FIG. 21 is a figure for explanation of a sixth embodiment.

In FIG. 21, the portions denoted by the reference symbol 420 are circuits that obtain the differences between the inputs and the outputs of the multiplexers HVMUX1 and HVMUX2. While in the following the case of the multiplexer HVMUX2 will be explained, the same also goes for the multiplexer HVMUX1. Four comparators COMP1 through COMP4 are provided to the differential circuit 420. The input terminal 1 of the comparator COMP1 is connected to the output line of the multiplexer HVMUX2, while its input terminal 2 is connected to the line that connects the positive electrode of the battery cell BC2 and the input terminal 00 of the multiplexer HVMUX2. In the selection state of the multiplexers HVMUX1 and HVMUX2 shown in FIG. 21, the same potential is inputted to the input terminal of the comparator COMP1 as to the input terminal 00 of the multiplexer HVMUX2.

In a similar manner, for the comparator COMP2, the output of the multiplexer HVMUX2 is inputted to its input terminal 1, while the same potential is inputted to its input terminal 2 as to the input terminal 01 of the multiplexer HVMUX2. And, for the comparator COMP3, the output of the multiplexer HVMUX2 is inputted to its input terminal 1, while the same potential is inputted to its input terminal 2 as to the input terminal 10 of the multiplexer HVMUX2. Moreover, for the comparator COMP4, the output of the multiplexer HVMUX2 is inputted to its input terminal 1, while the same potential is inputted to its input terminal 2 as to the input terminal 11 of the multiplexer HVMUX2. It should be understood that the output sides of the multiplexers HVMUX1 and HVMUX2 are pulled up or pulled down in order to correspond to floating the outputs of the multiplexers HVMUX1 and HVMUX2.

When measuring the cell voltage of the battery cell BC1, as shown in FIG. 21, the input terminals 00 of the multiplexers HVMUX1 and HVMUX2 are selected. And the potential at the positive electrode side of the battery cell BC2 is inputted to the input terminals 1 of the comparators COMP1 through COMP4. As a result, the potential differences between the input and the output terminals of the comparators COMP1 through COMP4 become, from the comparator COMP1 through the comparator COMP4 in order, the voltage of no cells, the voltage of one cell, the voltage of two cells, and the voltage of three cells.

Figure 22:
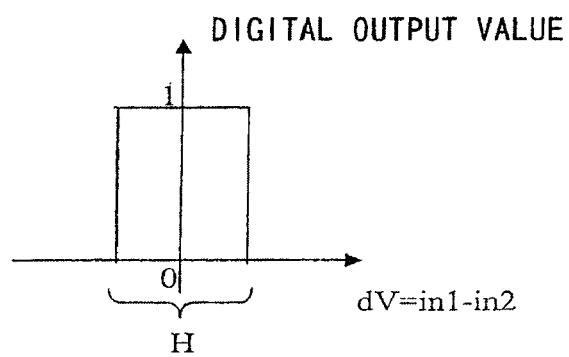
FIG. 22 is a figure showing characteristics of comparators COMP1 through COMP4.

Each of the comparators COMP1 through COMP4 has a characteristic as shown in FIG. 22. In FIG. 22, the differential voltage between the input in1 at the input terminal 1 and the input in2 at the input terminal 2 (dV=in1−in2) is shown along the horizontal axis, while the outputs of the comparators COMP1 through COMP4 (digital values) are shown along the vertical axis. If the value of the differential voltage dV that is inputted is within a predetermined range H that is centered around 0, then a digital value of 1 is outputted from the comparators COMP1 through COMP4, and conversely, if the value of the differential voltage dV is a value that is outside the predetermined range H, then a digital value of 0 is outputted. The predetermined range H is set to a value of such an order as that the errors of the comparators COMP1 through COMP4 can be ignored.

In the state shown in FIG. 21, 1 is being outputted from the comparator COMP1 and 0 is being outputted from the comparators COMP2 through COMP4. These values are stored in the current value storage circuit 274 as the selection state data "0001". On the other hand, the same is true in the case of the multiplexer HVMUX1, so that the selection state data "0001" is outputted from the differential circuit 420 and is stored in the current value storage circuit 274. In a similar manner: the selection state data "0010" is outputted from the differential circuit 420 when the input terminals 01 of the multiplexers HVMUX1 and HVMUX2 are selected; the selection state data "0100" is outputted when their input terminals 10 are selected; and the selection state data "1000" is outputted when their input terminals 11 are selected.

In this manner, the selection state data that is obtained during cell voltage measurement is data that indicates which of the input terminals of the multiplexers HVMUX1 and HVMUX2 are selected, and is stored in the registers of the current value storage circuit 274 in correlation with the cell voltages. Furthermore, this selection state data is acquired during each interval of the cell voltage measurement cycle. When each of the ICs receives a command to transmit the voltages of its cells, along with the cell voltages, it also sends the selection state data to the microcomputer 30 together therewith. And the microcomputer 30 performs diagnosis of the multiplexers HVMUX1 and HVMUX2 on the basis of this selection state data that it receives. For example, if the selection state data that corresponds to the cell voltage of the battery cell BC1 is "0001", then a diagnosis of normal operation is reached, while if it is any other data, then an anomaly is diagnosed.

The Seventh Embodiment

Figure 23:
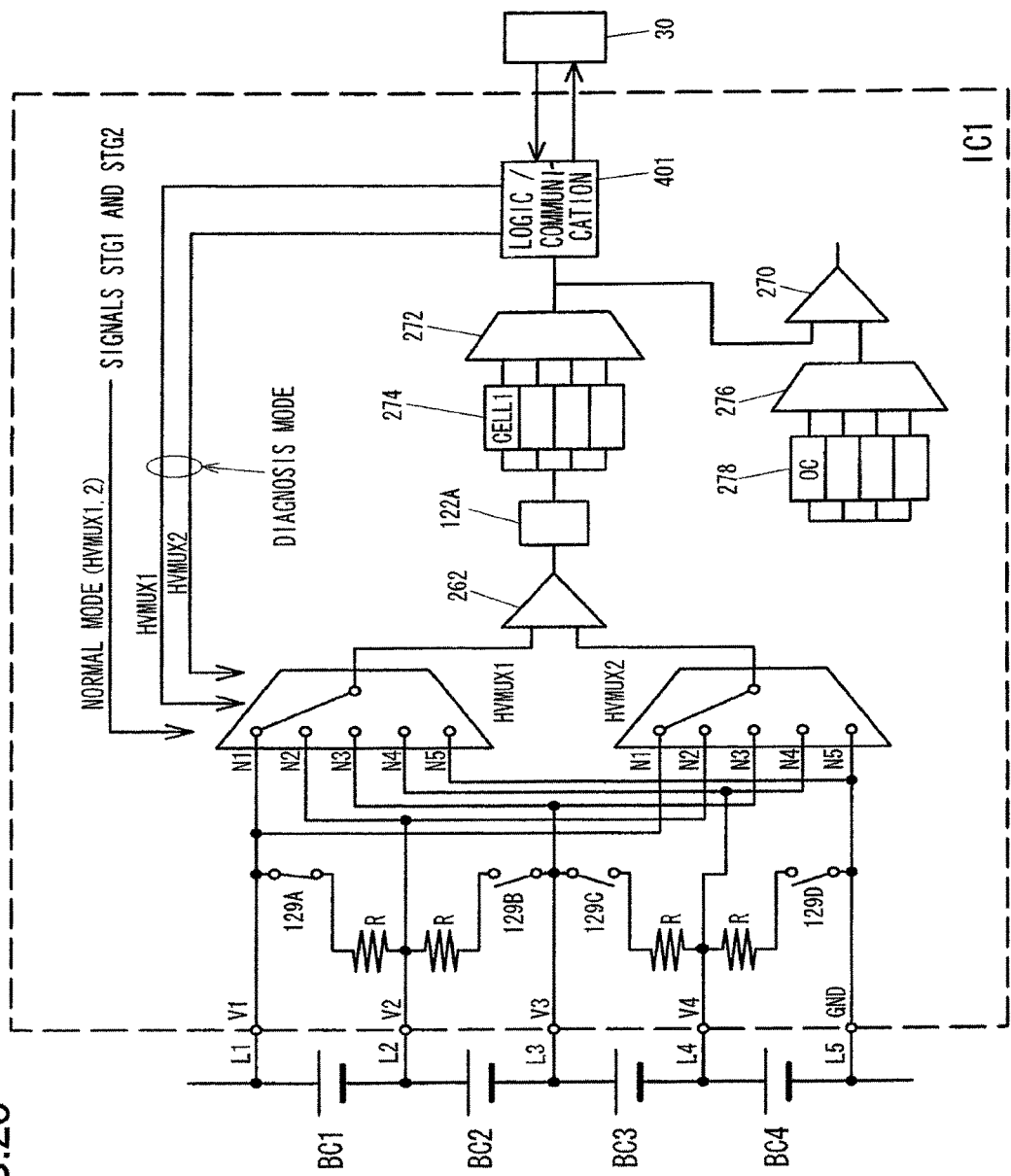
FIG. 23 is a figure showing a seventh embodiment.

FIG. 23 is a figure for explanation of a seventh embodiment. In this seventh embodiment, if a cell voltage equal to 0 V is detected, then it is possible to make a diagnosis as to whether this originates due to a breakage of one of the sensing lines L1 through L5, or whether it originates due to the output voltage Vc1 becoming 0 V because of an anomaly in one of the battery cells BC1 through BC4 (such as an internal short or the like). In the normal mode for measuring the cell voltages, the change over operation of the multiplexers HVMUX1 and HVMUX2 is performed on the basis of the signals STG1 and STG2 from the decoders 257 and 259 that are provided to IC1, but in the diagnosis mode priority is given to commands from the microcomputer 30. And the selection states of the multiplexers HVMUX1 and HVMUX2 and the ON/OFF states of the balancing switches are controlled by these commands, and diagnosis is performed on the basis of the voltage values that are measured at this time.

It should be understood that in this explanation only the diagnosis described above is described, while the resistors RPU, R1 through R4, and RPD that are needed for the diagnosis of the multiplexers HVMUX1 and HVMUX2, the multiplexers MUX1 through MUX5, the switch SW, and the voltage source 400 are all omitted from FIG. 23, and explanation thereof is also omitted, because they are the same as in the case of FIG. 13. Furthermore, the balancing resistors R that adjust the balancing currents are not structures that are necessarily internal to IC1; they may also be implemented externally to IC1.

As an example, the case when a cell voltage Vc2 equal to 0 V is measured, and it is to be diagnosed whether this should be ascribed to a breakage of the sensing line L2, or to a short circuit having occurred internally to the battery cell BC2, will be explained with reference to FIG. 24. When performing this diagnosis, the selection states of the multiplexers HVMUX1 and HVMUX2 and the ON/OFF states of the balancing switches 129A and 129B are controlled. FIG. 24 shows the relationship between the selection states of the multiplexers HVMUX1 and HVMUX2 and the ON/OFF states of the balancing switches 129A and 129B, and the voltages that are measured. In the following, the selection states of the multiplexers HVMUX1 and HVMUX2 and the ON/OFF states of the balancing switches 129A and 129B are shown as control states (HVMUX1, HVMUX2, 129A, and 129B). Moreover, the first row of FIG. 24 shows the measured voltage values during normal conditions, the second row shows the measured voltage values when the sensing line L2 has suffered a line breakage, and the third row shows the measured voltage values when Vc2 is equal to 0 V due to an abnormality in the battery cell BC2.

The first column from the left side of FIG. 24 shows the case when the control state is (N1, N1, x, x). In other words, this is the case in which the input terminals N1 of both of the multiplexers HVMUX1 and HVMUX2 are selected. The reference symbol "x" being shown in relation to the ON/OFF states of the balancing switches 129A and 129B means that these switches could be in either the ON or the OFF state, and it does not matter which. In the case of this control state of (N1, N1, x, x), the measured voltage value is 0 V in all three cases: during normal conditions, when the sensing line is broken, and when there is some abnormality of the battery cell. It should be understood that, if it is not possible for the input terminals N1 of both of the multiplexers HVMUX1 and HVMUX2 to be selected, this control state is not essential, and it may also be omitted.

The second column shows the case in which the control state is (N1, N2, ON, x); in other words, this is the state shown in FIG. 23. In this case, during normal conditions, the cell voltage Vc1 of the battery cell BC1, in other words the voltage of one cell, comes to be measured. On the other hand, if there is a line breakage in the sensing line L2, then a measured voltage value equal to 0 V is measured. Furthermore since, even if the output voltage Vc2 of the battery cell BC2 is equal to 0 V due to an abnormality, this exerts no influence upon the voltage measurement between the terminals V1 and V2, accordingly a measured voltage value equal to Vc1 is measured in this case as well.

The third column shows the case in which the control state is (N1, N3, x, x). In this case, during normal conditions, the sum of the cell voltage Vc1 of the battery cell BC1 and the cell voltage Vc2 of the battery cell BC2, in other words the voltage of two cells Vc1+Vc2, comes to be measured. Moreover since, even if there is a line breakage in the sensing line L2, this exerts no influence upon the voltage measurement between the terminals V1 and V3, accordingly the voltage of two cells Vc1+Vc2 is measured in this case as well. On the other hand, if the output voltage Vc2 of the battery cell BC2 is equal to 0 V due to an abnormality, then only the voltage of one cell (Vc1+0) will come to be measured.

The fourth column shows the case in which the control state is (N2, N3, x, ON). In this case, during normal conditions, the cell voltage Vc2 of the battery cell BC2, in other words the voltage of one cell, comes to be measured. On the other hand, if there is a line breakage in the sensing line L2, then 0 V will come to be measured. And, if due to an abnormality in the battery cell BC2 its output voltage Vc2 is equal to 0 V, then 0 V will come to be measured.

In this manner, by comparing together the groups of measured voltages that relate to the four types of control state (N1, N1, x, x), (N1, N2, ON, x), (N1, N3, x, x), and (N2, N3, x, ON), it is possible to diagnose whether there is a line breakage in the sensing line L2, or whether the output voltage of the battery cell BC2 itself is really 0 V. And diagnosis for other cases as well, for example for whether there is a line breakage in the sensing line L3 or whether the output voltage of the battery cell BC3 itself is really 0 V and so on, can also be contemplated in a similar manner.

The Eighth Embodiment

Figure 25A:
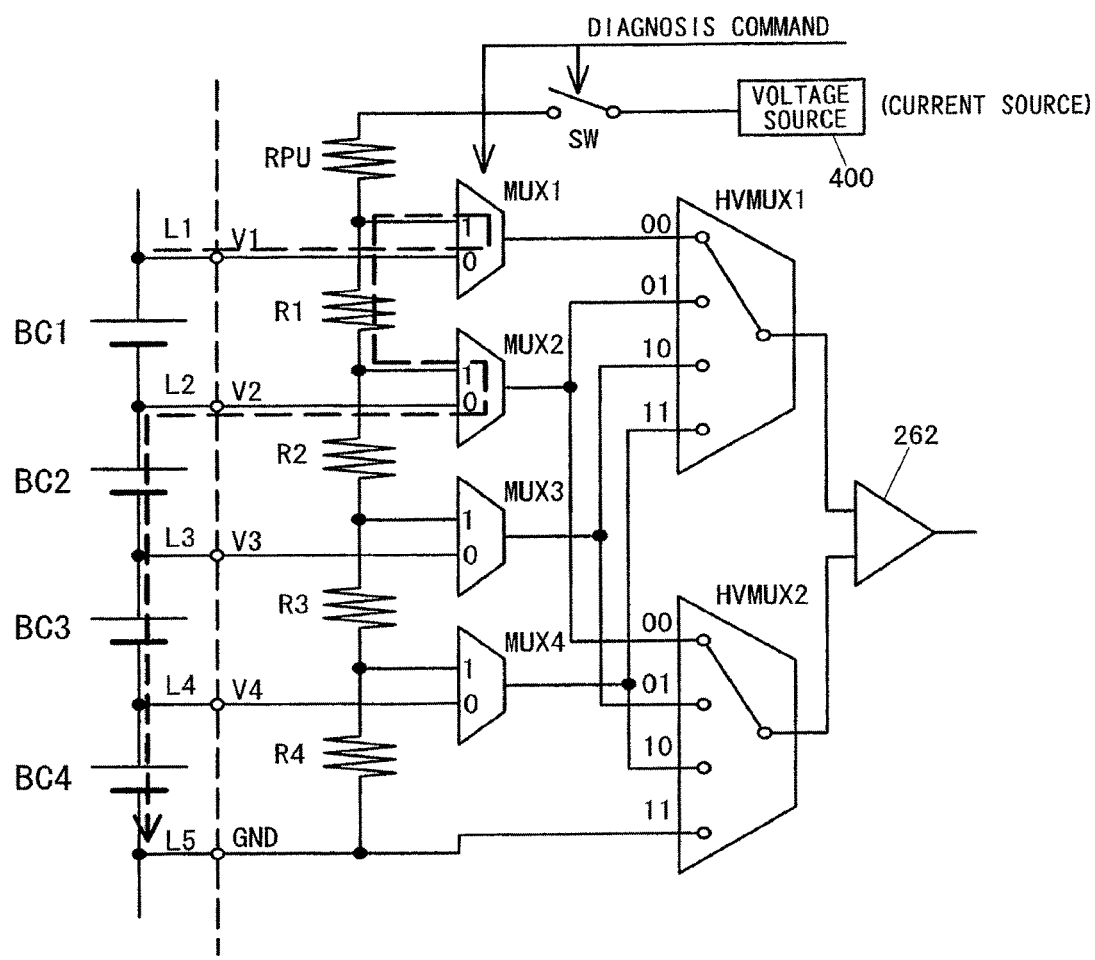
FIG. 25A is a figure showing an eighth embodiment, and particularly shows a portion of the internal blocks of an IC.
Figure 25B:
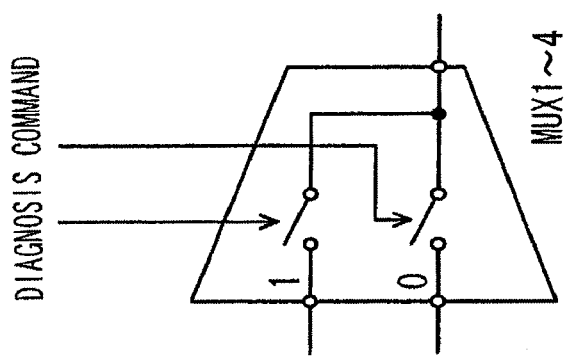
FIG. 25B is a figure showing the structures of multiplexers MUX1 through MUX4.

FIGS. 25A and 25B are figures for explanation of an eighth embodiment. While the structure shown in FIG. 25A is the same as the structure shown in FIG. 16, the structure of each of the multiplexers MUX1 through MUX4 is as shown in FIG. 25B. In this embodiment, the multiplexers MUX1 through MUX4 are made as transfer gates combining NMOS and PMOS, or the like, and switches that are provided at each of their input terminals 0 and 1 can be independently controlled to ON and OFF according to commands from the microcomputer 30.

With this eighth embodiment as well, the operation in the normal mode for performing cell voltage measurement, and the operation when performing diagnosis of the connection states of the multiplexers HVMUX1 and HVMUX2 in the diagnosis mode, are performed in a similar manner to the case shown in FIG. 16. Furthermore, in this eighth embodiment, it is possible to perform line breakage diagnosis of the sensing lines by turning the switch SW that is provided to the voltage source 400 to OFF, while simultaneously turning to ON both of the two switches in the multiplexers MUX1 through MUX4, shown in FIG. 25B. It should be understood that, in order to perform this line breakage diagnosis, it is necessary to set the resistance values of the resistors RPU and R1 through R4 to be sufficiently greater than the internal resistances of the battery cells.

In FIG. 25A, by putting both of the switches of the multiplexers MUX1 and MUX2 to the ON state, it is possible to diagnose line breakage of the sensing line L1. While the cell voltage Vc1 is measured if there is no line breakage of the sensing line L1, 0 V comes to be detected as the measured voltage value if there is such a line breakage. In the seventh embodiment described above, line breakage detection is performed by turning the balancing switch 129A to ON and causing a balancing current (a bypass current) to flow in the balancing resistor R. However, in this embodiment, a bypass current is caused to flow in the resistor R1 by setting both of the switches of the multiplexers MUX1 and MUX2 to the ON state, and thereby line breakage detection is performed. In the case of this embodiment, there is the advantageous aspect that it is possible to make the useless current (i.e. the leakage current) during line breakage diagnosis small, since the resistor R1 is set to be large, and the amount of current that flows in it is smaller than the balancing current.

The embodiments described above may be employed either singly or in any of various combinations. This is because the benefits of these embodiments may be reaped either singly or synergistically. Furthermore, the present invention is not to be considered as being limited by any of the features of the embodiments described above, provided that its essential characteristics are not lost.

What is claimed is:

1. A battery monitoring device, comprising:
   a selection circuit that has a plurality of input terminals provided in correspondence with a positive electrode and a negative electrode of each of a plurality of battery cells that are electrically connected in series, selects input terminals that correspond to a positive electrode and a negative electrode of a battery cell that is to be the subject of measurement, and outputs potentials, that are respectively inputted to the selected input terminals, of the positive electrode and the negative electrode of the battery cell that is to be the subject of measurement;
   a voltage measurement circuit, to which the potentials outputted from the selection circuit are inputted, that measures a battery cell voltage that is to be the subject of measurement based on the potentials that are inputted;
   a current source that is used for inputting a potential to the input terminals that are selected by the selection circuit in order that a voltage that is measured by the voltage measurement circuit is to be different from the voltage of the battery cell; and
   a control circuit that monitors a state of the battery cell based on the voltage that is measured by the voltage measurement circuit, wherein:
   in case that a voltage measurement for diagnosing whether or not a selection by the selection circuit is performed correctly is executed
      a potential when using the current source is inputted to the input terminals that are selected by the selection circuit,
      the selection circuit outputs the potential to the voltage measurement circuit, and
      the voltage measurement circuit measures a voltage that is different from the battery cell voltage; and
   the control circuit diagnoses whether or not the selection by the selection circuit is performed correctly based on the voltage, that is different from the battery cell voltage, measured by the voltage measurement circuit.

2. The battery monitoring device according to claim 1, wherein
   the voltage measurement for diagnosing whether or not the selection by the selection circuit is performed correctly is executed according to a diagnosis command from the control circuit within a time period when the battery cell voltage is measured.

3. The battery monitoring device according to claim 1, further comprising a resistor, wherein
   when the battery cell voltage is measured for diagnosing whether or not the selection by the selection circuit is performed, the voltage that is different from the battery cell voltage measured by the voltage measurement circuit is retained in the resistor as a diagnosis data.

4. The battery monitoring device according to claim 3, wherein:
   the voltage measurement for diagnosing whether or not the selection by the selection circuit is performed correctly is executed within a time period when the battery cell voltage is measured according to a diagnosis command by the control circuit; and
   if a time period that is longer than the time period to measure the battery cell voltage and a predetermined time period to retain the diagnosis data to the resistor after having output the diagnosis command elapse, the control circuit outputs a command for requesting return of the diagnosis data that is retained in the resistor.

5. The battery monitoring device according to claim 2, wherein:
   the selection circuit, the voltage measurement circuit and the current source is constructed by an integrated circuit;
   a signal transmission path is provided between the integrated circuit and the control circuit; and
   the diagnosis command is transmitted from the control circuit to the integrated circuit via the signal transmission path.

6. The battery monitoring device according to claim 4, wherein:
- the selection circuit, voltage measurement circuit, the current source and the resistor are constructed by an integrated circuit;
- a signal transmission path is provided between the integrated circuit and the control circuit;
- the diagnosis command and the command for requesting return of the diagnosis data are transmitted from the control circuit to the integrated circuit via the signal transmission path; and
- the diagnosis data is transmitted from the integrated circuit to the control circuit via the signal transmission path.

7. The battery monitoring device according to claim 5, wherein:
- in a case where a plurality of the battery cells each of a plurality of battery cell groups which are electrically connected in series, the integrated circuit is provided to each of the plurality of the battery cell groups;
- the signal transmission path includes a first signal transmission path that connects a plurality of the integrated circuits in series so as to enable serial transmission of a signal among the plurality of the integrated circuits and a second signal transmission path that connects a plurality of the integrated circuits connected in series and the control circuit so as to enable transmission of a signal between a plurality of the integrated circuits connected in series and the control circuit.

8. The battery monitoring device according to claim 7, wherein:
- the battery monitoring device comprises a plurality of the signal transmission paths each of which includes the first signal transmission path and the second signal transmission path;
- one of the plurality of the signal transmission paths is a signal transmission path that transmits the diagnosis command and the diagnosis data; and
- another one of the plurality of the signal transmission paths is a signal transmission path that transmits an anomaly signal when any anomaly of the battery cell is detected.

* * * * *